US009865621B2

(12) United States Patent
Nakatani et al.

(10) Patent No.: US 9,865,621 B2
(45) Date of Patent: Jan. 9, 2018

(54) DISPLAY DEVICE

(71) Applicant: Sharp Kabushiki Kaisha, Osaka (JP)

(72) Inventors: Yoshihiro Nakatani, Osaka (JP); Yuki Yamashita, Osaka (JP); Masayoshi Takai, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 48 days.

(21) Appl. No.: 14/897,027

(22) PCT Filed: Mar. 4, 2014

(86) PCT No.: PCT/JP2014/055372
§ 371 (c)(1),
(2) Date: Dec. 9, 2015

(87) PCT Pub. No.: WO2014/199677
PCT Pub. Date: Dec. 18, 2014

(65) Prior Publication Data
US 2016/0141312 A1  May 19, 2016

(30) Foreign Application Priority Data

Jun. 10, 2013  (JP) ................. 2013-121970

(51) Int. Cl.
| G02F 1/1362 | (2006.01) |
| H01L 27/12 | (2006.01) |
| G09G 3/36 | (2006.01) |
| G02F 1/1335 | (2006.01) |
| G02F 1/1368 | (2006.01) |

(52) U.S. Cl.
CPC ........ *H01L 27/1225* (2013.01); *G02F 1/1368* (2013.01); *G02F 1/133514* (2013.01); *G02F 1/136213* (2013.01); *G02F 1/136286* (2013.01); *G09G 3/3655* (2013.01); *G09G 3/3659* (2013.01); *H01L 27/124* (2013.01); *H01L 27/1255* (2013.01); *G09G 2300/0426* (2013.01); *G09G 2300/0852* (2013.01); *G09G 2320/0247* (2013.01); *G09G 2380/10* (2013.01)

(58) Field of Classification Search
CPC ..................... G02F 1/136213; G09G 3/3655
See application file for complete search history.

(56) References Cited

U.S. PATENT DOCUMENTS

2009/0295480 A1  12/2009  Ikeda et al.
2012/0138922 A1  6/2012  Yamazaki et al.
(Continued)

FOREIGN PATENT DOCUMENTS

| JP | 2-183565 A | 7/1990 |
| JP | 9-15641 A | 1/1997 |
| JP | 10-239662 A | 9/1998 |

(Continued)

*Primary Examiner* — Kendrick Hsu
(74) *Attorney, Agent, or Firm* — Chen Yoshimura LLP

(57) ABSTRACT

A display device includes: a pixel electrode; a switching element that is connected to the pixel electrode and charges the pixel electrode; a reference potential terminal set at a reference potential; and a resistive element that is connected to the pixel electrode and the reference potential terminal so as to be interposed therebetween, the resistive element forming a resistance component against electric charges moving between the pixel electrode and the reference potential terminal.

10 Claims, 36 Drawing Sheets

(56) References Cited

U.S. PATENT DOCUMENTS

2013/0214273 A1 8/2013 Yamazaki et al.
2014/0009459 A1 1/2014 Nakata et al.

FOREIGN PATENT DOCUMENTS

| JP | 2003-330425 A | 11/2003 |
| JP | 2009-290490 A | 12/2009 |
| JP | 2011-237671 A | 11/2011 |
| JP | 2012-134475 A | 7/2012 |
| WO | 2012/133281 A1 | 10/2012 |
| WO | 2012/161022 A1 | 11/2012 |

DISPLAY DEVICE

TECHNICAL FIELD

The present invention relates to a display device.

BACKGROUND ART

Liquid crystal panels used in liquid crystal display devices have a configuration in which a liquid crystal layer is sandwiched between a pair of glass substrates, of which one of the glass substrates is an array substrate including TFTs, which are switching elements, and pixel electrodes. The array substrate has a configuration in which gate wiring lines and source wiring lines are provided on the same substrate in a grid pattern, and a TFT and a pixel electrode are provided at the intersection of each gate wiring line and source wiring line. In a liquid crystal panel having such a configuration, the OFF characteristics of TFTs in recent years have been improving, and thus, electric charge stored in the pixel electrodes by the TFTs being charged is less susceptible to natural discharge. If the electric charge stored in the pixel electrode remains for a long period of time, this results in the risk of burn-in or flickering in the display screen. The technique disclosed in Patent Document 1 is known as to prevent burn-in and flickering in the display screen.

RELATED ART DOCUMENT

Patent Document

Patent Document 1: WO 2012/161022

Problems to be Solved by the Invention

In Patent Document 1, when the display in the liquid crystal panel is turned OFF, a voltage is applied to drive the TFTs to discharge the charge stored in the pixel electrodes. However, in such a case, there is a need for a special control process to be performed to drive the TFTs while the display is OFF.

SUMMARY OF THE INVENTION

The present invention was completed in view of the above-mentioned situation, and an object thereof is to mitigate a decrease in display quality without performing special control.

Means for Solving the Problems

A display device of the present invention includes: a pixel electrode; a switching element that is connected to the pixel electrode and charges the pixel electrode; a reference potential terminal set at a reference potential; and a resistive element that is connected to the pixel electrode and the reference potential terminal so as to be interposed therebetween, the resistive element forming a resistance component against electric charges moving between the pixel electrode and the reference potential terminal.

In this manner, when the pixel unit (electrode) is charged by the switching element, charge accumulates in the pixel unit. If the OFF characteristics of the switching element are strong, then there is a tendency for the electric charge accumulated in the pixel unit to remain therein for a long period of time, which presents the risk of burn-in, flickering, and the like occurring in the display screen of the display device. One possible countermeasure is to apply a voltage to drive the switching elements to discharge the pixel units, for example, but this would require an additional special control process.

In contrast, the above-mentioned pixel unit is connected to the reference potential unit (terminal) with the resistor interposed therebetween. Thus, if the potential of the pixel unit is greater than the reference potential of the reference potential unit, for example, then the electric charge moves from the pixel unit to the reference potential unit through the resistor. Conversely, if the potential of the pixel unit is lower than the reference potential of the reference potential unit, then the electric charge moves from the reference potential unit to the pixel unit through the resistor. In either case, the potential of the pixel unit is brought closer to reference potential, thereby reducing the susceptibility of the display screen to burn-in, flickering, or the like without the need for a special control process. Furthermore, the resistor provides resistance against the electric charge moving between the pixel unit and the reference potential unit, and thus, it is possible to increase the amount of time until the potential of the pixel unit reaches reference potential, allowing a situation in which the potential of the pixel unit instantaneously reaches reference potential to be avoided. As a result, this configuration is suitable for displaying images in the display device due to the potential of the pixel unit charged by the switching element being maintained over a certain period of time, and as a result, a situation in which display quality for displayed images is reduced is avoided.

As embodiments of the present invention, the following configurations are preferred.

(1) The resistive element includes a transistor that has at least a gate electrode, a source electrode, a drain electrode, and a channel section that connects the source electrode to the drain electrode, the gate electrode being connected to either one of the pixel electrode and the reference potential terminal, and either one of the source electrode and the drain electrode being connected to the pixel electrode and another thereof being connected to the reference potential terminal. In this manner, the gate electrode is set at the same potential as either the pixel unit or the reference potential unit, and either the source electrode or the drain electrode is set to the same potential as the pixel unit, with the other being set to the same potential as the reference potential unit. Thus, when the pixel unit is charged by the switching element, a difference in potential occurs between the source electrode and the drain electrode, whereas the gate electrode is set to the same potential as either the source electrode or the drain electrode, and thus, the transistor effectively functions as a diode, and electric charge is carried between the source electrode and the drain electrode through the channel section. Here, the transistor is either forward biased or reversed biased according to the potential to which the pixel unit is charged by the switching element. When forward biased, a small amount of charge less than the threshold voltage of the transistor flows, whereas when the transistor is reverse biased, only an amount of charge equal to the leakage current of the transistor flows with the amount of charge moving being very small. In either case, the transistor provides resistance against the electric charge moving between the pixel unit and the reference potential unit, and thus, a sufficient amount of time can be attained to when the potential of the pixel unit reaches reference potential. In this manner, there is little risk of display quality of the display screen being reduced when displaying images in the display device.

(2) The switching element includes a pixel transistor that has at least a pixel gate electrode, a pixel source electrode, a pixel drain electrode connected to the pixel electrode, and a pixel channel section that connects the pixel source electrode to the pixel drain electrode, and wherein the channel section of the transistor of the resistive element is made of a same material as the pixel channel section of the pixel transistor of the switching element. Using the same material for the pixel channel section of the pixel transistor constituting a switching element and the channel section of the transistor constituting a resistor provides advantages such as a reduction in manufacturing cost.

(3) The transistor of the resistive element is formed such that a ratio calculated by dividing a length dimension of the channel section that is a distance between the source electrode and the drain electrode by a width dimension of the channel section is greater than a ratio calculated by dividing a length dimension of the pixel channel section of the pixel transistor of the switching element by a width dimension of the pixel channel section, the length dimension being a distance between the pixel source electrode and the pixel drain electrode. In this manner, the resistance on the electric charge moving between the source electrode and the drain electrode through the channel section in the transistor constituting a resistor is greater than the resistance on the electric charge moving between the pixel source electrode and the pixel drain electrode through the pixel channel section of the pixel transistor constituting the switching element. Thus, by the transistor constituting the resistor, it is possible to attain a sufficient amount of time to when the potential of the pixel unit reaches reference potential, and as a result, the likelihood of display quality of the display screen deteriorating for when images are displayed in the display device is further reduced.

(4) In the transistor of the resistive element, the gate electrode and the source electrode are connected to the pixel electrode, and the drain electrode is connected to the reference potential terminal. In this manner, if the potential of the pixel unit is greater than the reference potential of the reference potential unit, for example, then the transistor constituting the resistor is forward biased, and thus, electric charge moves from the source electrode set at the same potential as the gate electrode to the drain electrode. Conversely, if the potential of the pixel unit is less than the reference potential of the reference potential unit, then the transistor constituting the resistor is reverse biased, and thus, electric charge moves from the drain electrode to the source electrode set at the same potential as the gate electrode. In either case, the transistor provides resistance against the electric charge moving between the pixel unit and the reference potential unit, and thus, a sufficient amount of time can be attained to when the potential of the pixel unit reaches reference potential. In this manner, there is little risk of display quality of the display screen being reduced when displaying images in the display device.

(5) In the transistor of the resistive element, the drain electrode is connected to the pixel electrode, and the gate electrode and the source electrode are connected to the reference potential terminal. In this manner, if the potential of the pixel unit is greater than the reference potential of the reference potential unit, for example, then the transistor constituting the resistor is reverse biased, and thus, electric charge moves from the drain electrode to the source electrode set at the same potential as the gate electrode. Conversely, if the potential of the pixel unit is less than the reference potential of the reference potential unit, then the transistor constituting the resistor is forward biased, and thus, electric charge moves from the source electrode set at the same potential as the gate electrode to the drain electrode. In either case, the transistor provides resistance against the electric charge moving between the pixel unit and the reference potential unit, and thus, a sufficient amount of time can be attained to when the potential of the pixel unit reaches reference potential. In this manner, there is little risk of display quality of the display screen being reduced when displaying images in the display device.

(6) The resistive element includes: a first transistor having at least a first gate electrode, a first source electrode, a first drain electrode, and a first channel section that connects the first source electrode to the first drain electrode, the first gate electrode and the first source electrode being respectively connected to the pixel electrode; and a second transistor having at least a second gate electrode, a second source electrode, a second drain electrode, and a second channel section that connects the second source electrode to the second drain electrode, the second gate electrode and the second source electrode being respectively connected to the reference potential terminal, the second drain electrode being connected to the first drain electrode. In this manner, if the potential of the pixel unit is greater than the reference potential of the reference potential unit, for example, then while the first transistor is forward biased, the second transistor is reverse biased, and after the electric charge of the pixel unit moves from the first source electrode set at the same potential as the first gate electrode to the first drain electrode, the electric charge moves from the second drain electrode to the second source electrode, which is set at the same potential as the second gate electrode, thereby reaching the reference potential unit. Conversely, if the potential of the pixel unit is less than the reference potential of the reference potential unit, for example, then while the second transistor is forward biased, the first transistor is reverse biased, and after the electric charge of the reference potential unit moves from the second source electrode set at the same potential as the second gate electrode to the second drain electrode, the electric charge moves from the first drain electrode to the first source electrode, which is set at the same potential as the first gate electrode, thereby reaching the pixel unit. In either case, at least one of the first transistor and the second transistor is reverse biased, and thus, only an amount of charge approximately equal to the leakage current of the transistors flows, and thus, the amount of electric charge moving is miniscule. Thus, it is possible to attain a greater amount of time to when the potential of the pixel unit reaches reference potential, and as a result, the likelihood of the display quality of the display screen deteriorating for when images are displayed in the display device is further reduced. Furthermore, regardless of whether the potential charged to the pixel unit by the switching element is higher or lower than the reference potential, the time until the potential of the pixel unit reaches reference potential as a result of the transistors is the same, and thus, it is possible to keep constant the period over which the potential is retained in the pixel unit.

(7) The resistive element is a plurality of the transistors connected to each other in series. In this manner, the electric charge moves between the pixel unit and the reference potential unit through a plurality of transistors, and thus, it is more difficult for the electric charge to flow, which prevents a situation in which the potential of the pixel unit instantaneously reaches reference potential. This configuration is more suitable in that the potential of the pixel unit, which is charged by the switching element, is maintained for a certain period of time.

(8) The resistive element includes a wiring line extending between the pixel electrode and the reference potential terminal. In this manner, the wiring line extending between the pixel unit and the reference potential unit is included in the resistor, and as a result, the time it takes for the potential charged to the pixel unit by the switching element to reach reference potential due to the wiring line is the same whether the potential of the pixel unit is higher or lower than the reference potential. In this manner, the time over which the potential is retained in the pixel unit can be kept constant.

(9) A common electrode forming capacitance with the pixel electrode, wherein at least a portion of the common electrode serves as the reference potential terminal. In this manner, the reference potential unit is the common electrode forming capacitance with the pixel unit, with electric charge moving between the pixel unit and the reference potential unit as a result of the resistor, and thus, as a result of the movement of electric charge through the resistor, the difference in potential between the pixel unit and the common electrode can be set to close to 0. Thus, it is possible to further reduce the risk of burn-in or flickering in the display screen.

(10) An auxiliary capacitance wiring line forming capacitance with the pixel electrode, wherein at least a portion of the auxiliary capacitance wiring line serves as the reference potential terminal. In this manner, the reference potential unit is the auxiliary capacitance wiring line forming capacitance with the pixel unit, with electric charge moving between the pixel unit and the reference potential unit as a result of the resistor, and thus, as a result of the movement of electric charge through the resistor, the difference in potential between the pixel unit and the auxiliary capacitance wiring line can be set to close to 0. Thus, it is possible to further reduce the risk of burn-in or flickering in the display screen.

(11) The switching element includes a pixel transistor that has a pixel gate electrode, a pixel source electrode, a pixel drain electrode connected to the pixel electrode, and a pixel channel section that connects the pixel source electrode to the pixel drain electrode, and wherein the pixel channel section is made of an oxide semiconductor. In this manner, by using an oxide semiconductor as the material for the pixel channel section of the pixel transistor, which is a switching element, the off leakage current of the pixel transistor is reduced compared to a case in which amorphous silicon is used as the pixel channel section material, and thus, the voltage holding ratio of the pixel unit is high. If the voltage holding ratio of the pixel unit is high, the electric charge accumulated in the pixel unit tends to remain therein for a long period of time, but by the electric charge moving between the pixel unit and the reference potential unit through the resistor, it is possible to cause the potential of the pixel unit to approach reference potential, and thus, it is possible to mitigate the risk of burn-in, flickering, or the like in the display screen without performing a special control process.

(12) The oxide semiconductor contains indium (In), gallium (Ga), zinc (Zn), and oxygen (O). In this manner, the oxide semiconductor forming the pixel channel section of the pixel transistor includes indium (In), gallium (Ga), zinc (Zn), and oxygen (O), and thus, the off leakage current of the pixel transistor is further reduced and the voltage holding ratio of the pixel unit is high. However, by causing electric charge to move between the pixel unit and the reference potential unit through the resistor, it is possible to cause the potential of the pixel unit to approach reference potential, and thus, it is possible to further reduce burn-in, flickering, and the like without needing to perform a special control process.

(13) The oxide semiconductor is crystalline. In this manner, the oxide semiconductor forming the pixel channel section of the pixel transistor includes indium (In), gallium (Ga), zinc (Zn), and oxygen (O), and is also crystalline, and thus, the off leakage current of the pixel transistor is even further reduced and the voltage holding ratio of the pixel unit is even high. However, by causing electric charge to move between the pixel unit and the reference potential unit through the resistor, it is possible to cause the potential of the pixel unit to approach reference potential, and thus, it is possible to reduce even further burn-in, flickering, and the like without needing to perform a special control process.

(14) An array substrate on which the pixel electrode, the switching element, the reference potential terminal, and the resistive element are disposed in a plurality; a color filter substrate facing the array substrate, the color filter substrate having colored portions; and a liquid crystal layer sandwiched between the array substrate and the color filter substrate. Such a display device as a liquid crystal display device can be applied to various applications such as displays of devices such as in-vehicle information devices or mobile information devices.

Effects of the Invention

According to the present invention, it is possible to mitigate a decrease in display quality without performing special control.

DETAILED DESCRIPTION OF EMBODIMENTS

Embodiment 1

Embodiment 1 of the present invention will be described with reference to FIGS. 1 to 10. In the present embodiment, a liquid crystal display device 10 will be described as an example. The drawings indicate an X axis, a Y axis, and a Z axis in a portion of the drawings, and each of the axes indicates the same direction for the respective drawings. The up and down direction is based on that of FIG. 2 and the like, and the upper side thereof is the front side while the lower side thereof is the rear side.

Figure 1:
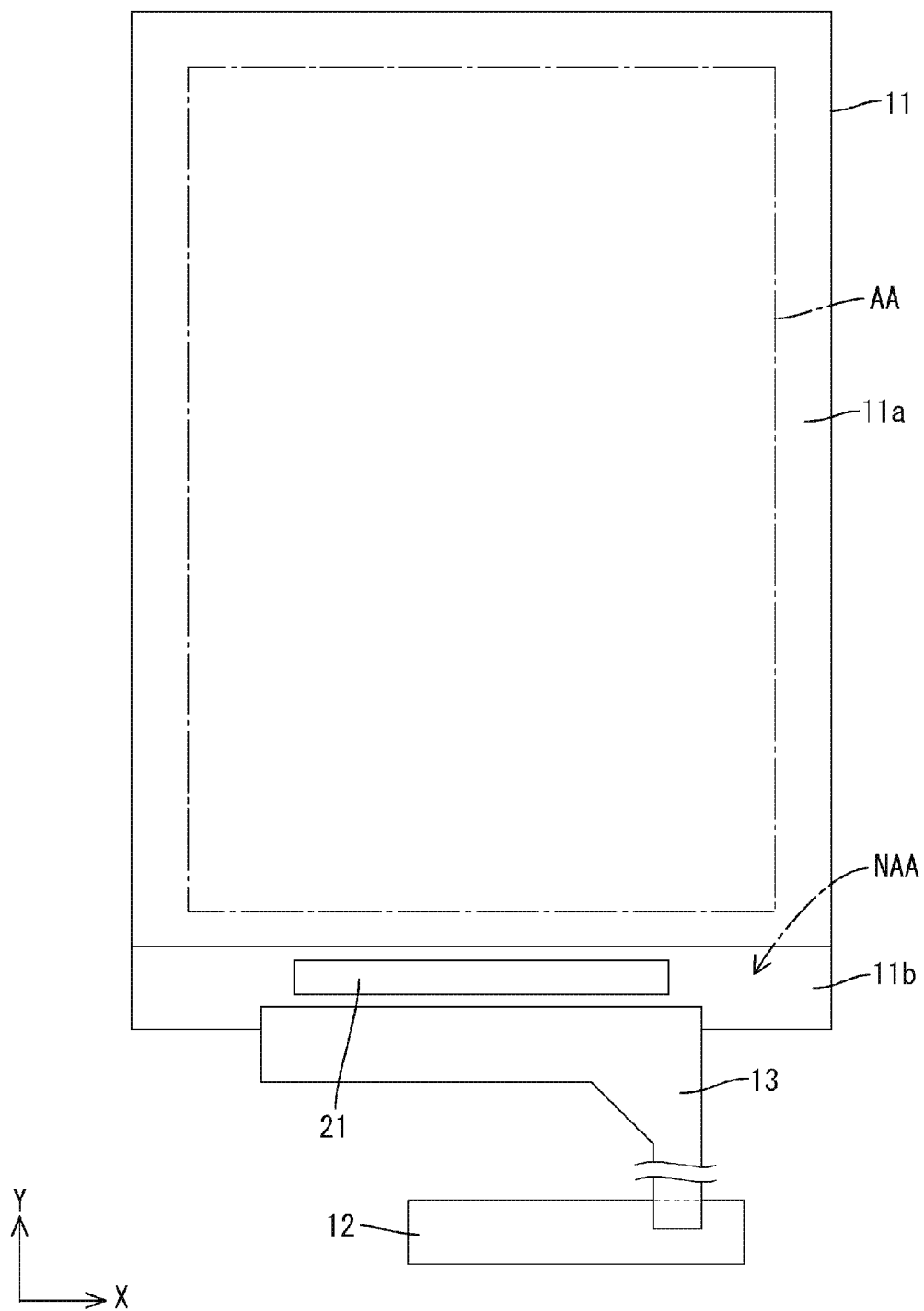
FIG. 1 is a schematic plan view of a connection configuration of a liquid crystal panel having a driver mounted thereon, a flexible substrate, and a control circuit substrate according to Embodiment 1 of the present invention.
Figure 2:
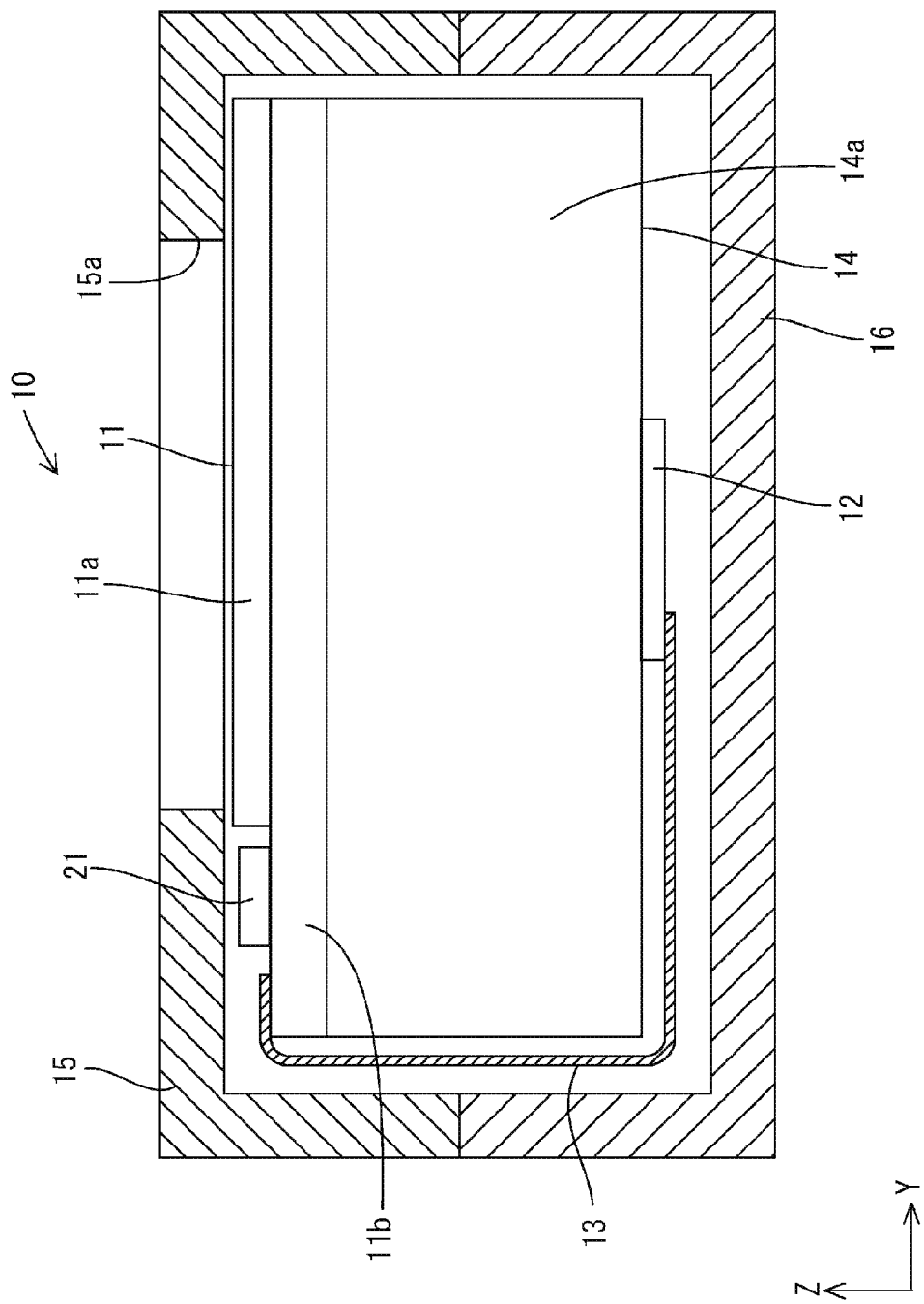
FIG. 2 is a schematic cross-sectional view that shows a cross-sectional configuration of a liquid crystal display device along the longer side direction.

As shown in FIGS. 1 and 2, the liquid crystal display device 10 includes: a liquid crystal panel (display device) 11 that has a display area AA capable of displaying images and a non-display area NAA outside of the display area AA; a driver (panel driving unit) 21 that drives the liquid crystal panel 11; a control circuit substrate (external signal supply source) 12 that supplies various external input signals for images to the drivers 21; a flexible substrate (external connection component) 13 that electrically connects the liquid crystal panel 11 to the external circuit control circuit substrate 12; and a backlight device (illumination device) 14 that is an external light source for providing light to the liquid crystal panel 11. The liquid crystal display device 10 also includes front and rear exterior members 15 and 16 for housing and holding in place the liquid crystal panel 11 and the backlight device 14, which are attached to each other. The front exterior member 15 has an opening 15a to allow images displayed in the display area AA of the liquid crystal panel 11 to be viewed from the outside. The liquid crystal display device 10 according to the present embodiment can be used in various electronic devices (not shown) such as laptop computers (including tablet PCs), mobile phones (including smartphones), portable information devices (including electronic books and PDAs), digital photo frames, portable gaming devices, and electronic ink paper. Thus, the screen size of the display of the liquid crystal panel 11 included in the liquid crystal display device 10 ranges from approximately a few inches to 10 or more inches, that is, small- to mid-sized in general.

First, the backlight device 14 will be briefly explained. As shown in FIG. 2, the backlight device 14 has a substantially box-shaped chassis 14a with an opening in the front (facing the liquid crystal panel 11), light sources (not shown) such as cold cathode fluorescent tubes, LEDs, or organic EL elements arranged in the chassis 14a, and optical members (not shown) arranged so as to cover the opening of the chassis 14a. The optical members have functions such as converting light emitted by the light sources into planar light.

Next, the liquid crystal panel 11 will be described. As shown in FIG. 1, the liquid crystal panel 11 has a vertically-long quadrilateral (rectangular) shape overall, and the display area (active area) AA is disposed at a location near one edge in the longer side direction of the panel (the top in FIG. 1). The driver 21 and the flexible substrate 13 are disposed at a location near the other edge in the longer side direction of the panel (the bottom of FIG. 1). The region outside the display area AA of this liquid crystal panel 11 is the non-display area (non-active area) NAA where images are not displayed, and this non-display area NAA is constituted by: a substantially frame-shaped region surrounding the display area AA (a frame region on the CF substrate 11a, described later); and a region secured at the other edge in the longer side direction of the panel (a portion of the array substrate 11b that is exposed and does not overlap the CF substrate 11a, described later). Among these, the mounting area (attachment area) for the driver 21 and the flexible substrate 13 is on the region secured at the other edge in the longer side direction of the panel. The shorter side direction of the liquid crystal panel 11 matches the X axis direction in every drawing, and the longer side direction thereof matches the Y axis direction in every drawing. In FIG. 1, the frame-shaped one-dot-chain line that encloses an area slightly smaller than a CF substrate 11a represents the outer shape of the display area AA, and the region outside this solid line is the non-display area NAA.

Next, a configuration of members connected to the liquid crystal panel 11 will be explained. As shown in FIGS. 1 and 2, the control circuit substrate 12 is attached to the rear surface of the chassis 14a of the backlight device 14 (the outer surface opposite to the liquid crystal panel 11) by screws or the like. This control circuit substrate 12 has an electronic component, for supplying various input signals to the driver 21, mounted on phenolic paper or a glass epoxy resin substrate. Wiring lines of a prescribed pattern (conductive path) (not shown) are also formed on this substrate. One end (not shown) of the flexible substrate 13 is electrically and mechanically connected to this circuit control substrate 12 via an anisotropic conductive film (ACF) (not shown).

As shown in FIG. 2, the flexible substrate (FPC substrate) 13 includes a base material made of a composite resin material having insulating and flexible characteristics (a polyimide resin or the like, for example). There are a large number of patterns (not shown) on the base material, and one end in the longer side direction of the flexible substrate 13 connects to the control circuit substrate 12 disposed on the rear of the chassis 14a and the other end is connected to the array substrate 11b of the liquid crystal panel 11, as described above. Thus, the flexible substrate 13 is bent in a cuff shape such that, inside the liquid crystal display device 10, the flexible substrate 13 has a substantially U-shaped cross section. The wiring patterns on both ends in the long direction of the flexible substrate 13 are exposed to the outside to form terminal sections (not shown), and these terminal sections are respectively electrically connected to the control circuit substrate 12 and the liquid crystal panel 11. As a result, it is possible for the input signal supplied from the control circuit substrate 12 to be transmitted to the liquid crystal panel 11.

As shown in FIG. 1, the driver 21 is constituted by an LSI chip having a driver circuit therein, and operates on the basis of signals supplied from the control circuit substrate 12, which is the signal source, in order to generate output signals by processing input signals supplied from the control circuit substrate 12, which is the signal supply source. The output signals are outputted to the display area AA of the liquid crystal panel 11. This driver 21 has a horizontally-long quadrilateral shape in a plan view (the longer dimension thereof is along the shorter side of the liquid crystal panel 11) and is directly mounted on the non-display area NAA of the liquid crystal panel 11 (array substrate 11b; described later). In other words, chip on glass (COG) mounting is adopted. The longer side direction of the driver 21 matches the X-axis direction (shorter side direction of the liquid crystal panel 11), and the shorter side direction thereof matches the Y-axis direction (longer side direction of the liquid crystal panel 11).

Figure 3:
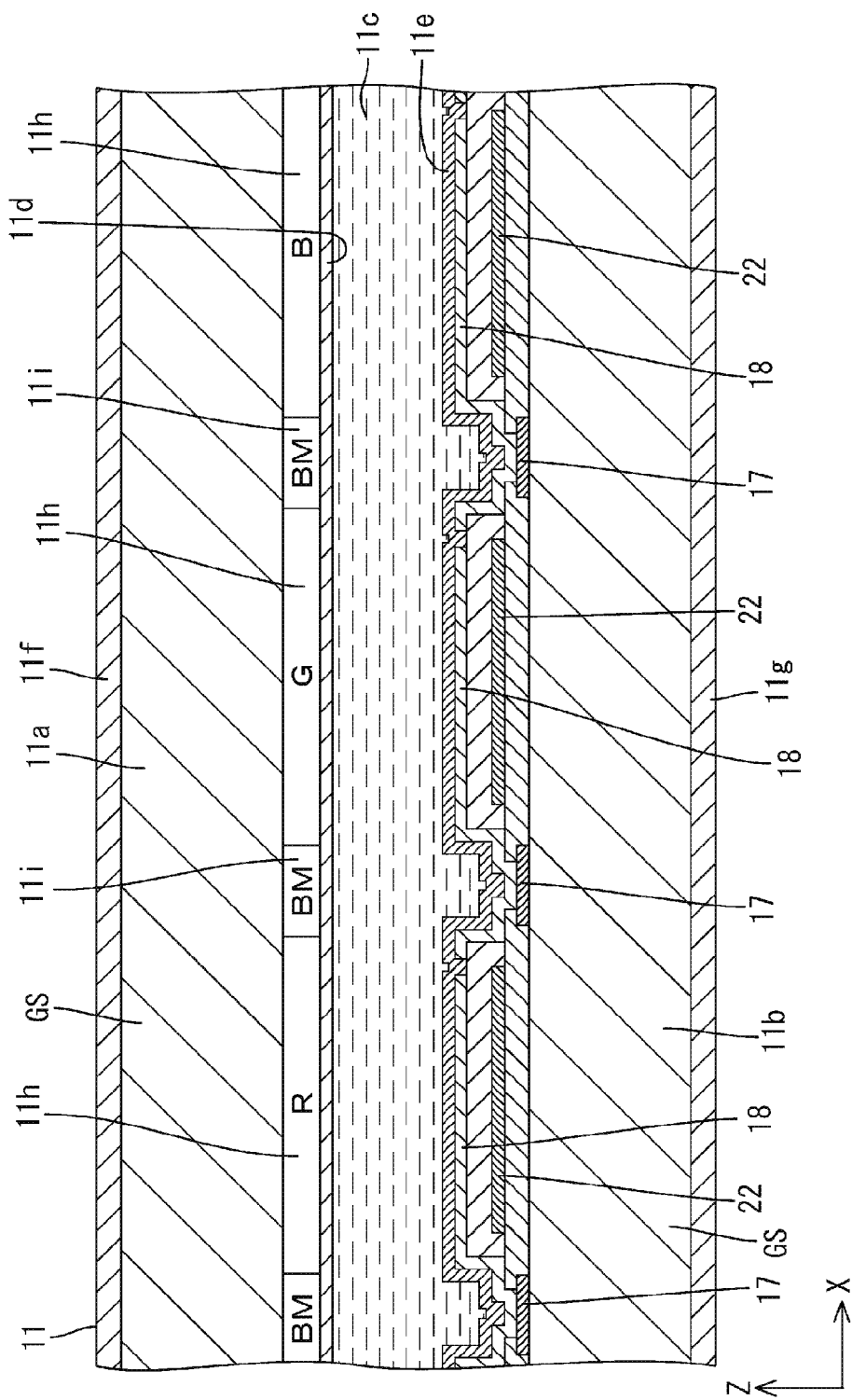
FIG. 3 is a schematic cross-sectional view showing a cross-sectional configuration of the liquid crystal panel.

Next, the liquid crystal panel 11 will again be described. As shown in FIG. 3, the liquid crystal panel 11 includes a pair of substrates 11a and 11b, and a liquid crystal layer (liquid crystal) 11c that is sandwiched between these two substrates 11 and 11b and that contains liquid crystal molecules, which are a substance that undergoes a change in optical properties as a result of an electric field being applied thereto. The two substrates 11a and 11b are bonded together by a sealing agent (not shown) with a gap of the same width as the thickness of the liquid crystal layer 11c being maintained therebetween. The liquid crystal panel 11 according to the present embodiment is of a fringe field switching (FFS) mode, which is a further improvement on the in-plane switching (IPS) mode, and has pixel electrodes (pixel units) 18 and a common electrode (opposite electrode; counter electrode) 22 to be described later both formed on the array substrate 11b among the substrates 11a and 11b, the pixel electrodes 18 and the common electrode 22 being disposed in different layers. Of the two substrates 11a and 11b, the one on the front side (front surface side) is a CF substrate (opposite substrate) 11a, and the other one on the rear side (rear surface side) is an array substrate (display element) 11b. The CF substrate 11a and the array substrate 11b include substantially transparent (having a high degree of transparency) glass substrates GS, and various films are layered onto the glass substrates GS. Of these, as shown in FIGS. 1 and 2, the CF substrate 11a has substantially the same width as the array substrate 11b but a smaller length than the array substrate 11b, the CF substrate 11a being bonded to the array substrate 11b such that respective edges on one side of the substrates in the longer side direction (top side of FIG. 1) match each other in position. Accordingly, the other edge of the array substrate 11b in the longer side direction thereof (the bottom of FIG. 1) does not overlap the CF substrate 11a over a prescribed range where the front and rear surfaces of the array substrate 11b are exposed to the outside. The mounting region for the driver 21 and the flexible substrate 13 are secured here, as described later. Alignment films 11d and 11e for orienting the liquid crystal molecules in the liquid crystal layer 11c are formed on the respective inner surfaces of the substrates 11a and 11b. The alignment films 11d and 11e are formed of polyimide, for example, and are formed so as to be uniformly planar over the entirety of the respective surfaces of the substrates 11a and 11b. The alignment films 11d and 11e are photoalignment films that, upon being irradiated with light of a specific wavelength (such as ultraviolet), can orient liquid crystal molecules along the direction of light radiation. Polarizing plates 11f and 11g are bonded on the respective outer surfaces of the two substrates 11a and 11b.

Figure 6:
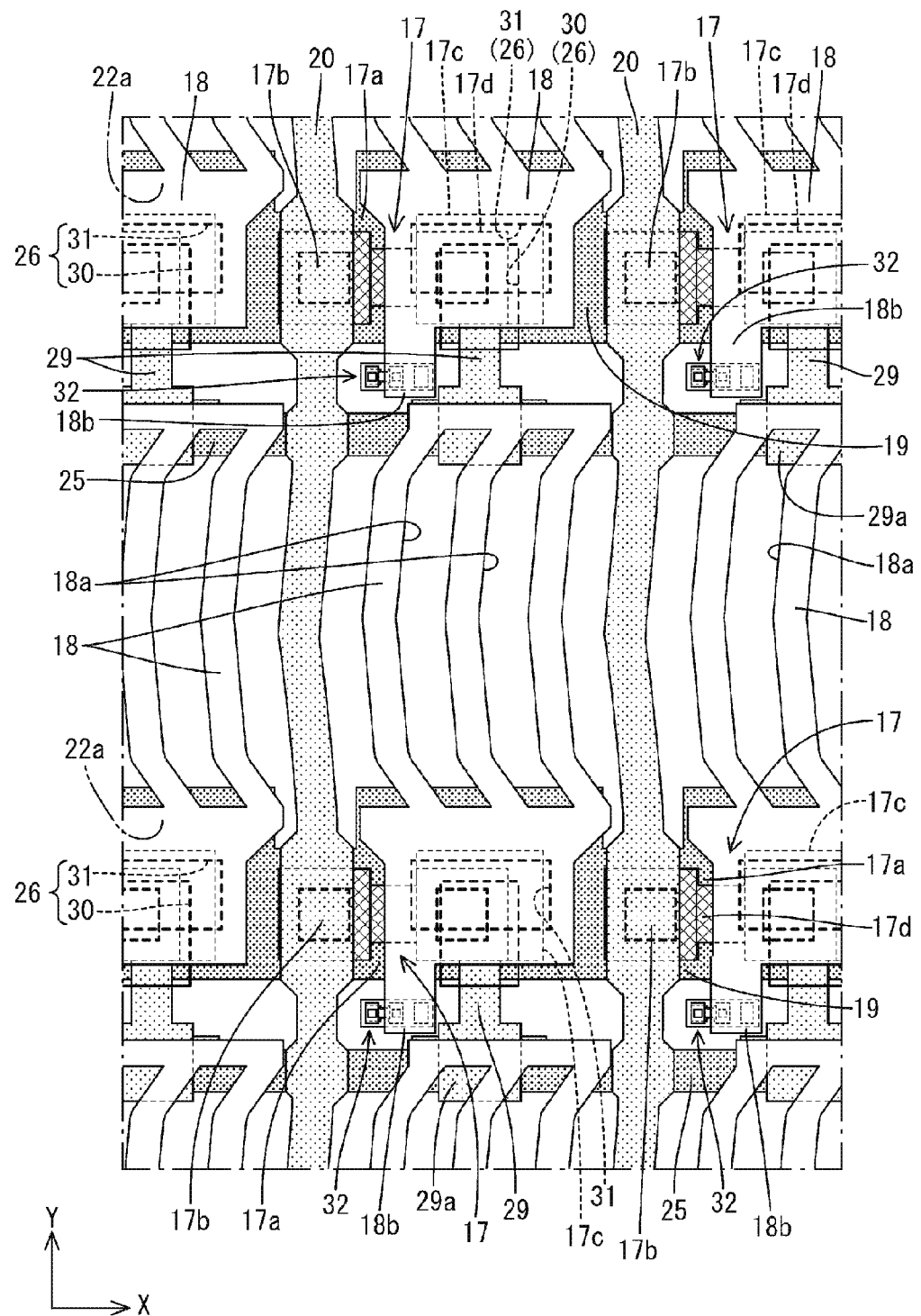
FIG. 6 is a plan view showing the plan view configuration of the pixels in the display area of the array substrate.
Figure 7:
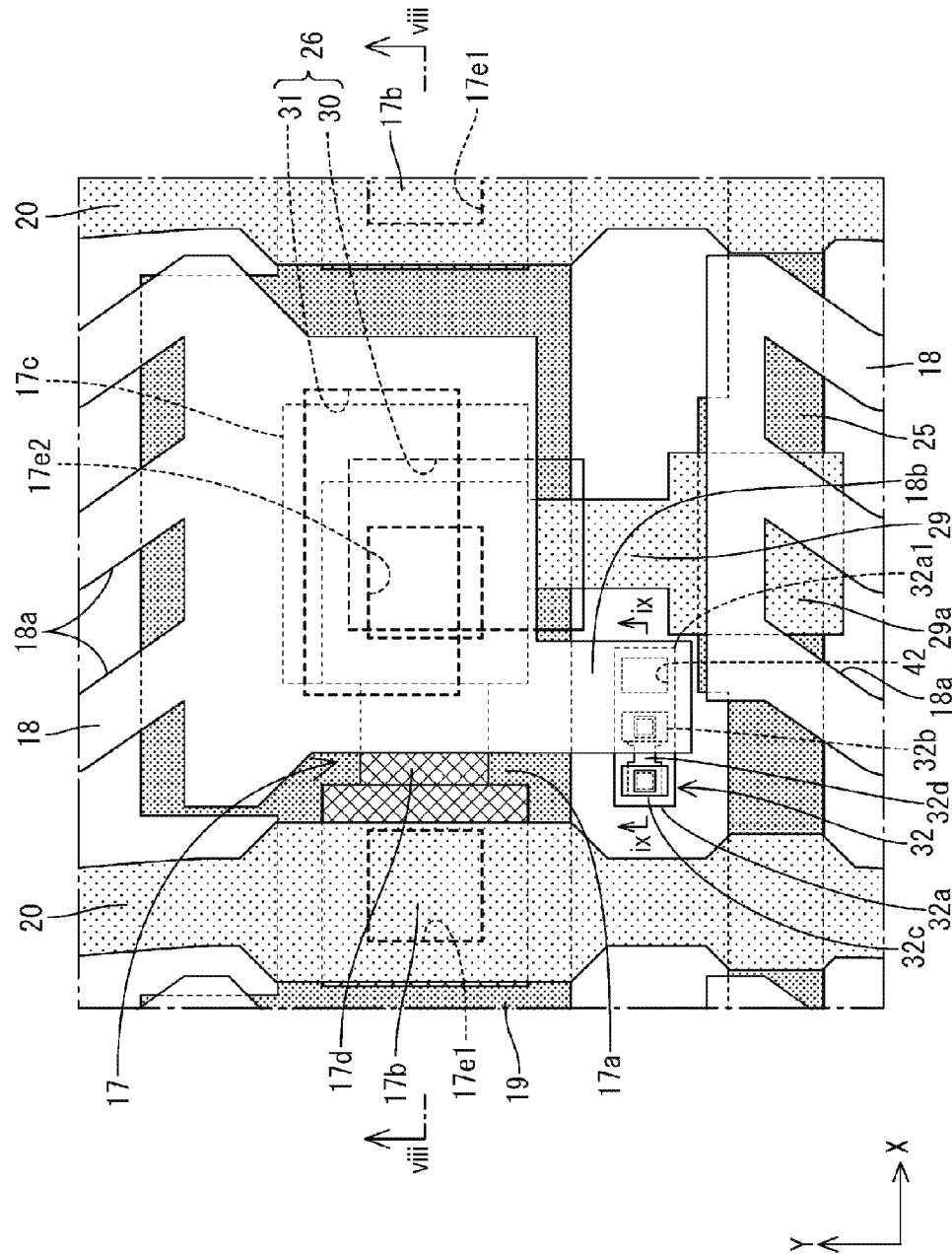
FIG. 7 is an expanded plan view of the area of a pixel TFT and a resistive TFT in FIG. 6.
Figure 8:
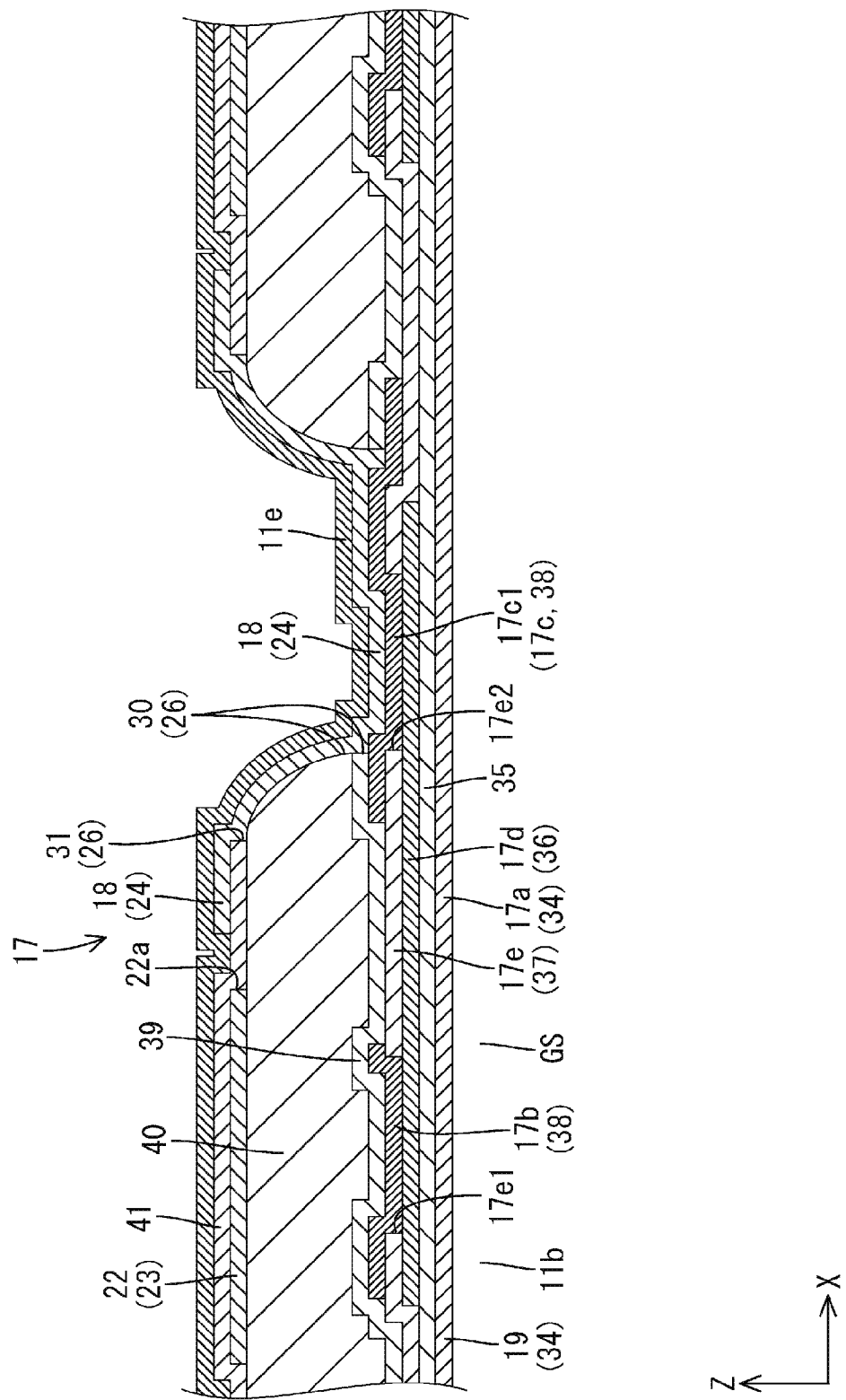
FIG. 8 is a cross-sectional view along the line viii-viii of FIG. 7.

First, the various films layered by the already-known photolithography method on the inner surface of the array substrate 11b (facing the liquid crystal layer 11c and the CF substrate 11a) will be described. As shown in FIGS. 6 to 8, the following are layered on the array substrate 11b in the following order from the bottommost layer (glass substrate GS): a first metal film 34 (first conductive film, gate metal film); a gate insulation film 35 (insulating film, first insulating film); a semiconductor film 36; a protective film 37 (insulating film, etch stopper film); a second metal film 38 (first conductive film, source metal film); a first interlayer insulating film 39 (insulating film, second insulating film); an organic insulating film 40 (insulating film); a first transparent electrode film 23; a second interlayer insulating film 41 (third insulating film); and a second transparent electrode film 24 (second conductive film). In FIGS. 6 and 7, the first metal film 34, the semiconductor film 36, and the second metal film 38 are depicted with shading.

The first metal film 34 is made of a multilayer film of titanium (Ti) and copper (Cu). The gate insulation film 35 is layered over at least the first metal film 34, and is made of a silicon dioxide ($SiO_2$), for example. The semiconductor film 36 is a thin film made of an oxide semiconductor, which is specifically made of an In—Ga—Zn—O semiconductor (indium gallium zinc oxide) having as main components indium (In), gallium (Ga), zinc (Zn), and oxygen (O), for example. Here, an In—Ga—Zn—O semiconductor is a ternary oxide including In (indium), Ga (gallium), and Zn (zinc), and there is no special limitation to the ratio (composition ratio) of In, Ga, and Zn, and In:Ga:Zn=2:2:1, In:Ga:Zn=1:1:1, and In:Ga:Zn=1:1:2 and the like are included, for example. In the present embodiment, the In—Ga—Zn—O semiconductor has a ratio of In, Ga, and Zn of 1:1:1. The oxide semiconductor (In—Ga—Zn—O semiconductor) forming the semiconductor film 36 may be amorphous but is preferably crystalline, with crystalline portions. As a crystalline oxide semiconductor, it is preferable that the crystalline In—Ga—Zn—O type semiconductor have the c axis oriented generally perpendicularly to the layer surface, for example. The crystalline structure of such an oxide semiconductor (In—Ga—Zn—O semiconductor) is disclosed in Japanese Patent Application Laid-Open Publication No. 2012-134475, for example. All of the content disclosed in Japanese Patent Application Laid-Open Publication No. 2012-134475 is incorporated by reference in the present specification.

The protective film 37 is made of a silicon dioxide ($SiO_2$). The second metal film 38 is made of a multilayer film of titanium (Ti) and copper (Cu). The first interlayer insulating film 39 is made of silicon dioxide ($SiO_2$). The organic insulating film 40 is made of an acrylic resin material (poly(methyl methacrylate) (PMMA) resin, for example) and functions as a planarizing film. The first transparent electrode film 23 and the second transparent electrode film 24 are both made of a transparent electrode material such as indium tin oxide (no) or zinc oxide (ZnO). The second interlayer insulating film 41 is made of a silicon nitride ($SiN_x$). Of the films described above, the first transparent electrode film 23 and the second transparent electrode film 24 are formed only in the display area AA of the array substrate 11b and not in the non-display area NAA, whereas the insulating films made of insulating materials such as the gate insulation film 35, the protective film 37, the first interlayer insulating film 39, the organic insulating film 40, and the second interlayer insulating film 41 are formed over substantially the entire array substrate 11b in a uniformly planar manner (having an opening in portions). The first metal film 34, the semiconductor film 36, and the second metal film 38 are formed into a prescribed pattern in both the display area AA and the non-display area NAA of the array substrate 11b.

Figure 5:
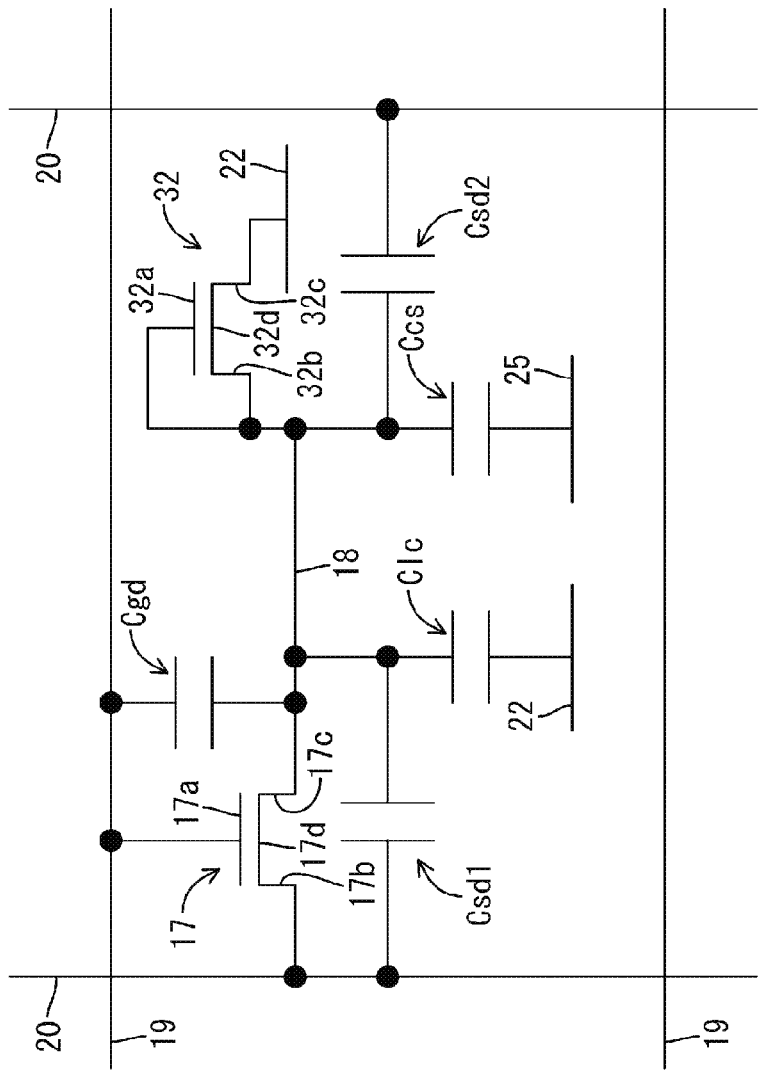
FIG. 5 is a circuit diagram showing the circuit configuration of a pixel in a display area of the array substrate.

Next, the configurations inside the display area AA of the array substrate 11b will each be described in detail. As shown in FIGS. 5 and 6, a large number of pixel TFTs (pixel transistors) 17, which are switching elements, and pixel electrodes 18 are arranged in a matrix in the display area AA of the array substrate 11b. Gate wiring lines 19 (scan signal lines, row signal lines) and source wiring lines 20 (data signal lines, column signal lines) are arranged in a grid pattern so as to respectively surround these pixel TFTs 17 and pixel electrodes 18. In other words, the pixel TFTs 17 and the pixel electrodes 18 are arranged in a matrix in respective intersections of the gate wiring lines 19 and the source wiring lines 20 forming a grid pattern. The gate wiring lines 19 are made of the first metal film 34 whereas the source wiring lines 20 are made of the second metal film 38, with the gate insulation film 35 and the protective film 37 being interposed therebetween at the intersections. As will be described in further detail later, the gate wiring lines 19 and the source wiring lines 20 are respectively connected to the pixel gate electrodes 17a and the pixel source electrodes 17b of the pixel TFTs 17, and the pixel electrodes 18 are connected to the pixel drain electrodes 17c of the pixel TFTs 17 (FIG. 8). The gate wiring line 19 is arranged to overlap one edge of the pixel electrode 18 (lower side in FIG. 6) in a plan view (as seen from the direction normal to the surface of the array substrate 11b). Thus, capacitance Cgd is formed between the gate wiring line 19 and the pixel electrode 18. Also, capacitance Csd1 is formed between the source wiring line 20 and the pixel electrode 18 connected to the pixel TFT 17, which in turn is connected to the source wiring line 20 (see FIG. 5). Additionally, capacitance Csd2 is formed between the source wiring line 20 adjacent across the pixel electrode 18 to the source wiring line 20 connected to the pixel TFT 17 that is connected to the pixel electrode 18, and the pixel electrode 18 (see FIG. 5).

Furthermore, as shown in FIG. 6, the array substrate 11b is provided with capacitance wiring lines 25 (storage capacitance wiring lines, Cs wiring lines) that are parallel to the gate wiring lines 19 and overlap a portion of the pixel electrodes 18 in a plan view. The auxiliary capacitance wiring lines 25 are made of the same first metal film 34 as the gate wiring lines 19 and are arranged so as to overlap the other edge (upper side in FIG. 6) of the pixel electrode 18 in a plan view; in other words, the auxiliary capacitance wiring lines 25 are arranged between the gate wiring lines 19 in the Y axis direction and on either side of the central portion of the pixel electrode 18. In other words, the auxiliary capacitance wiring lines 25 are arranged adjacent to each other at a prescribed interval in the Y axis direction and between the gate wiring lines 19, each of which is connected through the pixel TFT 17 to the pixel electrode 18 adjacent to the upper side in FIG. 6 of the pixel electrode 18 overlapped by the auxiliary capacitance wiring line 25. The auxiliary capacitance wiring lines 25 are arranged alternately with the gate wiring lines 19 in the Y axis direction. A prescribed reference potential is applied to the auxiliary capacitance wiring lines 25. Also, capacitance Ccs is formed between the auxiliary capacitance wiring line 25 and the pixel electrode 18 (see FIG. 5). The auxiliary capacitance wiring line 25 is not shown in FIG. 5.

As shown in FIG. 7, the pixel TFT 17 is formed over the gate wiring line 19, or in other words, the entire pixel TFT 17 overlaps the gate wiring line 19 in a plan view. A portion of the gate wiring line 19 forms the pixel gate electrode 17a of the pixel TFT 17, and a portion of the source wiring line 20 overlapping the gate wiring line 19 in a plan view forms the pixel source electrode 17b of the pixel TFT 17. The pixel TFT 17 has a pixel drain electrode 17c having an island shape by being arranged opposite to and at a prescribed gap from the pixel source electrode 17b in the X axis direction. The pixel drain electrode 17c is made of the same second metal film 38 as the pixel source electrode 17b (source wiring line 20), and overlaps one of the edges of the pixel electrode 18 (where the slits 18a to be described later are not formed) in a plan view. The pixel drain electrode 17c is continuous with a drain wiring line 29 made of the same second metal film 38. The drain wiring line 29 extends towards the lower side of FIG. 7 along the Y axis direction from the pixel drain electrode 17c, which is continuous therewith, or in other words, towards the auxiliary capacitance wiring line 25. The extended end of the drain wiring line 29 has a capacitance formation portion 29a in which the capacitance Ccs is formed by the extended end overlapping in a plan view the auxiliary capacitance wiring line 25 and the adjacent pixel electrode 18 (specifically, the pixel electrode 18 adjacent to and on the lower side in FIG. 7 of the pixel electrode 18 connected to the pixel drain electrode 17c). The portion of the gate wiring line 19 not overlapping the source wiring line 20 in a plan view is formed so as to be wider than in portions that overlap the source wiring line 20 in a plan view, whereas portions of the source wiring line 20 that overlap the gate wiring line 19 and the auxiliary capacitance wiring line 25 in a plan view are formed to be wider than in portions that do not overlap the gate wiring line 19 and the auxiliary capacitance wiring line 25 in a plan view.

As shown in FIG. 8, the pixel TFT 17 has: the pixel gate electrode 17a made of the first metal film 34; a pixel channel section 17d that is made of the semiconductor film 36 and overlaps the pixel gate electrode 17a in a plan view; a protective section 17e that is made of the protective film 37, and in which two openings 17e1 and 17e2 are formed in positions overlapping the pixel channel section 17d in a plan view; the pixel source electrode 17b that is made of the second metal film 38, and that is connected to the pixel channel section 17d through one opening 17e1 of the two openings 17e1 and 17e2; and the pixel drain electrode 17c that is made of the second metal film 38, and that is connected to the pixel channel section 17d through the other opening 17e2 of the two openings 17e1 and 17e2. Of these, the pixel gate electrode 17a includes a portion of the gate wiring line 19 that overlaps at least the pixel source electrode 17b, the pixel drain electrode 17c, and the pixel channel section 17d in a plan view. The pixel channel section 17d extends in the X axis direction and serves as a bridge between the pixel source electrode 17b and the pixel drain electrode 17c to allow electrons to move therebetween. The semiconductor film 36 forming the pixel channel section 17d is an oxide semiconductor thin film made of an In—Ga—Zn—O type (oxide) semiconductor (indium gallium zinc oxide) having as main components indium (In), gallium (Ga), zinc (Zn), and oxygen, for example, and this oxide semiconductor thin film has approximately 20 to 50 times the electron mobility of an amorphous silicon thin film, for example. Thus, it is possible to reduce with ease the size of the pixel TFT 17 to increase the amount of light transmitted through the pixel electrode 18, thereby presenting the advantage of a higher resolution and lower power consumption. Furthermore, by using an oxide semiconductor as the material for the pixel channel section 17d, the OFF characteristics of the pixel TFT 17 are stronger with the off leakage current being approximately a hundredth of the off leakage current were amorphous silicon film to be used as the pixel channel section, for example. Thus, the voltage holding ratio of the pixel electrode 18 increases, which is useful for reducing power consumption. The pixel TFT 17 having such an oxide semiconductor thin film has the pixel gate electrode 17a in the bottommost layer, with the gate insulation film 35 and the pixel channel section 17d being layered thereabove in that order to form a reverse-staggered configuration and a layered structure similar to that of a pixel TFT having a general amorphous silicon thin film.

As shown in FIGS. 7 and 8, the pixel electrode 18 is made of the second transparent electrode film 24 and overall has a vertically long substantially rectangular shape in a plan view in a region surrounded by the gate wiring lines 19 and the source wiring lines 20. One end of the pixel electrode 18 overlaps the gate wiring line 19 in a plan view, whereas portions other than this overlapping area do not overlap the gate wiring line 19 in a plan view and the non-overlapping area is provided with a plurality (two in FIG. 7) of vertically long slits 18a and thereby has a substantially comb shape. The slits 18a extend to a portion of the pixel electrode 18 overlapping the gate wiring line 19 in a plan view. The lower end in FIG. 7 of the pixel electrode 18 is between the lower end of the gate wiring line 19 and the lower end of the pixel drain electrode 17c, and more specifically, is closer to the lower end of the pixel drain electrode 17c. The pixel electrode 18 is formed over the second interlayer insulating film 41 and the second interlayer insulating film 41 is interposed between the pixel electrodes 18 and the common electrode 22 to be described next. Of the first interlayer insulating film 39, the organic insulating film 40, and the second interlayer insulating film 41 disposed below the pixel electrode 18, a position overlapping the pixel drain electrode 17c and the pixel electrode 18 in a plan view has formed therein a vertical pixel contact hole 26 (contact hole) with the pixel electrode 18 being connected to the pixel drain electrode 17c through the pixel contact hole 26. In this manner, when electricity passes through the pixel gate electrode 17a of the pixel TFT 17, a current flows from the pixel source electrode 17b to the pixel drain electrode 17c through the pixel channel section 17d, and an electric charge is stored in the pixel electrode 18 with the pixel electrode 18 being charged up to a prescribed potential. This pixel contact hole 26 includes a lower layer contact hole 30 formed through the first interlayer insulating film 39 and the organic insulating film 40 and an upper layer contact hole 31 formed through the second interlayer insulating film 41 and partially overlapping the lower layer contact hole 30 in a plan view. The contact holes 30 and 31 having different plan view shapes, which will be described in detail later. The portion of the pixel electrode 18 in the lower layer contact hole 30 and the upper layer contact hole 31 is a pixel electrode connecting portion connected to the pixel drain electrode 17c. The portion of the pixel drain electrode 17c facing the front through the lower layer contact hole 30 and the upper layer contact hole 31 is a drain electrode connecting portion 17c1 connected to the pixel electrode connecting portion of the pixel electrode 18.

As shown in FIGS. 7 and 8, the common electrode 22 is made of the first transparent electrode film 23 and has a uniformly planar pattern across substantially the entire surface of the display area AA of the array substrate 11b. The common electrode 22 is interposed between the organic insulating film 40 and the second interlayer insulating film 41. The common electrode 22 opposes the pixel electrodes 18 across the second interlayer insulating film 41 with capacitance Clc being formed therebetween. A reference potential Vcom (common potential) is applied to the common electrode 22 from a common wiring line (not shown), and thus, by controlling the potential applied by the pixel TFT 17 to the pixel electrode 18, it is possible to form a prescribed difference in potential between the electrodes 18 and 22. When a difference in potential occurs between the electrodes 18 and 22, a fringe field (a diagonal electric field) including a component in the direction normal to the surface of the array substrate 11b is applied to the liquid crystal layer 11c in addition to a component along the surface of the array substrate 11b formed as a result of the slits 18a of the pixel electrodes 18. Thus, among the liquid crystal molecules included in the liquid crystal layer 11c, the orientations of those present over the pixel electrodes 18 in addition to those present over the slits 18a are appropriately switched. Thus, the aperture ratio of the liquid crystal panel 11 increases, allowing through a sufficient amount of transmitted light, and a wide viewing angle can be achieved. The common electrode 22 has formed therein openings 22a in areas overlapping portions of the pixel TFTs 17 in a plan view (see FIG. 8). In the present embodiment, the reference potential of the auxiliary capacitance wiring lines 25 is the same as the reference potential Vcom of the common electrode 22.

Next, the configuration inside the display area AA of the CF substrate 11a will be described in detail. As shown in FIG. 3, a large number of color filters 11h respectively having colored portions such as R (red), G (green), and B (blue) arranged in a matrix are disposed on the CF substrate 11a so as to overlap the respective pixel electrodes 18 on the array substrate 11b in a plan view. A substantially grid-shaped light shielding layer (black matrix) 11i for preventing color mixing is formed between the respective colored portions constituting the color filters 11h. This light shielding layer 11i overlaps the gate wiring lines 19 and the source wiring lines 20 in a plan view. The alignment film 11d is provided on the surfaces of the color filters 11h and the light-shielding layers 11i. In the liquid crystal panel 11, one display pixel, which is a unit of display, is constituted by a group including three colored portions of red (R), green (G), and blue (B), and three pixel electrodes 18 opposing the colored portions. The display pixel includes a red pixel having an R colored portion, a green pixel having a G colored portion, and a blue pixel having a B colored portion. The pixels of the respective colors are repetitively arranged along the row direction (X axis direction) of the surface of the liquid crystal panel 11, forming a group of pixels, and a plurality of the groups of pixels are arranged along the column direction (Y axis direction).

Figure 4:
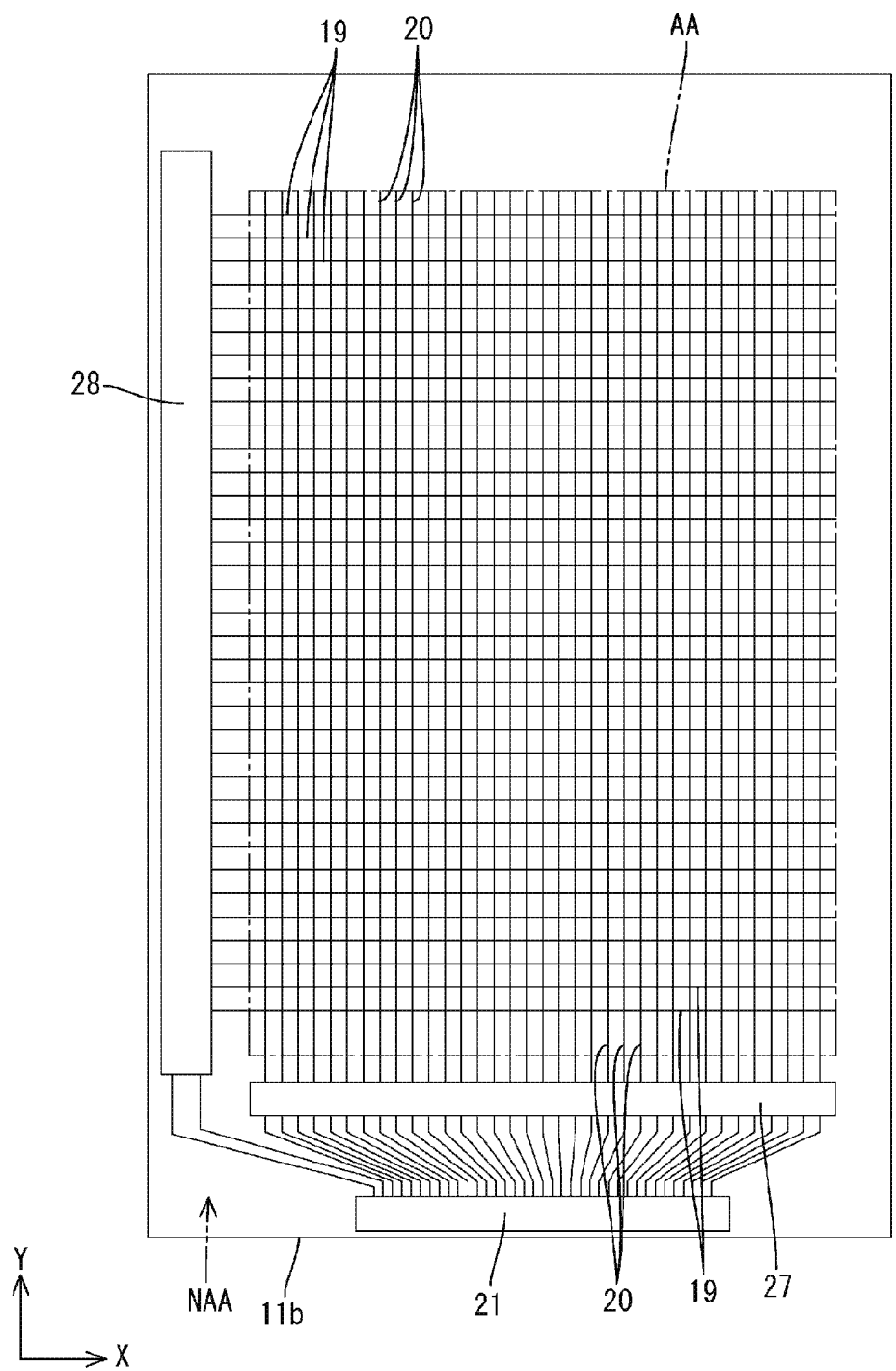
FIG. 4 is a plan view that schematically shows a wiring configuration in an array substrate of the liquid crystal panel.

Next, the configuration inside the non-display area NAA of the array substrate 11b will be described in detail. As shown in FIG. 4, a column control circuit 27 is provided in a portion of the non-display area NAA of the array substrate 11b adjacent to the shorter side portion of the display area AA and a row control circuit 28 is provided in the longer side portion of the display area AA. The column control circuit 27 and the row control circuit 28 can perform control to supply output signals from the driver 21 to the pixel TFT 17. The column control circuit 27 and the row control circuit 28 are formed monolithically on the array substrate 11b with the semiconductor film 36 made of the same oxide semiconductor as the pixel TFT 17 as the base, and therefore have control circuits for controlling the supply of output signals to the pixel TFTs 17. The column control circuit 27 and the row control circuit 28 are patterned on the array substrate 11b by the already known photolithography method simultaneously to the pixel TFTs 17 and the like being patterned in the manufacturing process for the array substrate 11b.

As shown in FIG. 4, the column control circuit 27 is disposed in a position adjacent to the lower shorter side portion in FIG. 4 of the display area AA, or in other words, in a position between the display area AA and the driver 21 in the Y axis direction, and is formed in a horizontally long rectangular area extending in the X axis direction (direction in which the source wiring lines 20 are arranged). The column control circuit 27 is connected to the source wiring lines 20 disposed in the display area AA and has a switching circuit (RGB switching circuit) that allocates data signals included in the output signal from the driver 21 to the respective source wiring lines 20. Specifically, a plurality of source wiring lines 20 are arranged in the X axis direction in the display area AA of the array substrate 11b, the source wiring lines 20 being respectively connected to the pixel TFTs 17 constituting the pixels of each color red (R), green (G), and blue (B), while the column control circuit 27 allocates the data signal from the driver 21 to the R, G, and B source wiring lines 20 using the switching circuit. Also, the column control circuit 27 can be provided with additional circuits such as a level shifter circuit or an ESD protection circuit.

On the other hand, as shown in FIG. 4, the row control circuit 28 is arranged in a position adjacent to the left longer side portion shown in FIG. 4 in the display area AA, and is formed in a vertically long area extending along the Y axis direction (direction in which the gate wiring lines 19 are arranged). The row control circuit 28 is connected to the gate wiring lines 19 disposed in the display area AA and has a scanning circuit that supplies a scan signal included in the output signal from the driver 21 to the respective source wiring lines 19 at a prescribed timing so as to sequentially scan the gate wiring lines 19. Specifically, a plurality of gate wiring lines 19 are arranged along the Y axis direction in the display area AA of the array substrate 11b, while the row control circuit 28 sequentially supplies the control signal (scan signal) from the driver 21 using the scanning circuit start at the top gate wiring line 19 and ending at the bottom gate wiring line 19 as shown in FIG. 4 in the display area AA, thereby scanning the gate wiring lines 19. The scanning circuit in the row control circuit 28 includes a buffer circuit for amplifying the scan signal. Also, the row control circuit 28 can be provided with additional circuits such as a level shifter circuit or an ESD protection circuit. The column control circuit 27 and the row control circuit 28 are connected to the driver 21 by connecting wiring lines formed on the array substrate 11b.

When manufacturing the array substrate 11b of the liquid crystal panel 11 having the above structure, in some cases, electric charge accumulates in the pixel electrodes 18 as a result of the electric charge accumulating therein during a manufacturing step or when the pixel TFTs 17 are test-operated during the inspection step performed between manufacturing steps. Even in such a case, the pixel TFTs 17 have strong OFF characteristics as a result of the semiconductor film 36 that forms the pixel channel section 17d being formed of an oxide semiconductor. As a result, during the manufacturing steps or inspection steps, electric charge accumulated in the pixel electrodes 18 has a tendency to remain there over long periods, which resulted in an increased tendency for display anomalies such as burn-ins or flickering to occur. One possible countermeasure is to apply a voltage to drive the pixel TFTs 17 to discharge the electric charge accumulated in the pixel electrodes 18 while the liquid crystal panel 11 display is OFF, for example, but this poses a problem in that a special control process would have to be additionally performed.

To solve this issue, as shown in FIGS. 5 and 6, the array substrate 11b of the liquid crystal panel 11 according to the present embodiment has resistive TFTs 32 (transistors) as resistors, each of which is connected between the pixel electrode 18 and the common electrode 22. The resistive TFT 32 at least has a gate electrode 32a, a source electrode 32b, a drain electrode 32c, and a channel section 32d that connects the source electrode 32b to the drain electrode 32c, of which the gate electrode 32a and the source electrode 32b are connected to the pixel electrode 18, and the drain electrode 32c is connected to the common electrode 22. In other words, in the resistive TFT 32, the drain electrode 32c is set at the same potential as the common electrode 22, whereas the gate electrode 32a and the source electrode 32b are both set at the same potential as the pixel electrode 18, and thus, the resistive TFT 32 in effect functions as a diode, and can be said to be a "diode-type transistor." As shown in FIG. 6, the resistive TFT 32 is disposed adjacent to the pixel TFT 17 in a plan view, and more specifically, is disposed in a region surrounded by the gate wiring lines 19 connected to the pixel TFTs 17, the source wiring lines 20 connected to the pixel TFTs 17, the auxiliary capacitance wiring line 25 disposed on the side of the pixel TFT 17 opposite to where the pixel TFT 17 is connected to the pixel electrode 18, and the drain wiring lines 29 connected to the pixel TFTs 17. In the resistive TFT 32, the gate electrode 32*a* completely overlaps the source electrode 32*b*, the drain electrode 32*c*, and the channel section 32*d* in a plan view, and the resistive TFT 32 is formed so as to have a gate extension section 32*a*1 that extends to the side of the source electrode 32*b* opposite to the drain electrode 32*c*. The pixel electrode 18 has a pixel extension section 18*b* that overlaps in a plan view a portion of the resistive TFT 32, and more specifically, the drain electrode 32*c* and the gate extension section 32*a*1 of the gate electrode 32*a*.

Figure 9:
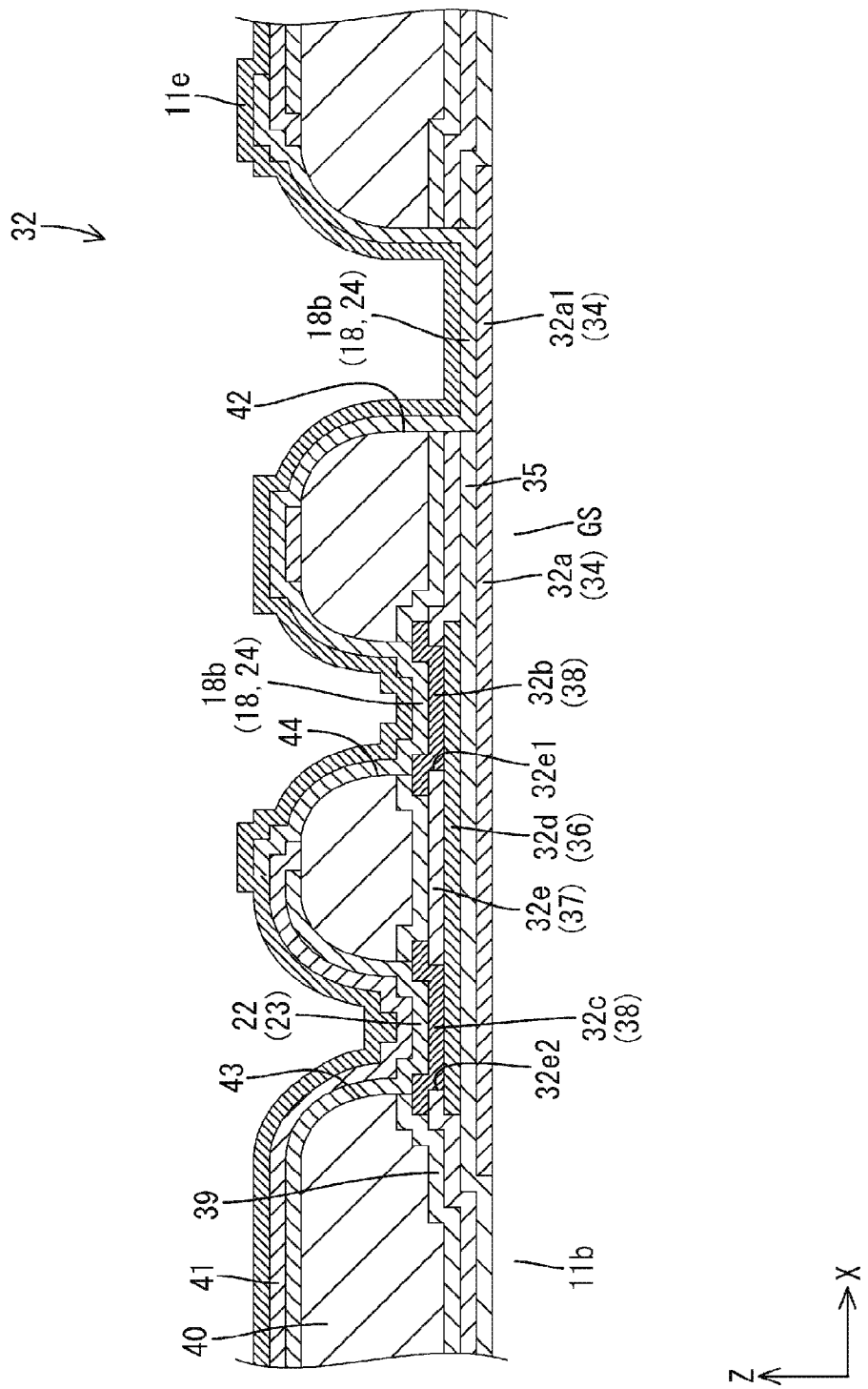
FIG. 9 is a cross-sectional view of FIG. 7 along the line ix-ix.

Specifically, as shown in FIGS. 7 and 9, the resistive TFT 32 has: the gate electrode 32*a* made of the first metal film 34; a channel section 32*d* that is made of the semiconductor film 36 and overlaps the gate electrode 32*a* in a plan view; a protective section 32*e* that is made of the protective film 37 and in which two openings 32*e*1 and 32*e*2 are formed in positions overlapping the channel section 32*d* in a plan view; the source electrode 32*b* that is made of the second metal film 38, and that is connected to the channel section 32*d* through one opening 32*e*1 of the two openings 32*e*1 and 32*e*2; and the drain electrode 32*c* that is made of the second metal film 38, and that is connected to the channel section 32*d* through the other opening 32*e*2 of the two openings 32*e*1 and 32*e*2. Of these, the gate electrode 32*a* is disposed so as to be separate (independent) from the gate wiring line 19 and the auxiliary capacitance wiring line 25. The channel section 32*d* extends in the X axis direction and serves as a bridge between the source electrode 32*b* and the drain electrode 32*c* to allow electrons to move therebetween. The semiconductor film 36 forming the channel section 32*d* is made of the same oxide semiconductor (In—Ga—Zn—O type semiconductor) as the pixel channel section 17*d* of the pixel TFT 17. In the channel section 32*d*, where the X axis distance between the source electrode 32*b* and the drain electrode 32*c* is the channel length (length dimension), and where the dimension of the channel section 32*d* along the Y axis direction, which intersects with the direction from the source electrode 32*b* to the drain electrode 32*d* (X axis direction), is the channel width (width dimension), the ratio (L/W) obtained by dividing the channel length by the channel width is set to be larger than the ratio obtained by dividing the channel length by the channel width for the pixel channel section 17*d* of the pixel TFT 17. Thus, the resistance on the electric charge moving between the source electrode 32*b* and the drain electrode 32*c* through the channel section 32*d* is greater than the resistance on the electric charge moving between the pixel source electrode 17*b* and the pixel drain electrode 17*c* through the pixel channel section 17*d* of the pixel TFT 17. The channel section 32*d* has a smaller channel length and width than that of the pixel channel section 17*d*.

Of the first interlayer insulating film 39, the organic insulating film 40, and the second interlayer insulating film 41 disposed below the pixel extension section 18*b* of the pixel electrode 18, a position overlapping the pixel extension section 18*b* and the gate extension section 32*a*1 in a plan view has formed therein a vertical gate contact hole 42, as shown in FIG. 9, with the pixel extension section 18*b* being connected to the gate electrode 32*a* through the gate contact hole 42. Similarly, of the first interlayer insulating film 39, the organic insulating film 40, and the second interlayer insulating film 41 disposed below the pixel extension section 18*b*, a position overlapping the pixel extension section 18*b* and the drain electrode 32*c* in a plan view has formed therein a vertical drain contact hole 43 with the pixel extension section 18*b* being connected to the drain electrode 32*c* through the drain contact hole 43. The common electrode 22 has an opening formed so as to surround the gate contact hole 42 and the drain contact hole 43. Furthermore, of the first interlayer insulating film 39 and the organic insulating film 40 disposed below the common electrode 22, a position overlapping the common electrode 22 and the source electrode 32*b* in a plan view has formed therein a vertical source contact hole 44 with the common electrode 22 being connected to the source electrode 32*b* through the source contact hole 44.

According to the configuration above, if the pixel electrode 18 is charged by the pixel TFT 17, for example, then as shown in FIG. 5, a difference in potential occurs between the gate electrode 32*a* and source electrode 32*b* of the resistive TFT 32, which are set to the same potential as the pixel electrode 18, and the drain electrode 32*c* set at the same potential as the common electrode 22. Thus, the resistive TFT 32 in effect functions as a diode, and is configured such that current flows (electric charge moves) from the source electrode 32*b* and the drain electrode 32*c* through the channel section 32*d*. Thus, electric charge moves between the pixel electrode 18 and the common electrode 22, resulting in the pixel electrode 18 and the common electrode 22 eventually being at the same potential. As a result, burn-in, flickering, or the like is mitigated in the display screen without performing a special control process.

Figure 10:
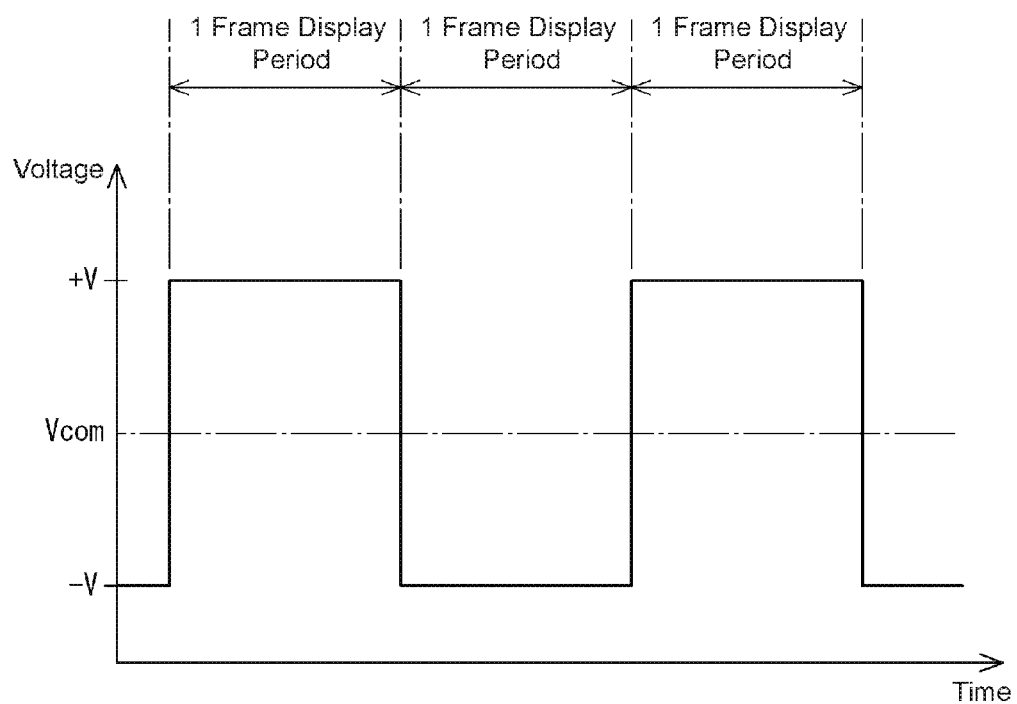
FIG. 10 shows a change for each frame of the voltage of the data signal supplied to the pixel source electrode of the pixel TFT.

To explain the driving method for the pixel TFT 17, when the pixel TFT 17 is turned ON as a result of a scan signal supplied through the gate wiring line 19 to the pixel gate electrode 17*a* at a prescribed timing, a data signal supplied to the pixel source electrode 17*b* through the source wiring line 20 is transmitted through the pixel channel section 17*d* to the pixel drain electrode 17*c*. In contrast, the reference potential Vcom supplied to the common electrode 22 remains constant. At this time, as shown in FIG. 10, the pixel TFT 17 is driven by the so-called "frame inversion driving" in which the polarity is reversed every frame display period such that a potential +V that is higher than the reference potential Vcom of the common electrode 22 and a potential −V that is lower than the reference potential Vcom of the common electrode 22 are supplied in alternating frame display periods through the pixel TFT 17 to the pixel electrode 18. The frame rate is set at 60 fps, for example. When the potential +V of the pixel electrode 18 charged by the pixel TFT 17 is higher than the reference potential Vcom of the common electrode 22, the resistive TFT 32 becomes forward biased, but the potential +V of the pixel electrode 18 is set so as not to exceed the threshold voltage of the resistive TFT 32, and thus, the amount of charge moving between the source electrode 32*b* and the drain electrode 32*c* is minuscule. In contrast, if the potential −V of the pixel electrode 18 charged by the pixel TFT 17 is lower than the reference potential Vcom of the common electrode 22, then the resistive TFT 32 becomes reverse biased, and thus, only an amount of charge approximately equal to the leakage current flows between the source electrode 32*b* and the drain electrode 32*c*. In either case, the amount of charge flowing per unit time between the pixel electrode 18 and the common electrode 22 through the resistive TFT 32 is minuscule, and thus, the resistive TFT 32 provides effective resistance against the electric charge. Thus, there is a sufficient amount of time to when the potential of the pixel electrode 18 reaches the reference potential Vcom of the common electrode 22, which means that a situation in which the potential of the pixel electrode 18 instantaneously reaches the reference potential Vcom of the common electrode 22 can be avoided. As a result, during normal operation, this configuration is suitable for displaying images in the liquid crystal panel 11 due to the potential of the pixel electrode 18 charged by the pixel TFT 17 being maintained over a certain period of time (one frame display period, for example), and as a result, a situation in which display quality for displayed images is reduced is avoided. Even if electric charge accumulates in the pixel electrode 18 not only due to charging of the pixel electrode 18 by the pixel TFT 17 but due to circumstances (such as static electricity) during manufacturing of the liquid crystal panel 11, for example, resulting in a difference in potential between the pixel electrode 18 and the common electrode 22, it is possible for the pixel electrode 18 to reach the same potential as the common electrode 22 by the electric charge moving between the pixel electrode 18 and the common electrode 22 through the resistive TFT 32 in a manner similar to what was described above.

As described above, the liquid crystal panel 11 (display device) of the present embodiment includes the pixel electrodes 18 (pixel units), the pixel TFTs 17 (switching elements), which are connected to the pixel electrodes 18 and can charge the pixel electrodes 18, the common electrode 22 (reference potential unit) set at reference potential, and the resistive TFTs 32, which are connected between the pixel electrode 18 and the common electrode 22 and are resistors that provide resistance against electric charge moving between the pixel electrode 18 and the common electrode 22.

In this manner, when the pixel electrode 18 is charged by the pixel TFT 17, charge accumulates in the pixel electrode 18. If the OFF characteristics of the pixel TFT 17 are high, then there is a tendency for the electric charge accumulated in the pixel electrode 18 to remain therein for a long period of time, which presents the risk of burn-in, flickering, and the like occurring in the display screen of the liquid crystal panel 11. One possible countermeasure is to apply a voltage to drive the pixel TFTs 17 to discharge the pixel electrodes 18, for example, but this would require an additional special control process.

In contrast, the above-mentioned pixel electrode 18 is connected to the common electrode 22 with the resistive TFT 32, which is a resistor, interposed therebetween. Thus, if the potential of the pixel electrode 18 is greater than the reference potential of the common electrode 22, for example, then the electric charge moves from the pixel electrode 18 to the common electrode 22 through the resistive TFT 32, which is a resistor. Conversely, if the potential of the pixel electrode 18 is lower than the reference potential of the common electrode 22, then the electric charge moves from the common electrode 22 to the pixel electrode 18 through the resistive TFT 32, which is a resistor. In either case, the potential of the pixel electrode 18 is brought closer to reference potential, thereby reducing the susceptibility of the display screen to burn-in, flickering, or the like without the need for a special control process. Furthermore, the resistive TFT 32, which is a resistor, provides resistance against the electric charge moving between the pixel electrode 18 and the common electrode 22, and thus, it is possible to increase the amount of time until the potential of the pixel electrode 18 reaches reference potential, thereby preventing a situation in which the potential of the pixel electrode 18 instantaneously reaches reference potential. As a result, this configuration is suitable for displaying images in the liquid crystal panel 11 due to the potential of the pixel electrode 18 charged by the pixel TFT 17 being maintained over a certain period of time, and as a result, a situation in which display quality for displayed images is reduced is avoided.

Also, the resistor includes the resistive TFT 32 (transistor), which has at least the gate electrode 32a, the source electrode 32b, the drain electrode 32c, and the channel section 32d connecting the source electrode 32b and the drain electrode 32c, in which the gate electrode 32a is connected to either the pixel electrode 18 or the common electrode 22, and in which either the source electrode 32b or the drain electrode 32c is connected to the pixel electrode 18 with the other being connected to the common electrode 22. In this manner, the gate electrode 32a is set at the same potential as either the pixel electrode 18 or the common electrode 22, and either the source electrode 32b or the drain electrode 32c is set to the same potential as the pixel electrode 18, with the other being set to the same potential as the common electrode 22. Thus, when the pixel electrode 18 is charged by the pixel TFT 17, a difference in potential occurs between the source electrode 32b and the drain electrode 32c, whereas the gate electrode 32a is set to the same potential as either the source electrode 32b or the drain electrode 32c, and thus, the resistive TFT 32 effectively functions as a diode, and electric charge is carried between the source electrode 32b and the drain electrode 32c through the channel section 32d. Here, the resistive TFT 32 is either forward biased or reversed biased according to the potential to which the pixel electrode 18 is charged by the pixel TFT 17. When forward biased, a small amount of charge less than the threshold voltage of the resistive TFT 32 flows, whereas when the resistive TFT 32 is reverse biased, only an amount of charge equal to the leakage current of the resistive TFT 32 flows, with the amount of charge moving being very small. In either case, the resistive TFT 32 provides resistance against the electric charge moving between the pixel electrode 18 and the common electrode 22, and thus, a sufficient amount of time can be attained to when the potential of the pixel electrode 18 reaches reference potential. In this manner, there is little risk of the display quality of the display screen being reduced when displaying images in the liquid crystal panel 11.

The switching element is the pixel TFT 17, which has at least the pixel gate electrode 17a, the pixel source electrode 17b, the pixel drain electrode 17c connected to the pixel electrode 18, and the pixel channel section 17d connecting the pixel source electrode 17b to the pixel drain electrode 17c. The channel section 32d of the resistive TFT 32 constituting a resistor is made of the same material as the pixel channel section 17d of the pixel TFT 17 that is the switching element. Using the same material for the pixel channel section 17d of the pixel TFT 17 constituting a switching element and the channel section 32d of the resistive TFT 32 constituting a resistor provides advantages such as a reduction in manufacturing cost.

Also, in the resistive TFT 32 constituting a resistor, the ratio obtained by dividing the length dimension (channel length) of the channel section 32d, which is the distance between the source electrode 32b and the drain electrode 32c, by the width dimension (channel width) of the channel section 32d is greater than the ratio for the pixel channel section 17d of the pixel TFT 17 constituting a switching element, the ratio being obtained by dividing the length dimension of the pixel channel section 17d, which is the distance between the pixel source electrode 17b and the pixel drain electrode 17c, by the width dimension. In this manner, the resistance on the electric charge moving between the source electrode 32b and the drain electrode 32c through the channel section 32d in the resistive TFT 32 constituting a resistor is greater than the resistance on the electric charge moving between the pixel source electrode 17b and the pixel drain electrode 17c through the pixel channel section 17d of the pixel TFT 17 constituting a switching element. Thus, by the resistive TFT 32 constituting the resistor, it is possible to attain a sufficient amount of time to when the potential of the pixel electrode 18 reaches reference potential, and as a result, the likelihood of display quality of the display screen deteriorating for when images are displayed in the liquid crystal panel 11 is further reduced.

Also, in the resistive TFT 32 constituting the resistor, the gate electrode 32a and the source electrode 32b are connected to the pixel electrode 18 and the drain electrode 32c is connected to the common electrode 22. In this manner, if the potential of the pixel electrode 18 is greater than the reference potential of the common electrode 22, for example, then the resistive TFT 32 constituting the resistor is forward biased, and thus, electric charge moves from the source electrode 32b (pixel electrode 18) set at the same potential as the gate electrode 32a to the drain electrode 32c (common electrode 22). Conversely, if the potential of the pixel electrode 18 is less than the reference potential of the common electrode 22, then the resistive TFT 32 constituting the resistor is reverse biased, and thus, electric charge moves from the drain electrode 32c (common electrode 22) to the source electrode 32b (pixel electrode 18) set at the same potential as the gate electrode 32a. In either case, the resistive TFT 32 provides resistance against the electric charge moving between the pixel electrode 18 and the common electrode 22, and thus, a sufficient amount of time can be attained to when the potential of the pixel electrode 18 reaches reference potential. In this manner, there is little risk of the display quality of the display screen being reduced when displaying images in the liquid crystal panel 11.

Also, the common electrode 22, which forms capacitance with the pixel electrode 18, is provided, and the reference potential unit is the common electrode 22. In this manner, the reference potential unit is the common electrode 22 forming capacitance with the pixel electrode 18 and electric charge moves between the pixel electrode 18 and the reference potential unit as a result of the resistive TFT 32, which is a resistor, and thus, as a result of the movement of electric charge through the resistive TFT 32, which is a resistor, the difference in potential between the pixel electrode 18 and the common electrode 22 can be set to close to 0. Thus, it is possible to further reduce the risk of burn-in or flickering in the display screen.

The switching element is the pixel TFT 17, which has the pixel gate electrode 17a, the pixel source electrode 17b, the pixel drain electrode 17c connected to the pixel electrode 18, and the pixel channel section 17d connecting the pixel source electrode 17b to the pixel drain electrode 17c. The pixel channel section 17d is made of an oxide semiconductor. In this manner, by using an oxide semiconductor as the material for the pixel channel section 17d of the pixel TFT 17, which is a switching element, the off leakage current of the pixel TFT 17 is reduced compared to a case in which amorphous silicon or the like is used as the pixel channel section 17d material, and thus, the voltage holding ratio of the pixel electrode 18 is high. If the voltage holding ratio of the pixel electrode 18 is high, the electric charge accumulated in the pixel electrode 18 tends to remain therein for a long period of time, but by the electric charge moving between the pixel electrode 18 and the common electrode 22 through the resistive TFT 32, which is a resistor, it is possible to cause the potential of the pixel electrode 18 to approach reference potential, and thus, it is possible to mitigate the risk of burn-in, flickering, or the like in the display screen without performing a special control process.

The oxide semiconductor contains indium (In), gallium (Ga), zinc (Zn), and oxygen (O). In this manner, the oxide semiconductor forming the pixel channel section 17d of the pixel TFT 17 includes indium (In), gallium (Ga), zinc (Zn), and oxygen (O), and thus, the off leakage current of the pixel TFT 17 is further reduced and the voltage holding ratio of the pixel electrode 18 is high. However, by causing electric charge to move between the pixel electrode 18 and the common electrode 22 through the resistive TFT 32, which is a resistor, it is possible to cause the potential of the pixel electrode 18 to approach reference potential, and thus, it is possible to further reduce burn-in, flickering, and the like without needing to perform a special control process.

Also, the oxide semiconductor is crystalline. In this manner, the oxide semiconductor forming the pixel channel section 17d of the pixel TFT 17 includes indium (In), gallium (Ga), zinc (Zn), and oxygen (O) and is also crystalline, and thus, the off leakage current of the pixel TFT 17 is further reduced and the voltage holding ratio of the pixel electrode 18 is high. However, by causing electric charge to move between the pixel electrode 18 and the common electrode 22 through the resistive TFT 32, which is a resistor, it is possible to cause the potential of the pixel electrode 18 to approach reference potential, and thus, it is possible to even further reduce burn-in, flickering, and the like without needing to perform a special control process.

Furthermore, the display device includes the array substrate 11b on which the pixel electrodes 18, the pixel TFTs 17, the common electrode 22, and the resistive TFTs 32, which are resistors; the CF substrate 11a, which opposes the array substrate, and on which the color filters 11h are arranged; and the liquid crystal layer 11c sandwiched between the array substrate 11b and the CF substrate 11a. Such a display device as the liquid crystal display device 10 can be applied to displays and the like of devices such as in-vehicle information devices or mobile information devices.

Embodiment 2

Embodiment 2 of the present invention will be described with reference to FIG. 11 or 12. In Embodiment 2, an arrangement is shown in which a plurality of the resistive TFTs 132 disclosed in Embodiment 1 are connected in series. Descriptions of structures, operations, and effects similar to those of Embodiment 1 will be omitted.

Figure 11:
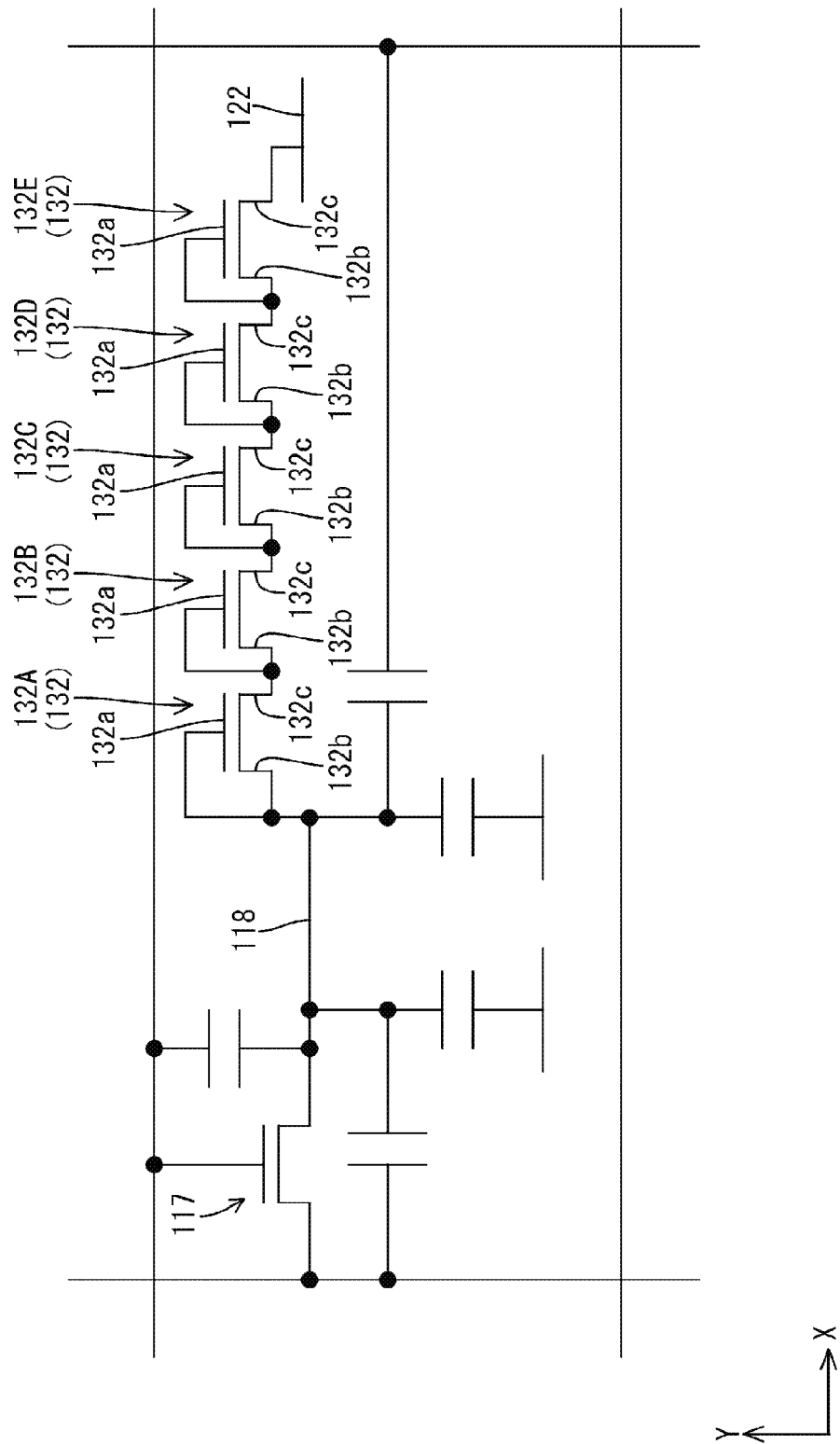
FIG. 11 is a circuit diagram showing a circuit configuration of a pixel in a display area of an array substrate according to Embodiment 2 of the present invention.
Figure 12:
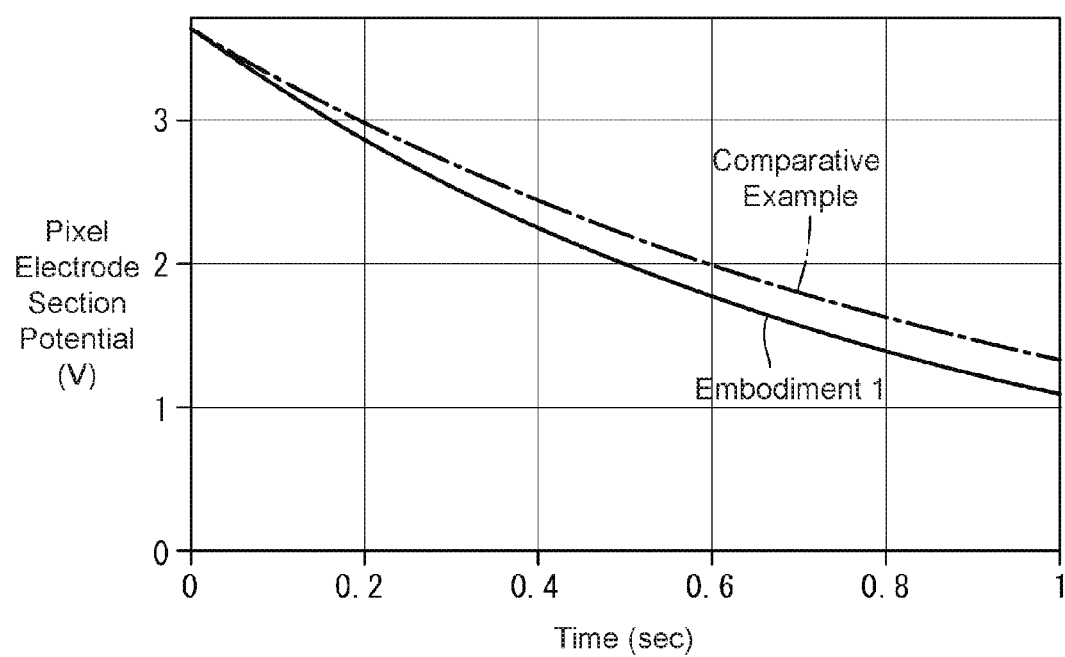
FIG. 12 is a graph showing the change over time of a voltage of a pixel electrode charged by a pixel TFT.

As shown in FIG. 11, the resistive TFTs 132 of the present embodiment are arranged between a pixel electrode 118 and a common electrode 122, and five such resistive TFTs 132 are connected to each other in series. Below, when distinguishing each of the five resistive TFTs 132, the resistive TFT 132 directly connected to the pixel electrode 118 is a first resistive TFT 132A, the second closest resistive TFT 132 to the pixel electrode 118 is a second resistive TFT 132B, the third closest resistive TFT 132 to the pixel electrode 118 is a third resistive TFT 132C, the fourth closest resistive TFT 132 to the pixel electrode 118 is a fourth resistive TFT 132D, and the resistive TFT 132 directly connected to the common electrode 122 is a fifth resistive TFT 132E. In the first resistive TFT 132A, the gate electrode 132a and the source electrode 132b are both connected to the pixel electrode 118, whereas the drain electrode 132c is connected to the gate electrode 132a and the source electrode 132b of the second resistive TFT 132B. The drain electrode 132c of the second resistive TFT 132B is connected to the gate electrode 132a and the source electrode 132b of the third resistive TFT 132C, the drain electrode 132c of the third resistive TFT 132C is connected to the gate electrode 132a and the source electrode 132b of the fourth resistive TFT 132D, and the drain electrode 132c of the fourth resistive TFT 132D is connected to the gate electrode 132a and the source electrode 132b of the fifth resistive TFT 132E. The drain electrode 132c of the fifth resistive TFT 132E is connected to the common electrode 122.

According to this configuration, when the pixel electrode 118 is charged by the pixel TFT 117 to a higher potential than the common electrode 122, for example, then electric charge moves from the source electrode 132b of the first resistive TFT 132A to the drain electrode 132c of the first resistive TFT 132A. At this time, the gate electrode 132a and the source electrode 132b of the second resistive TFT 132B are at the same potential as the drain electrode 132c of the first resistive TFT 132A, and thus, electric charge moves from the source electrode 132b of the second resistive TFT 132B to the drain electrode 132c of the second resistive TFT 132B. The electric charge that has moved to the drain electrode 132c of the second resistive TFT 132B similarly moves through the third resistive TFT 132C, the fourth resistive TFT 132D, and the fifth resistive TFT 132E to reach the common electrode 122. On the other hand, if the pixel electrode 118 is charged by the pixel TFT 117 and the pixel electrode 118 is at a lower potential than the common electrode 122, then conversely, the electric charge of the common electrode 122 passes through the fifth resistive TFT 132E, the fourth resistive TFT 132D, the third resistive TFT 132C, the second resistive TFT 132B, and the first resistive TFT 132A, in that order, to reach the pixel electrode 118. In this manner, the electric charge between the pixel electrode 118 and the common electrode 122 moves through five resistive TFTs 132, resulting in the pixel electrode 118 and the common electrode 122 reaching the same potential as each other after a prescribed period of time.

The following Comparison Experiment 1 was performed in order to attain knowledge of the effects attained by interposing the five resistive TFTs 132, connected to each other in series as described above, between the pixel electrode 118 and the common electrode 122. In Comparison Experiment 1, a configuration in which the pixel electrode and the common electrode are not connected to each other (no resistor is present) is a comparison example, and a configuration as in the present embodiment in which the five resistive TFTs 132 are connected in series (see FIG. 11) is Working Example 1. In the comparison example and Working Example 1, the change over time of the potential in the pixel electrodes was measured, the results of which are shown in FIG. 12. In FIG. 12, the vertical axis is the potential of the pixel electrode (with a unit of "V"), the horizontal axis is the time (with a unit of "sec") elapsed from when the pixel electrode was charged to a prescribed potential, and the solid line shown in the drawing indicates the results of the experiment of Working Example 1 with the one-dot-chain line indicating the results of the experiment of the comparison example. In Comparison Experiment 1, the potential of the pixel electrode is measured in the comparison example and Working Example 1 at approximately 1 sec from when the pixel electrode is charged at approximately 3.6V to when approximately 1 sec has elapsed, for example. The results of Comparison Experiment 1 will be described below. As shown in the graph of FIG. 12, when comparing the potentials of the pixel electrodes when the same amount of time has elapsed since the pixel electrodes were charged between the comparison example and Working Example 1, the potential in Working Example 1 is less than in the comparison example. When comparing the amount of time elapsed for the potential of the pixel electrode to become the same as common potential between the comparison example and Working Example 1, the amount of time is shorter for Working Example 1 than for the comparison example. In other words, it can be seen that the rate of decrease of potential in the pixel electrode is greater in Working Example 1 than in the comparison example. This is thought to be because, if a configuration is adopted in which the five resistive TFTs 132 connected in series to each other are interposed between the pixel electrode 118 and the common electrode 122 as in Working Example 1, then compared to the configuration of the comparison example in which the pixel electrode and the common electrode are not connected to each other, the potential of the pixel electrode 118 can approach the reference potential of the common electrode 122 in a shorter period of time because the electric charge moves directly between the pixel electrode 118 and the common electrode 122. When comparing the configuration of the five resistive TFTs 132 being connected in series to each other as in Working Example 1 to the configuration as in Embodiment 1 in which only one resistive TFT 32 is disposed (see FIG. 5), the amount of electric charge moving per unit period of time between the pixel electrode 118 and the common electrode 122 is thought to be less for Working Example 1. Thus, it can be said that the five resistive TFTs 132 connected to each other in series as in Working Example 1 function as a greater resistance component than the one resistive TFT 32 in Embodiment 1. As a result, during normal operation, this configuration is more suitable for displaying images in the liquid crystal panel due to the potential of the pixel electrode 118 charged by the pixel TFT 117 being maintained over a certain period of time, and as a result, a situation in which display quality for displayed images is reduced is avoided.

According to the present embodiment described above, the resistor is constituted by a plurality of resistive TFTs 132 connected to each other in series. In this manner, the electric charge moves between the pixel electrode 118 and the common electrode 122 through a plurality of resistive TFTs 132, and thus, it is more difficult for the electric charge to flow, which prevents a situation in which the potential of the pixel electrode 118 instantaneously reaches reference potential. This configuration is more suitable in that the potential of the pixel electrode 118, which is charged by the pixel TFT 117, is maintained for a certain period of time.

Embodiment 3

Embodiment 3 of the present invention will be described with reference to FIGS. 13 to 15. Embodiment 3 shows a case in which the connective configuration of a resistive TFT 33 is modified. Descriptions of structures, operations, and effects similar to those of Embodiment 1 will be omitted.

Figure 13:
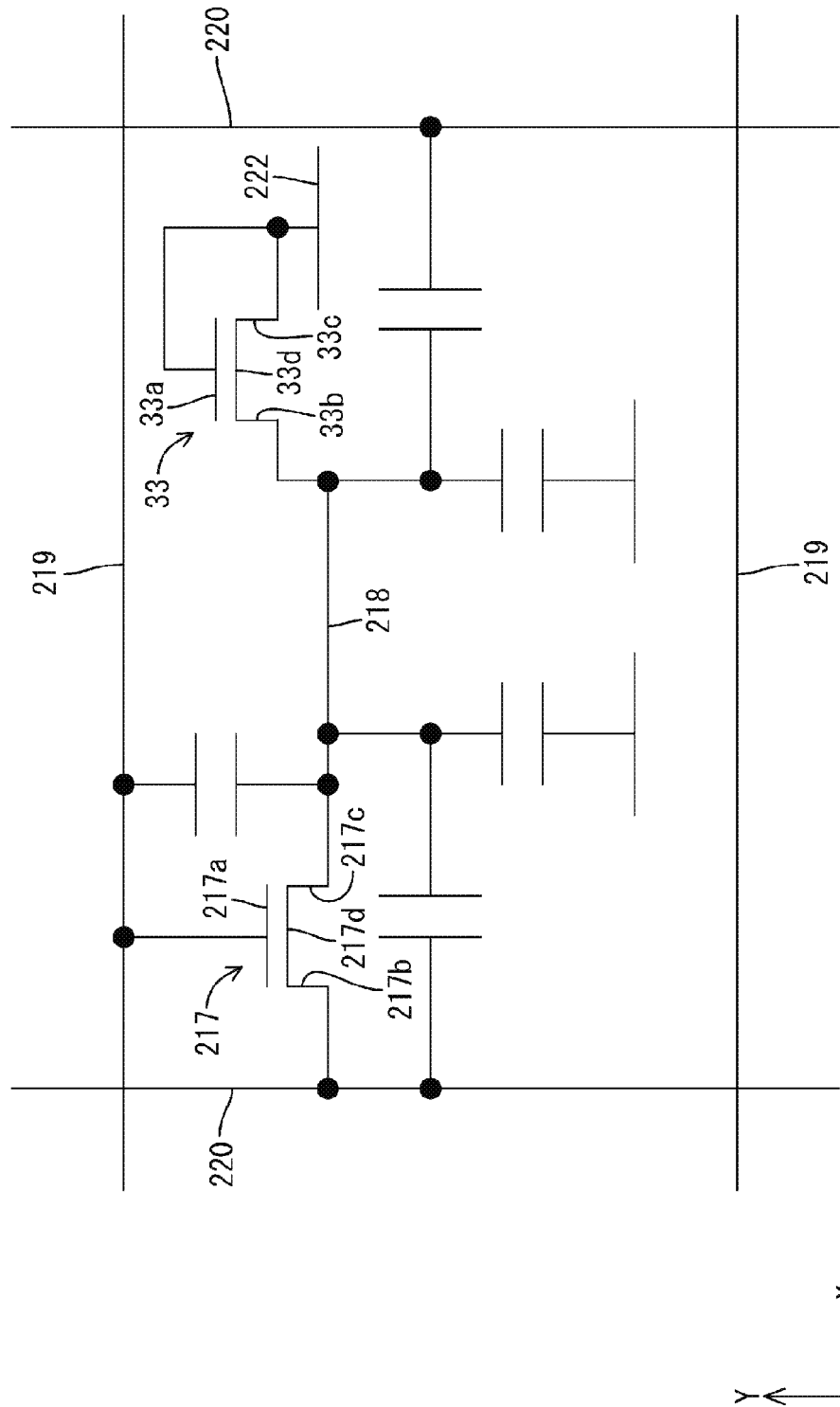
FIG. 13 is a circuit diagram showing a circuit configuration of a pixel in a display area of an array substrate according to Embodiment 3 of the present invention.

As shown in FIG. 13, the resistive TFT 33 (resistor, transistor) of the present embodiment is connected between a pixel electrode 218 and a common electrode 222. This resistive TFT 33 at least has a gate electrode 33a, a source electrode 33b, a drain electrode 33c, and a channel section 33d that connects the source electrode 33b and the drain electrode 33c, of which the source electrode 33b is connected to the pixel electrode 218, and the gate electrode 33a and the drain electrode 33c are connected to the common electrode 222. In other words, in the resistive TFT 33, the gate electrode 33*a* and the drain electrode 33*c* are set at the same potential as the common electrode 222, whereas the source electrode 33*b* is set at the same potential as the pixel electrode 218, and thus, the resistive TFT 32 in effect functions as a diode, and can be said to be a "diode-type transistor." As shown in FIG. 14, the resistive TFT 33 is disposed adjacent to the pixel TFT 217 in a plan view, and more specifically, is disposed in a region surrounded by the gate wiring lines 219 connected to the pixel TFTs 217, the source wiring lines 220 connected to the pixel TFTs 217, the auxiliary capacitance wiring line 225 disposed on the side of the pixel TFT 217 opposite to where the pixel TFT 217 is connected to the pixel electrode 218, and the drain wiring line 229 connected to the pixel TFTs 217. In the resistive TFT 33, the gate electrode 33*a* completely overlaps the source electrode 33*b*, the drain electrode 33*c*, and the channel section 33*d* in a plan view, and the resistive TFT 33 is formed so as to have a gate extension section 33*a*1 that extends to the side of the drain electrode 33*c* opposite to the source electrode 33*b*. The pixel electrode 218 has a pixel extension section 218*b* that overlaps in a plan view a portion of the resistive TFT 33, and more specifically, the source electrode 33*b*.

Figure 14:
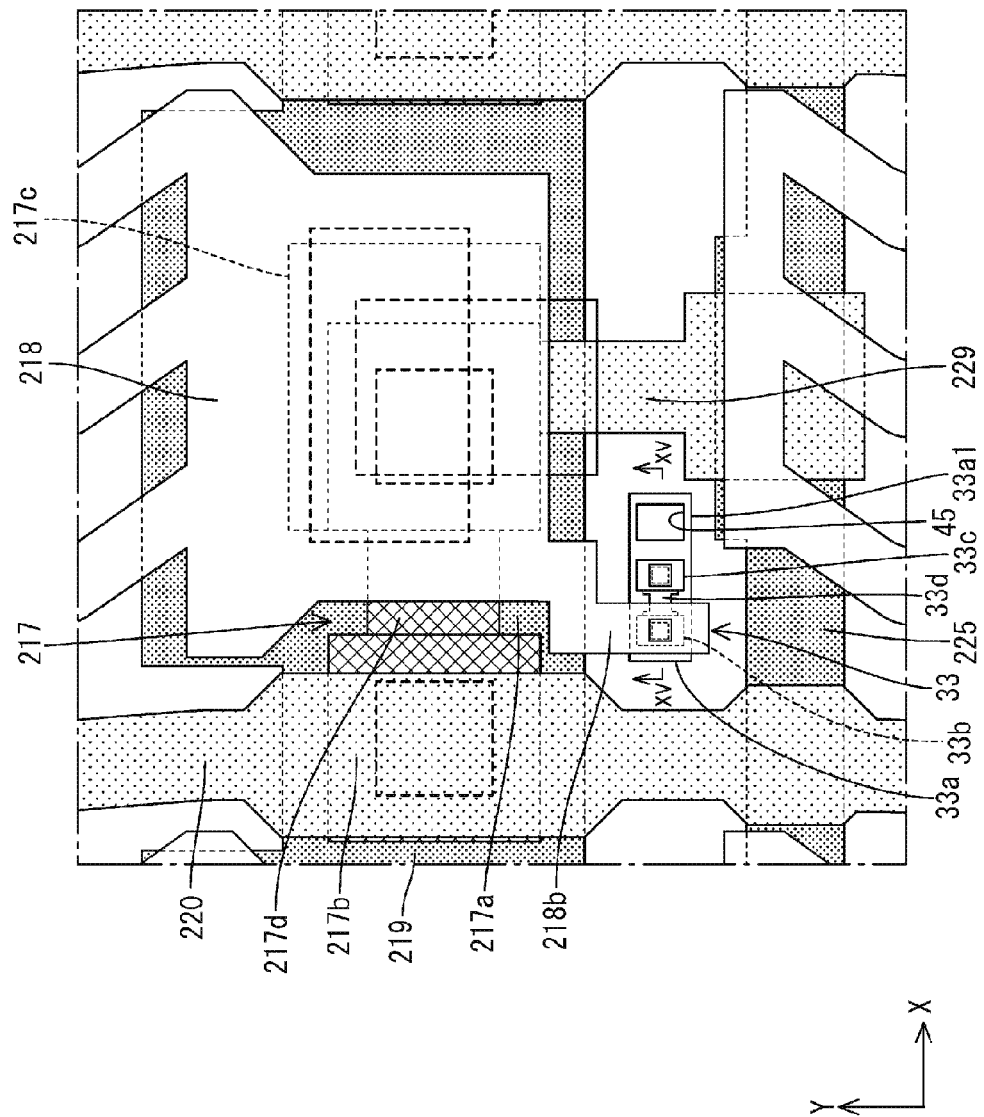
FIG. 14 is an expanded plan view of the area of a pixel TFT and a resistive TFT in the display area of the array substrate.
Figure 15:
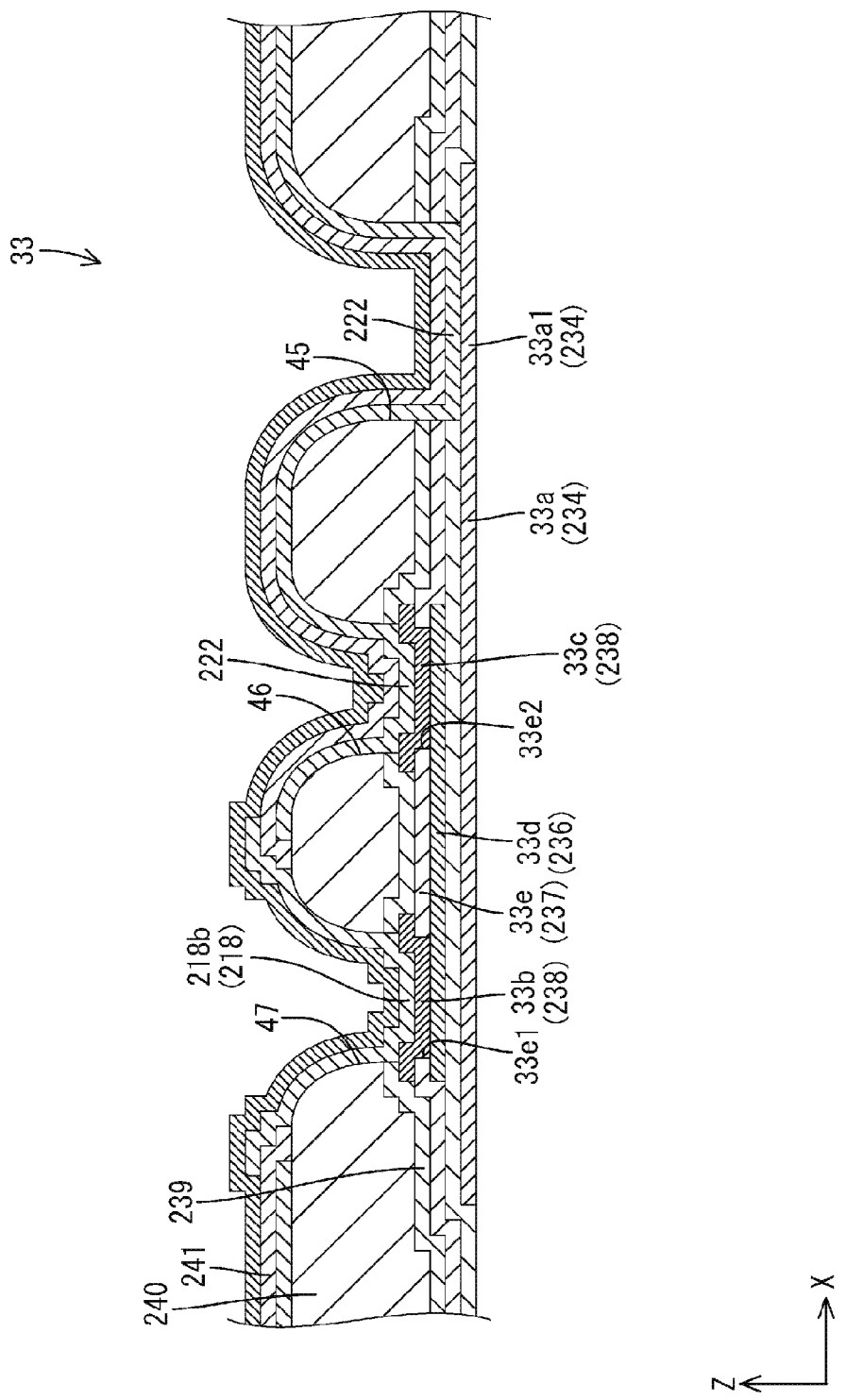
FIG. 15 is a cross-sectional view of FIG. 14 along the line xv-xv.

Specifically, as shown in FIGS. 14 and 15, the resistive TFT 33 has: the gate electrode 33*a* made of the first metal film 234; a channel section 33*d* that is made of the semiconductor film 236 and overlaps the gate electrode 33*a* in a plan view; a protective section 33*e* that is made of the protective film 237, and in which two openings 33*e*1 and 33*e*2 are formed in positions overlapping the channel section 33*d* in a plan view; the source electrode 33*b*, which is made of the second metal film 238 and is connected to the channel section 33*d* through one opening 33*e*1 of the two openings 33*e*1 and 33*e*2; and the drain electrode 33*c*, which is made of the second metal film 238 and is connected to the channel section 33*d* through the other opening 33*e*2 of the two openings 33*e*1 and 33*e*2. Of these, the gate electrode 33*a* is disposed so as to be separate (independent) from the gate wiring line 219 and the auxiliary capacitance wiring line 225. The channel section 33*d* extends in the X axis direction and serves as a bridge between the source electrode 33*b* and the drain electrode 33*c* to allow electrons to move therebetween. The semiconductor film 236 forming the channel section 33*d* is made of the same oxide semiconductor (In—Ga—Zn—O type semiconductor) as the pixel channel section 217*d* of the pixel TFT 217 (see FIG. 13). In the channel section 33*d*, where the X axis distance between the source electrode 33*b* and the drain electrode 33*c* is the channel length (length dimension), and where the dimension of the channel section 33*d* along the Y axis direction, which intersects with the direction from the source electrode 33*b* to the drain electrode 33*c* (X axis direction), is the channel width (width dimension), the ratio (L/W) obtained by dividing the channel length by the channel width is set to be larger than the ratio obtained by dividing the channel length by the channel width for the pixel channel section 217*d* of the pixel TFT 217. Thus, the resistance on the electric charge moving between the source electrode 33*b* and the drain electrode 33*c* through the channel section 33*d* is greater than the resistance on the electric charge moving between the pixel source electrode 217*b* and the pixel drain electrode 217*c* through the pixel channel section 217*d* of the pixel TFT 217 (see FIG. 13). The channel section 33*d* has a smaller channel length and width than that of the pixel channel section 217*d*.

As shown in FIG. 15, of the first interlayer insulating film 239 and the organic insulating film 240 disposed below the common electrode 222, a position overlapping the common electrode 222 and the gate extension section 33*a*1 in a plan view has formed therein a vertical gate contact hole 45, with the common electrode 222 being connected to the gate electrode 33*a* through the gate contact hole 45. Similarly, of the first interlayer insulating film 239 and the organic insulating film 240 disposed below the common electrode 222, a position overlapping the common electrode 222 and the drain electrode 33*c* in a plan view has formed therein a vertical drain contact hole 46, with the common electrode 222 being connected to the drain electrode 33*c* through the drain contact hole 46. Of the first interlayer insulating film 239, the organic insulating film 240, and the second interlayer insulating film 241 disposed below the pixel extension section 218*b* of the pixel electrode 218, a position overlapping the pixel extension section 218*b* and the source electrode 33*b* in a plan view has formed therein a vertical source contact hole 47, with the pixel extension section 218*b* being connected to the source electrode 33*b* through the source contact hole 47. The common electrode 222 has an opening formed so as to surround the source contact hole 47.

According to the configuration above, if the pixel electrode 218 is charged by the pixel TFT 217, for example, then as shown in FIG. 13, a difference in potential occurs between the source electrode 33*b* of the resistive TFT 33, which is set to the same potential as the pixel electrode 218, and the gate electrode 33*a* and drain electrode 33*c* set at the same potential as the common electrode 222. Thus, the resistive TFT 33 in effect functions as a diode, and is configured such that current flows (electric charge moves) from the source electrode 33*b* and the drain electrode 33*c* through the channel section 33*d*. Thus, electric charge moves between the pixel electrode 218 and the common electrode 222, resulting in the pixel electrode 218 and the common electrode 222 eventually being at the same potential. As a result, burn-in, flickering, or the like is mitigated in the display screen without performing a special control process.

To explain the driving method for the pixel TFT 217, when the pixel TFT 217 is turned ON as a result of a scan signal supplied through the gate wiring line 219 to the pixel gate electrode 217*a* at a prescribed timing, a data signal supplied to the pixel source electrode 217*b* through the source wiring line 220 is transmitted through the pixel channel section 217*d* to the pixel drain electrode 217*c*. In contrast, the reference potential Vcom supplied to the common electrode 222 remains constant. As this time, the pixel TFT 217 is driven by so-called "frame inversion driving" in which the polarity is reversed every frame display period such that a potential +V that is higher than the reference potential Vcom of the common electrode 222 and a potential −V that is lower than the reference potential Vcom of the common electrode 222 are supplied in alternating frame display periods through the pixel TFT 217 to the pixel electrode 218 (see FIG. 10). The frame rate is set at 60 fps, for example. If the potential +V of the pixel electrode 218 charged by the pixel TFT 217 is higher than the reference potential Vcom of the common electrode 222, then the resistive TFT 33 becomes reverse biased, and thus, only an amount of charge approximately equal to the leakage current flows between the source electrode 33*b* and the drain electrode 33*c*. In contrast, when the potential −V of the pixel electrode 218 charged by the pixel TFT 217 is lower than the reference potential Vcom of the common electrode 222, the resistive TFT 33 becomes forward biased, but the reference potential Vcom of the common electrode 222 is set so as not to exceed the threshold voltage of the resistive TFT 33, and thus, the amount of charge moving between the source electrode 33*b* and the drain electrode 33*c* is minuscule. In either case, the amount of charge flowing per unit time between the pixel electrode 218 and the common electrode 222 through the resistive TFT 33 is minuscule, and thus, the resistive TFT 33 provides effective resistance against the electric charge. Thus, there is a sufficient amount of time to when the potential of the pixel electrode 218 reaches the reference potential Vcom of the common electrode 222, which means that a situation in which the potential of the pixel electrode 218 instantaneously reaches the reference potential Vcom of the common electrode 222 can be avoided. As a result, during normal operation, this configuration is suitable for displaying images in the liquid crystal panel due to the potential of the pixel electrode 218 charged by the pixel TFT 217 being maintained over a certain period of time (one frame display period, for example), and as a result, a situation in which display quality for displayed images is reduced is avoided. Even if electric charge accumulates in the pixel electrode 218 not only due to charging of the pixel electrode 218 by the pixel TFT 217 but due to circumstances (such as static electricity) during manufacturing of the liquid crystal panel, for example, thereby resulting in a difference in potential between the pixel electrode 218 and the common electrode 222, it is possible for the pixel electrode 218 to reach the same potential as the common electrode 222 by the electric charge moving between the pixel electrode 218 and the common electrode 222 through the resistive TFT 33 in a manner similar to what was described above.

As described above, according to the present embodiment, in the resistive TFT 33 constituting the resistor, the drain electrode 33c is connected to the common electrode 222, and the gate electrode 33a and the source electrode 33b are connected to the pixel electrode 218. In this manner, if the potential of the pixel electrode 218 is greater than the reference potential of the common electrode 222, for example, then the resistive TFT 33 constituting the resistor is reverse biased, and thus, electric charge moves from the drain electrode 33c (common electrode 222) to the source electrode 33b (pixel electrode 218) set at the same potential as the gate electrode 33a. In contrast, if the potential of the pixel electrode 218 is less than the reference potential of the common electrode 222, for example, then the resistive TFT 33 constituting the resistor is forward biased, and thus, electric charge moves from the source electrode 33b (pixel electrode 218) to the drain electrode 33c (common electrode 222). In either case, the resistive TFT 33 provides resistance against the electric charge moving between the pixel electrode 218 and the common electrode 222, and thus, a sufficient amount of time can be attained to when the potential of the pixel electrode 218 reaches reference potential. In this manner, there is little risk of the display quality of the display screen being reduced when displaying images in the liquid crystal panel.

Embodiment 4

Embodiment 4 of the present invention will be described with reference to FIG. 16 or 17. In Embodiment 4, an arrangement is shown in which a plurality of the resistive TFTs 333 disclosed in Embodiment 3 are connected in series. Descriptions of structures, operations, and effects similar to those of Embodiment 3 will be omitted.

Figure 16:
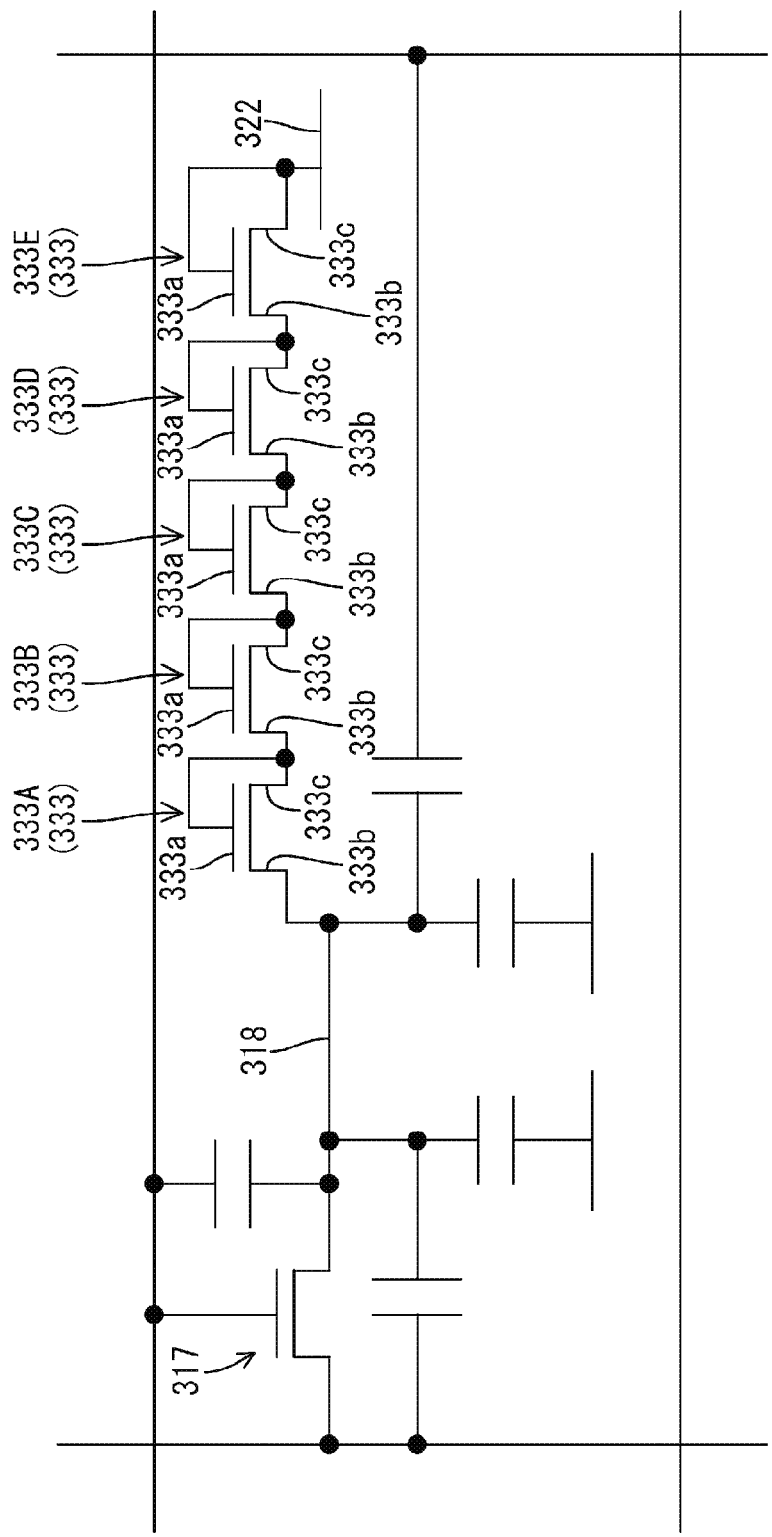
FIG. 16 is a circuit diagram showing a circuit configuration of a pixel in a display area of an array substrate according to Embodiment 4 of the present invention.
Figure 17:
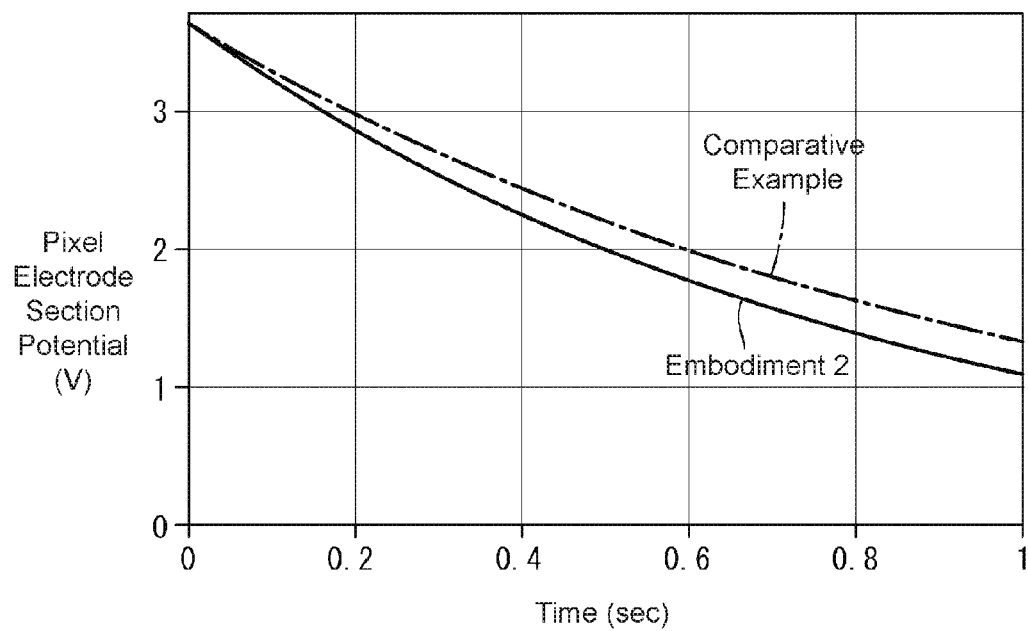
FIG. 17 is a graph showing the change over time of a voltage of a pixel electrode charged by a pixel TFT.

As shown in FIG. 16, the resistive TFTs 333 of the present embodiment are arranged between a pixel electrode 318 and a common electrode 322, and five such resistive TFTs 332 are connected to each other in series. Below, when distinguishing each of the five resistive TFTs 333, the resistive TFT 333 directly connected to the pixel electrode 318 is a first resistive TFT 333A, the second closest resistive TFT 333 to the pixel electrode 318 is a second resistive TFT 333B, the third closest resistive TFT 333 to the pixel electrode 318 is a third resistive TFT 333C, the fourth closest resistive TFT 333 to the pixel electrode 318 is a fourth resistive TFT 333D, and the resistive TFT 333 directly connected to the common electrode 322 is a fifth resistive TFT 333E. In the first resistive TFT 333A, the source electrode 333b is connected to the pixel electrode 318, whereas the gate electrode 333a and the drain electrode 333c are both connected to the source electrode 333b of the second resistive TFT 333B. The gate electrode 333a and the drain electrode 333c of the second resistive TFT 333B are connected to the source electrode 333b of the third resistive TFT 333C, the gate electrode 333a and the drain electrode 333c of the third resistive TFT 333C are connected to the source electrode 333b of the fourth resistive TFT 333D, and the gate electrode 333a the drain electrode 333c of the fourth resistive TFT 333D are connected to the source electrode 333b of the fifth resistive TFT 333E. The gate electrode 333a and the drain electrode 333c of the fifth resistive TFT 333E are both connected to the common electrode 322.

According to this configuration, when the pixel electrode 318 is charged by the pixel TFT 317 to a higher potential than the common electrode 322, for example, then electric charge moves from the source electrode 333b of the first resistive TFT 333A to the drain electrode 333c of the first resistive TFT 333A. At this time, the source electrode 333b of the second resistive TFT 333B is at the same potential as the gate electrode 333a and the drain electrode 333c of the first resistive TFT 333A, and thus, electric charge moves from the source electrode 333b of the second resistive TFT 333B to the drain electrode 333c of the second resistive TFT 333B. The electric charge that has moved to the drain electrode 333c of the second resistive TFT 333B similarly moves through the third resistive TFT 333C, the fourth resistive TFT 333D, and the fifth resistive TFT 333E to reach the common electrode 322. On the other hand, if the pixel electrode 318 is charged by the pixel TFT 317 and the pixel electrode 318 is at a lower potential than the common electrode 322, then conversely, the electric charge of the common electrode 322 passes through the fifth resistive TFT 333E, the fourth resistive TFT 333D, the third resistive TFT 333C, the second resistive TFT 333B, and the first resistive TFT 333A, in that order, to reach the pixel electrode 318. In this manner, the electric charge between the pixel electrode 318 and the common electrode 322 moves through five resistive TFTs 333, resulting in the pixel electrode 318 and the common electrode 322 reaching the same potential as each other after a prescribed period of time.

The following Comparison Experiment 2 was performed in order to attain knowledge of the effects attained by interposing the five resistive TFTs 333 connected to each other in series as described above between the pixel electrode 318 and the common electrode 322. In Comparison Experiment 2, a configuration in which the pixel electrode and the common electrode are not connected to each other (no resistor is present) is a comparison example, and a configuration as in the present embodiment in which the five resistive TFTs 333 are connected in series (see FIG. 16) is Working Example 2. In the comparison example and Working Example 2, the change over time of the potential in the pixel electrode was measured, the results of which are shown in FIG. 17. In FIG. 17, the vertical axis is the potential of the pixel electrode (with a unit of "V"), the horizontal axis is the time (with a unit of "sec") elapsed from when the pixel electrode was charged to a prescribed potential, and the solid line shown in the drawing indicates the results of the experiment of Working Example 2 with the one-dot-chain line indicating the results of the experiment of the comparison example. In Comparison Experiment 2, the potential of the pixel electrode is measured in the comparison example and Working Example 2 from when the pixel electrode is charged to approximately 3.6V to when approximately 1 sec has elapsed, for example.

The results of Comparison Experiment 2 will be described below. As shown in the graph of FIG. 17, when comparing the potentials of the pixel electrodes when the same amount of time has elapsed since the pixel electrodes were charged between the comparison example and Working Example 2, the potential in Working Example 2 is less than in the comparison example. When comparing the amount of time elapsed for the potential of the pixel electrode to become the same as common potential between the comparison example and Working Example 2, the amount of time is shorter for Working Example 2 than for the comparison example. In other words, it can be seen that the rate of decrease of potential in the pixel electrode is greater in Working Example 2 than in the comparison example. This is thought to be because, if a configuration is adopted in which the five resistive TFTs 333 connected in series to each other are interposed between the pixel electrode 318 and the common electrode 322 as in Working Example 2, then compared to the configuration of the comparison example in which the pixel electrode and the common electrode are not connected to each other, the potential of the pixel electrode 318 can approach the reference potential of the common electrode 322 in a shorter period of time because the electric charge moves directly between the pixel electrode 318 and the common electrode 322. When comparing the configuration of the five resistive TFTs 333 being connected in series to each other as in Working Example 2 to the configuration as in Embodiment 1 in which only one resistive TFT 33 is provided (see FIG. 13), the amount of electric charge moving per unit period of time between the pixel electrode 318 and the common electrode 322 is thought to be less for Working Example 3. Thus, it can be said that the five resistive TFTs 333 connected to each other in series as in Working Example 2 function as a greater resistance component than the one resistive TFT 33 in Embodiment 3. As a result, during normal operation, this configuration is more suitable for displaying images in the liquid crystal panel due to the potential of the pixel electrode 318 charged by the pixel TFT 317 being maintained over a certain period of time, and as a result, a situation in which display quality for displayed images is reduced is avoided.

Embodiment 5

Embodiment 5 of the present invention will be described with reference to FIGS. 18 to 20. In Embodiment 5, a configuration is shown in which two resistive TFTs 49 and 50 are connected to each other in series. Descriptions of structures, operations, and effects similar to those of Embodiments 1 and 3 will be omitted.

Figure 18:
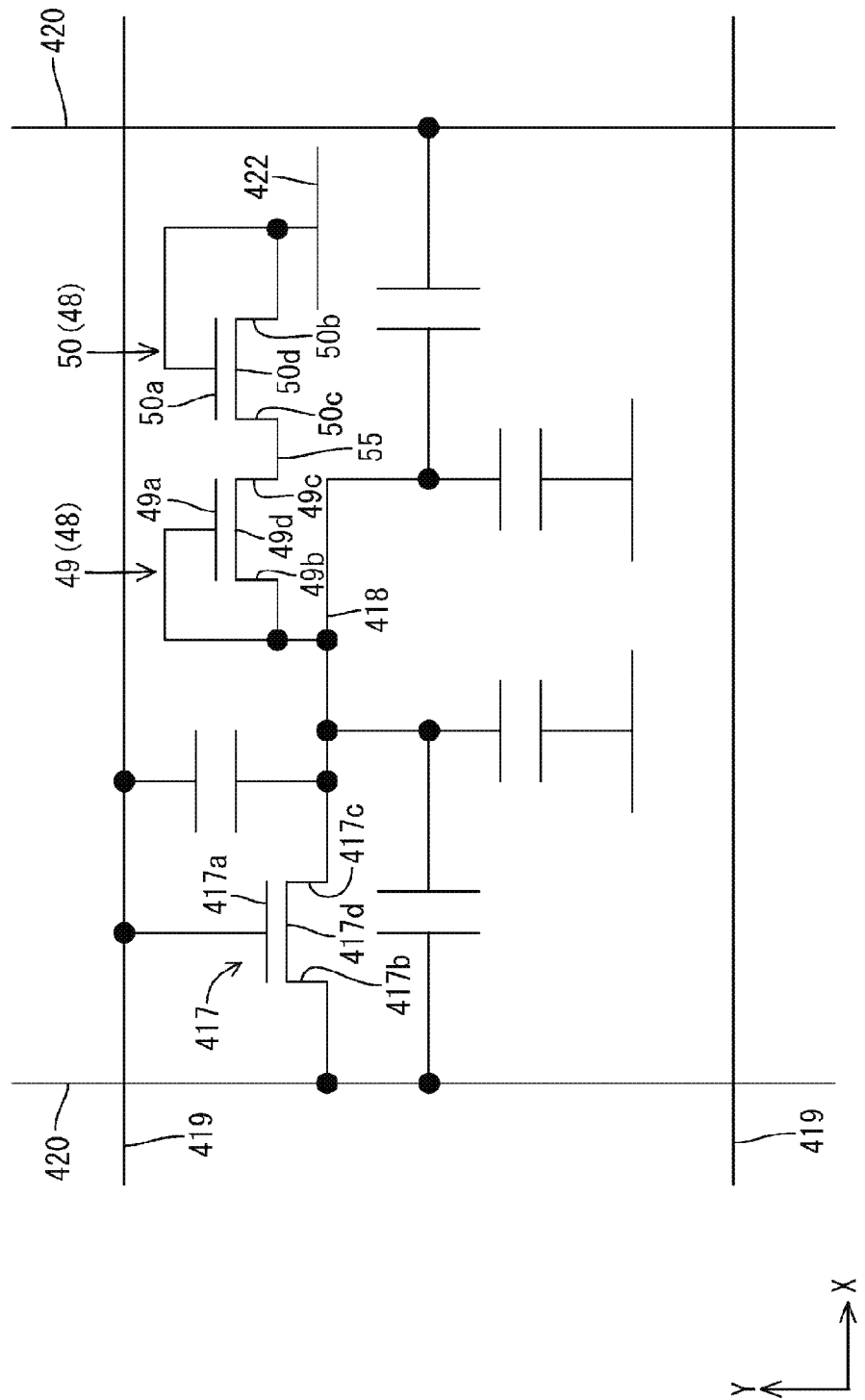
FIG. 18 is a circuit diagram showing a circuit configuration of a pixel in a display area of an array substrate according to Embodiment 5 of the present invention.

As shown in FIG. 18, a resistive TFT 48 (resistor) of the present embodiment includes a first resistive TFT 49 (first transistor) connected directly to a pixel electrode 418, and a second resistive TFT 50 (second transistor) connected directly to a common electrode 422, and the first resistive TFT 49 and the second resistive TFT 50 are connected to each other in series. The first resistive TFT 49 at least has a first gate electrode 49a, a first source electrode 49b, a first drain electrode 49c, and a first channel section 49d that connects the first source electrode 49b and the first drain electrode 49c, of which the first gate electrode 49a and the first source electrode 49b are connected to the pixel electrode 418. In contrast, the second resistive TFT 50 at least has a second gate electrode 50a, a second source electrode 50b, a second drain electrode 50c, and a second channel section 50d that connects the second source electrode 50b and the second drain electrode 50c, of which the second gate electrode 50a and the second source electrode 50b are connected to the common electrode 422. The first drain electrode 49c of the first resistive TFT 49 is directly connected to the second drain electrode 50c of the second resistive TFT 50. Thus, the first gate electrode 49a and the first source electrode 49b of the first resistive TFT 49 are set at the same potential as the pixel electrode 418, the second gate electrode 50a and the second source electrode 50b of the second resistive TFT 50 are set at the same potential as the common electrode 422, and the first drain electrode 49c of the first resistive TFT 49 is set to the same potential as the second drain electrode 50c of the second resistive TFT 50. In this manner, the first resistive TFT 49 and the second resistive TFT 50 both effectively function as diodes, and can be said to be "diode-type transistors."

Figure 19:
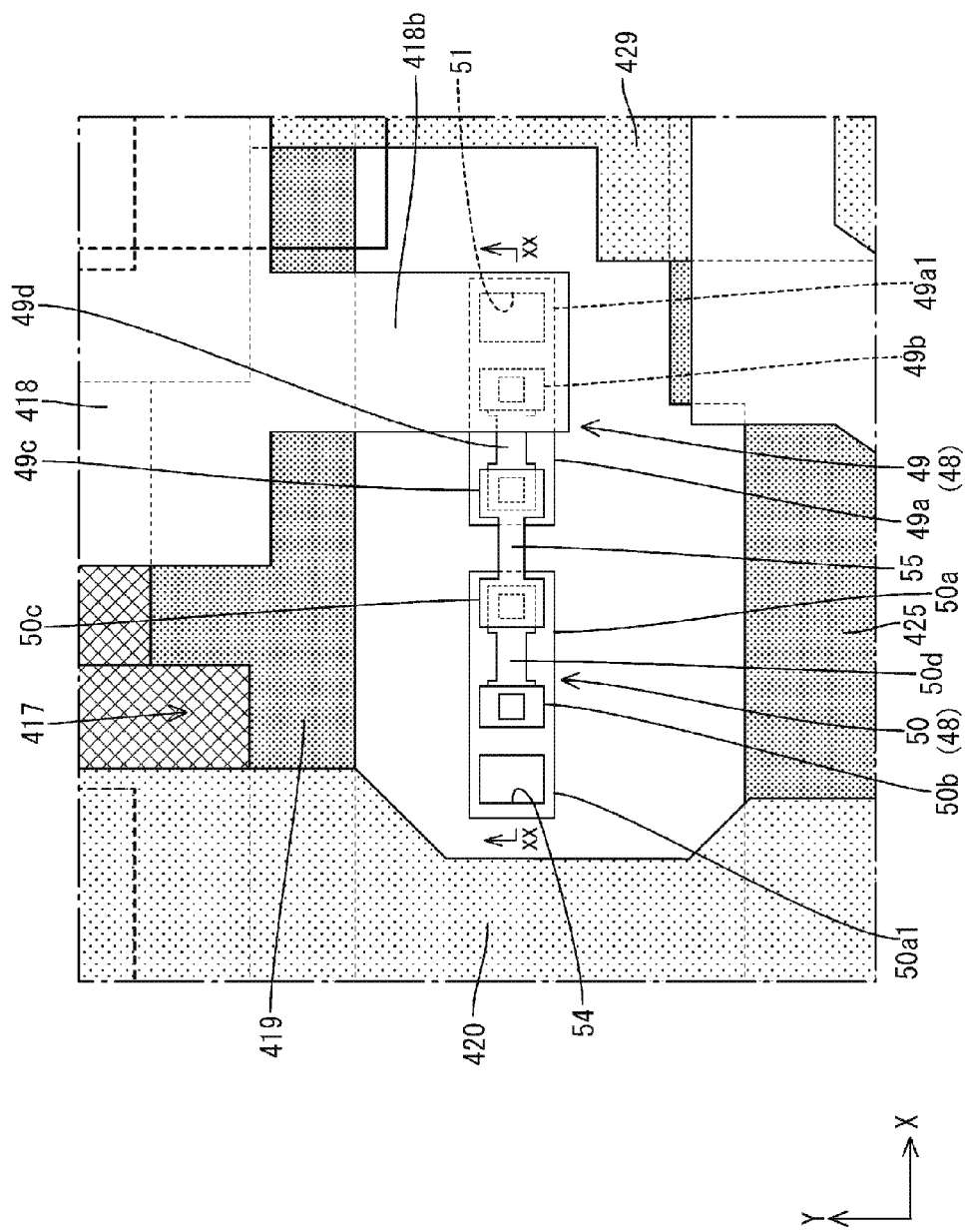
FIG. 19 is an expanded plan view of the area of a pixel TFT, a first resistive TFT, and a second resistive TFT in the display area of the array substrate.

As shown in FIG. 19, the first resistive TFT 49 and the second resistive TFT 50 are disposed adjacent to the pixel TFT 417 in a plan view, and more specifically, are disposed in a region surrounded by the gate wiring lines 419 connected to the pixel TFTs 417, the source wiring lines 420 connected to the pixel TFTs 417, the auxiliary capacitance wiring line 425 disposed on the side of the pixel TFT 417 opposite to where the pixel TFT 417 is connected to the pixel electrode 418, and the drain wiring line 429 connected to the pixel TFT 417. The first resistive TFT 49 and the second resistive TFT 50 are arranged such that the first drain electrode 49c and the second source electrode 50b are arranged adjacent to each other in the X axis direction in a plan view. In the first resistive TFT 49, the first gate electrode 49a completely overlaps the first source electrode 49b, the first drain electrode 49c, and the first channel section 49d in a plan view, and the first resistive TFT 49 is formed so as to have a first gate extension section 49a1 that extends to the side of the first source electrode 49b opposite to the first drain electrode 49c. The pixel electrode 418 has a pixel extension section 418b that overlaps in a plan view a portion of the first resistive TFT 49, and more specifically, the first source electrode 49b and the first gate extension section 49a1 of the first gate electrode 49a. On the other hand, in the second resistive TFT 50, the second gate electrode 50a completely overlaps the second source electrode 50b, the second drain electrode 50c, and the second channel section 50d in a plan view, and the second resistive TFT 50 is formed so as to have a second gate extension section 50a1 that extends to the side of the second source electrode 50b opposite to the second drain electrode 50c.

Figure 20:
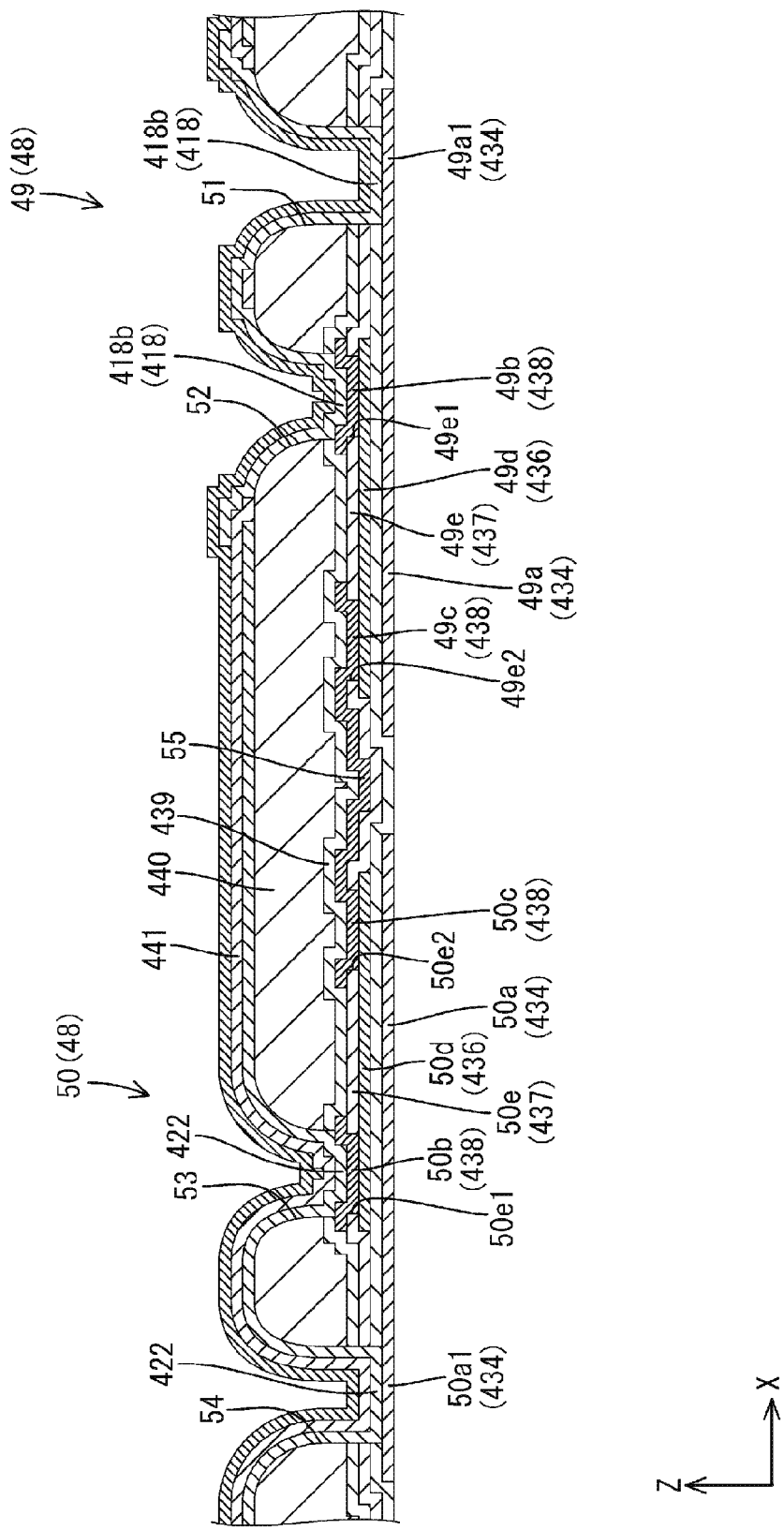
FIG. 20 is a cross-sectional view of FIG. 19 along the line xx-xx.

Specifically, as shown in FIGS. 19 and 20, the first resistive TFT 49 has: the first gate electrode 49a made of the first metal film 434; a first channel section 49d that is made of the semiconductor film 436 and overlaps the first gate electrode 49a in a plan view; a first protective section 49e that is made of the protective film 437, and in which two first openings 49e1 and 49e2 are formed in positions overlapping the first channel section 49d in a plan view; the first source electrode 49b that is made of the second metal film 438, and that is connected to the first channel section 49d through one first opening 49e1 of the two first openings 49e1 and 49e2; and the first drain electrode 49c that is made of the second metal film 438, and that is connected to the first channel section 49d through the other first opening 49e2 of the two first openings 49e1 and 49e2. Of these, the first gate electrode 49a is disposed so as to be separate (independent) from the gate wiring line 419 and the auxiliary capacitance wiring line 425. The first channel section 49d extends in the X axis direction and serves as a bridge between the first source electrode 49b and the first drain electrode 49c to allow electrons to move therebetween. The semiconductor film 436 forming the first channel section 49d is made of the same oxide semiconductor (In—Ga—Zn—O type semiconductor) as the pixel channel section 417d of the pixel TFT 417. In the first channel section 49d, where the X axis distance between the first source electrode 49b and the first drain electrode 49c is the channel length (length dimension), and where the dimension of the first channel section 49d along the Y axis direction, which intersects with the direction from the first source electrode 49b to the first drain electrode 49c (X axis direction), is the channel width (width dimension), the ratio (L/W) obtained by dividing the channel length by the channel width is set to be larger than the ratio obtained by dividing the channel length by the channel width for the pixel channel section 417d of the pixel TFT 417. Thus, the resistance on the electric charge moving between the first source electrode 49b and the first drain electrode 49c through the first channel section 49d is greater than the resistance on the electric charge moving between the pixel source electrode 417b and the pixel drain electrode 417c through the pixel channel section 417d of the pixel TFT 417. The first channel section 49d has a smaller channel length and width than that of the pixel channel section 417d.

Of the first interlayer insulating film 439, the organic insulating film 440, and the second interlayer insulating film 441 disposed below the pixel extension section 418b of the pixel electrode 418, a position overlapping the pixel extension section 418b and the gate extension section 49a1 in a plan view has formed therein a vertical first gate contact hole 51, as shown in FIG. 20, with the pixel extension section 418b being connected to the first gate electrode 49a through the first gate contact hole 51. Similarly, of the first interlayer insulating film 439, the organic insulating film 440, and the second interlayer insulating film 441 disposed below the pixel extension section 418b, a position overlapping the pixel extension section 418b and first source electrode 49b in a plan view has formed therein a vertical first source contact hole 52 with the pixel extension section 418b being connected to the pixel first source electrode 49b through the first source contact hole 52. The common electrode 422 has an opening formed so as to surround the first gate contact hole 51 and the first source contact hole 52.

In contrast, as shown in FIGS. 19 and 20, the second resistive TFT 50 has: the second gate electrode 50a made of the first metal film 434; a second channel section 50d that is made of the semiconductor film 436 and overlaps the second gate electrode 50a in a plan view; a second protective section 50e that is made of the protective film 437, and in which two second openings 50e1 and 50e2 are formed in positions overlapping the second channel section 50d in a plan view; the second source electrode 50, which is made of the second metal film 438 and is connected to the second channel section 50d through one second opening 50e1 of the two second openings 50e1 and 50e2; and the second drain electrode 50c, which is made of the second metal film 438 and is connected to the second channel section 50d through the other second opening 50e2 of the two second openings 50e1 and 50e2. Of these, the second gate electrode 50a is disposed so as to be separate (independent) from the gate wiring line 419 and the auxiliary capacitance wiring line 425. The second channel section 50d extends in the X axis direction and serves as a bridge between the second source electrode 50b and the second drain electrode 50c to allow electrons to move therebetween. The semiconductor film 436 forming the second channel section 50d is made of the same oxide semiconductor (In—Ga—Zn—O type semiconductor) as the pixel channel section 417d of the pixel TFT 417. In the second channel section 50d, where the X axis distance between the second source electrode 50b and the second drain electrode 50c is the channel length (length dimension), and where the dimension of the second channel section 50d along the Y axis direction, which intersects with the direction from the second source electrode 50b to the second drain electrode 50c (X axis direction), is the channel width (width dimension), the ratio (L/W) obtained by dividing the channel length by the channel width is set to be larger than the ratio obtained by dividing the channel length by the channel width for the pixel channel section 417d of the pixel TFT 417. Thus, the resistance on the electric charge moving between the second source electrode 50b and the second drain electrode 50c through the second channel section 50d is greater than the resistance on the electric charge moving between the pixel source electrode 417b and the pixel drain electrode 417c through the pixel channel section 417d of the pixel TFT 417. The second channel section 50d has a smaller channel length and width than that of the pixel channel section 417d. The second channel section 50d and the first channel section 49d are the same in terms of material, channel length, and channel width, and thus, the resistance values against the electric charge moving through the respective channel sections 49d and 50d are substantially the same.

As shown in FIG. 20, of the first interlayer insulating film 439 and the organic insulating film 440 disposed below the common electrode 422, a position overlapping the common electrode 422 and the second gate extension section 50a1 in a plan view has formed therein a vertical second gate contact hole 53 with the common electrode 422 being connected to the second gate electrode 50a through the second gate contact hole 53. Similarly, of the first interlayer insulating film 439 and the organic insulating film 440 disposed below the common electrode 422, a position overlapping the common electrode 422 and the second source electrode 50b in a plan view has formed therein a vertical second source contact hole 54 with the common electrode 442 being connected to the second source electrode 50b through the second source contact hole 54. An inter-TFT connecting wiring line 55 is formed so as to connect the second drain electrode 50c and the first drain electrode 49c. The inter-TFT connecting wiring line 55 is made of the same second metal film 438 as the first drain electrode 49c and the second drain electrode 50c. The inter-TFT connecting wiring line 55 extends substantially straight along the X axis direction so as to connect the first drain electrode 49c and the second drain electrode 50c, thereby bridging the first resistive TFT 49 and the second resistive TFT 50.

According to the configuration above, if the pixel electrode 418 is charged by the pixel TFT 417, for example, then as shown in FIG. 18, a difference in potential occurs between the first gate electrode 49a and first source electrode 49b of the first resistive TFT 49, which are set to the same potential as the pixel electrode 418, and second gate electrode 50a and second source electrode 50b of the second resistive TFT 50, which are set at the same potential as the common electrode 422. Thus, the first resistive TFT 49 and the second resistive TFT 50 in effect function as diodes, and are configured such that current flows (electric charge moves) between the first source electrode 49b and the first drain electrode 49c through the first channel section 49d, and current flows between the second source electrode 50b and the second drain electrode 50c through the second channel section 50d. Thus, electric charge moves between the pixel electrode 418 and the common electrode 422, resulting in the pixel electrode 418 and the common electrode 422 eventually being at the same potential. As a result, burn-in, flickering, or the like is mitigated in the display screen without performing a special control process.

To explain the driving method for the pixel TFT 417, when the pixel TFT 417 is turned ON as a result of a scan signal supplied through the gate wiring line 419 to the pixel gate electrode 417a at a prescribed timing, a data signal supplied to the pixel source electrode 417b through the source wiring line 420 is transmitted through the pixel channel section 417d to the pixel drain electrode 417c. In contrast, the reference potential Vcom supplied to the common electrode 422 remains constant. At this time, the pixel TFT 417 is driven by the so-called "frame inversion driving" in which the polarity is reversed every frame display period such that a potential +V that is higher than the reference potential Vcom of the common electrode 422 and a potential −V that is lower than the reference potential Vcom of the common electrode 422 are supplied in alternating frame display periods through the pixel TFT 417 to the pixel electrode 418 (see FIG. 10). The frame rate is set at 60 fps, for example. When the potential +V of the pixel electrode 418 charged by the pixel TFT 417 is higher than the reference potential Vcom of the common electrode 422, the first resistive TFT 49 becomes forward biased, but the potential +V of the pixel electrode 418 is set so as not to exceed the threshold voltage of the first resistive TFT 49, and thus, the amount of charge moving between the first source electrode 49b and the first drain electrode 49c is minuscule. On the other hand, if the potential +V of the pixel electrode 418 is higher than the reference potential Vcom of the common electrode 422, then the second resistive TFT 50 becomes reverse biased, and thus, only an amount of charge approximately equal to the leakage current flows between the second source electrode 50b and the second drain electrode 50c. In contrast, if the potential −V of the pixel electrode 418 charged by the pixel TFT 417 is lower than the reference potential Vcom of the common electrode 422, then the first resistive TFT 49 becomes reverse biased, and thus, only an amount of charge approximately equal to the leakage current flows between the first source electrode 49b and the first drain electrode 49c. On the other hand, when the potential −V of the pixel electrode 418 is lower than the reference potential Vcom of the common electrode 422, the second resistive TFT 50 becomes forward biased, but the reference potential Vcom of the common electrode 422 is set so as not to exceed the threshold voltage of the second resistive TFT 50, and thus, the amount of charge moving between the second source electrode 50b and the second drain electrode 50c is minuscule.

As described above, whether the potential +V of the pixel electrode 418 is higher than the reference potential Vcom of the common electrode 422 or the potential −V of the pixel electrode 418 is lower than the reference potential Vcom of the common electrode 422, the first resistive TFT 49 or the second resistive TFT 50 becomes forward biased, with the other being reverse biased. Whichever of the first resistive TFT 49 and the second resistive TFT 50 is reverse biased has a greater resistance component against electric charge compared to whichever is forward biased. Thus, when performing frame inversion driving, there is always a reverse biased resistive TFT 49 or 50, allowing for a greater period of time until the potential of the pixel electrode 418 reaches the reference potential Vcom of the common electrode 422, and allowing prevention to a greater extent of a situation in which the potential of the pixel electrode 418 instantaneously reaches the reference potential Vcom of the common electrode 422. As a result, during normal operation, this configuration is suitable for displaying images in the liquid crystal panel due to the potential of the pixel electrode 418 charged by the pixel TFT 417 being maintained over a certain period of time (one frame display period, for example), and as a result, a situation in which display quality for displayed images is reduced is avoided. Furthermore, by having both forward biased and reversed biased resistive TFTs 49 and 50 when performing field inversion driving, the resistance against the electric charge moving between the pixel electrode 418 and the common electrode 422 can be maintained at a substantially constant value. Thus, the time until the potential of the pixel electrode 418 reaches the reference potential Vcom of the common electrode 422 becomes constant, allowing for the period over which the pixel electrode 418 keeps its electric potential to be kept constant. Even if electric charge accumulates in the pixel electrode 418 not only due to charging of the pixel electrode 418 by the pixel TFT 417 but due to circumstances (such as static electricity) during manufacturing of the liquid crystal panel, for example, resulting in a difference in potential between the pixel electrode 418 and the common electrode 422, it is possible for the pixel electrode 418 to reach the same potential as the common electrode 422 by the electric charge moving between the pixel electrode 418 and the common electrode 422 through the first resistive TFT 49 and the second resistive TFT 50 in a manner similar to what was described above.

As described above, according to the present embodiment, the resistive TFT 48 constituting a resistor includes: the first resistive TFT 49, which has at least the first gate electrode 49a, the first source electrode 49b, the first drain electrode 49c, and the first channel section 49d connecting the first source electrode 49b and the first drain electrode 49c, the first gate electrode 49a and the first source electrode 49b being respectively connected to the pixel electrode 418; and the second resistive TFT 50, which has at least the second gate electrode 50a, the second source electrode 50b, the second drain electrode 50c, and the second channel section 50d connecting the second source electrode 50b and the second drain electrode 50c, the second gate electrode 50a and the second source electrode 50b being respectively connected to the common electrode 422, the second drain electrode 50c being connected to the first drain electrode 49c. In this manner, if the potential of the pixel electrode 418 is greater than the reference potential of the common electrode 422, for example, then while the first resistive TFT 49 is forward biased, the second resistive TFT 50 is reverse biased, and after the electric charge of the pixel electrode 418 moves from the first source electrode 49b set at the same potential as the first gate electrode 49a to the first drain electrode 49c, the electric charge moves from the second drain electrode 50c to the second source electrode 50b, which is set at the same potential as the second gate electrode 50a, thereby reaching the common electrode 422. In contrast, if the potential of the pixel electrode 418 is less than the reference potential of the common electrode 422, for example, then while the second resistive TFT 50 is forward biased, the first resistive TFT 49 is reverse biased, and after the electric charge of the common electrode 422 moves from the second source electrode 50b set at the same potential as the second gate electrode 50a to the second drain electrode 50c, the electric charge moves from the first drain electrode 49c to the first source electrode 49b, which is set at the same potential as the first gate electrode 49a, thereby reaching the pixel electrode 418. In either case, at least one of the first resistive TFT 49 and the second resistive TFT 50 is reverse biased, and thus, only an amount of charge approximately equal to the leakage current of the resistive TFTs 49 and 50 flows, and thus, the amount of electric charge moving is miniscule. Thus, it is possible to attain a greater amount of time to when the potential of the pixel electrode 418 reaches reference potential, and as a result, the likelihood of display quality of the display screen deteriorating for when images are displayed in the liquid crystal panel is further reduced. Furthermore, regardless of whether the potential charged to the pixel electrode 418 by the pixel TFT 417 is higher or lower than the reference potential, the time until the potential of the pixel electrode 418 reaches reference potential as a result of the resistive TFTs 49 and 50 is the same, and thus, it is possible to keep constant the period over which the potential is retained in the pixel electrode 418.

Embodiment 6

Embodiment 6 of the present invention will be described with reference to FIGS. 21 and 22. In Embodiment 6, an arrangement is shown in which a plurality respectively of the first resistive TFTs 549 and the second resistive TFTs 550 disclosed in Embodiment 5 are connected in series. Descriptions of structures, operations, and effects similar to those of Embodiments 2, 4, and 5 will be omitted.

Figure 21:
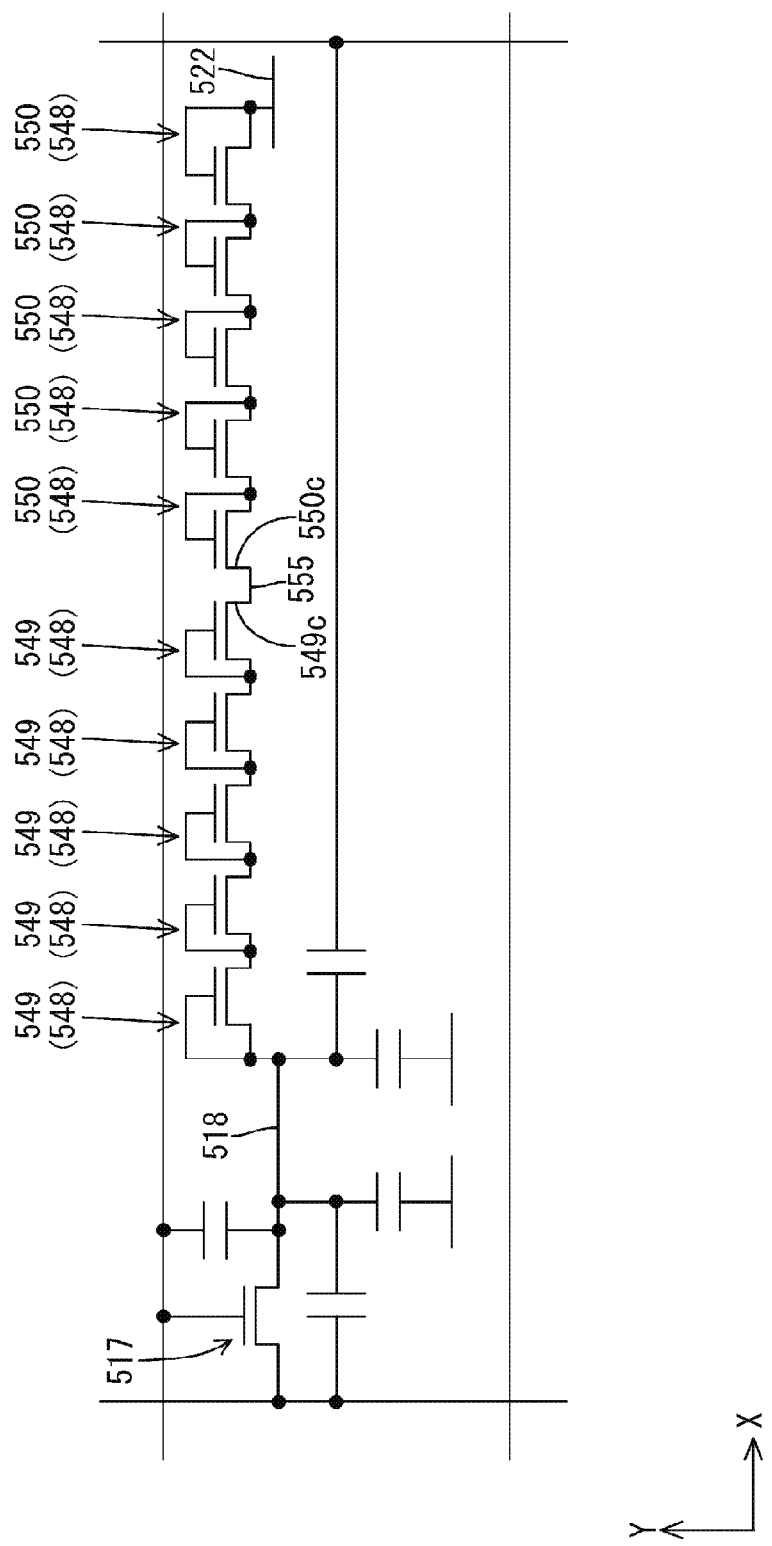
FIG. 21 is a circuit diagram showing a circuit configuration of a pixel in a display area of an array substrate according to Embodiment 6 of the present invention.
Figure 22:
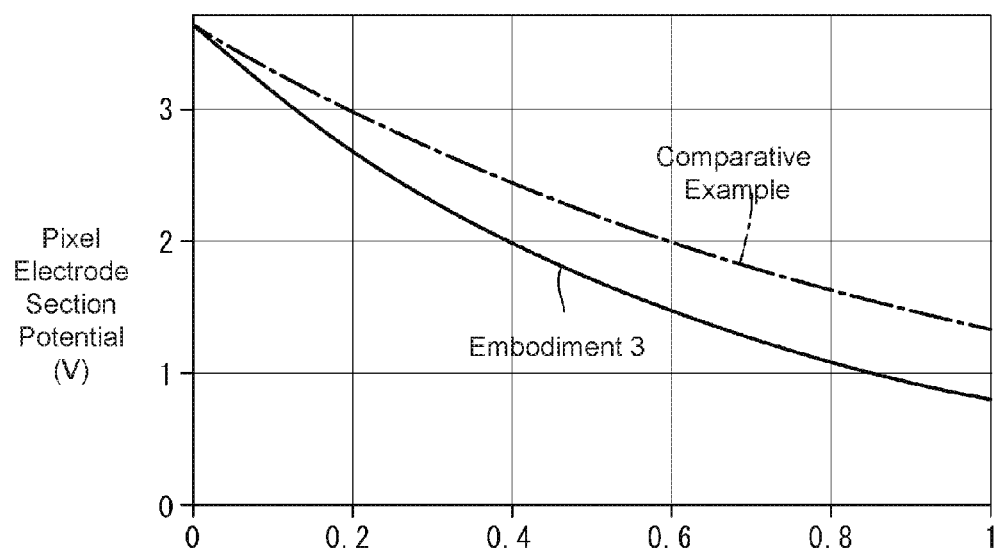
FIG. 22 is a graph showing the change over time of a voltage of a pixel electrode charged by a pixel TFT.

As shown in FIG. 21, the resistive TFT 548 of the present embodiment is interposed between the pixel electrode 518 and the common electrode 522, and includes five first resistive TFTs 549 connected to each other in series, and five second resistive TFTs 550 connected to each other in series. Of these, the connective configuration of the five first resistive TFTs 549 is substantially the same as the connective configuration of the five resistive TFTs 132 of Embodiment 2 (see FIG. 11), and the connective configuration of the five second resistive TFTs 550 is substantially the same as the connective configuration of the five resistive TFTs 333 of Embodiment 4 (see FIG. 16), and thus, redundant explanations thereof will be omitted. A first drain electrode 549c of the first resistive TFT 549 disposed on the end opposite to the pixel electrode 518 among the five first resistive TFTs 549 is connected by an inter-TFT connecting wiring line 555 to a second drain electrode 550c of the second resistive TFT 550 disposed on the end opposite to the common electrode 522 among the five second resistive TFTs 550.

With such a configuration, if the pixel electrode 518 is charged by the pixel TFT 517 to be at a higher potential than the common electrode 522, for example, then the five first resistive TFTs 549 all become forward biased whereas the five second resistive TFTs 550 all become reverse biased, and the electric charge present in the pixel electrode 518 moves through the five first resistive TFTs 549 and then the five second resistive TFTs 550, after which it moves to the common electrode 522. As a result, the potential of the pixel electrode 518 reaches the reference potential of the common electrode 522 after a prescribed period of time has elapsed. On the other hand, if the pixel electrode 518 is charged by the pixel TFT 517 to be at a lower potential than the common electrode 522, for example, then a scenario opposite to that described above occurs in which the five first resistive TFTs 549 all become reverse biased whereas the five second resistive TFTs 550 all become forward biased, and the electric charge present in the common electrode 522 moves through the five second resistive TFTs 550 and then the five first resistive TFTs 549, after which it moves to the pixel electrode 518. As a result, the potential of the pixel electrode 518 reaches the reference potential of the common electrode 522 after a prescribed period of time has elapsed.

The following Comparison Experiment 3 was performed in order to attain knowledge of the effects attained by interposing the five first resistive TFTs 549 and five second resistive TFTs 550 connected to each other in series as described above between the pixel electrode 518 and the common electrode 522. In Comparison Experiment 3, a configuration in which the pixel electrode and the common electrode are not connected to each other (no resistor is present) is a comparison example, and a configuration as in the present embodiment in which the five first resistive TFTs 549 and five second resistive TFTs 550 are connected in series (see FIG. 21) is Working Example 3. In the comparison example and Working Example 3, the change over time of the potential in the pixel electrode was measured, the results of which are shown in FIG. 22. In FIG. 22, the vertical axis is the potential of the pixel electrode (with a unit of "V"), the horizontal axis is the time (with a unit of "sec") elapsed from when the pixel electrode was charged to a prescribed potential, and the solid line shown in the drawing indicates the results of the experiment of Working Example 3 with the one-dot-chain line indicating the results of the experiment of the comparison example. In Comparison Experiment 3, the potential of the pixel electrode is measured in the comparison example and Working Example 3 from when the pixel electrode is charged to approximately 3.6V to when approximately 1 sec has elapsed, for example.

The results of Comparison Experiment 3 will be described below. As shown in the graph of FIG. 22, when comparing the potentials of the pixel electrodes when the same amount of time has elapsed since the pixel electrodes were charged between the comparison example and Working Example 3, the potential in Working Example 3 is less than in the comparison example. When comparing the amount of time elapsed for the potential of the pixel electrode to become the same as common potential between the comparison example and Working Example 3, the amount of time is shorter for Working Example 3 than for the comparison example. In other words, it can be seen that the rate of decrease of potential in the pixel electrode is greater in Working Example 3 than in the comparison example. This is thought to be because, if a configuration is adopted in which the five first resistive TFTs 549 and five second resistive TFTs 550 connected in series to each other are interposed between the pixel electrode 518 and the common electrode 522 as in Working Example 3, then compared to the configuration of the comparison example in which the pixel electrode and the common electrode are not connected to each other, the potential of the pixel electrode 518 can approach the reference potential of the common electrode 522 in a shorter period of time because the electric charge moves directly between the pixel electrode 518 and the common electrode 522. When comparing the configuration of the five first resistive TFTs 549 and five second resistive TFTs 550 being connected in series to each other as in Working Example 3 to the configuration as in Embodiment 5 in which only one first resistive TFT 49 and one second resistive TFT 50 are disposed (see FIG. 18), the amount of electric charge moving per unit period of time between the pixel electrode 518 and the common electrode 522 is thought to be less for Working Example 3. Thus, it can be said that the five first resistive TFTs 549 and five second resistive TFTs 550 connected to each other in series as in Working Example 3 function as a greater resistance component than the one first resistive TFT 49 and one second resistive TFT 50 in Embodiment 5. As a result, during normal operation, this configuration is more suitable for displaying images in the liquid crystal panel due to the potential of the pixel electrode 518 charged by the pixel TFT 517 being maintained over a certain period of time, and as a result, a situation in which display quality for displayed images is reduced is avoided.

Embodiment 7

Embodiment 7 of the present invention will be described with reference to FIGS. 23 to 26. In Embodiment 7, a resistive wiring line 56 is provided as the resistor. Descriptions of structures, operations, and effects similar to those of Embodiment 1 will be omitted.

Figure 23:
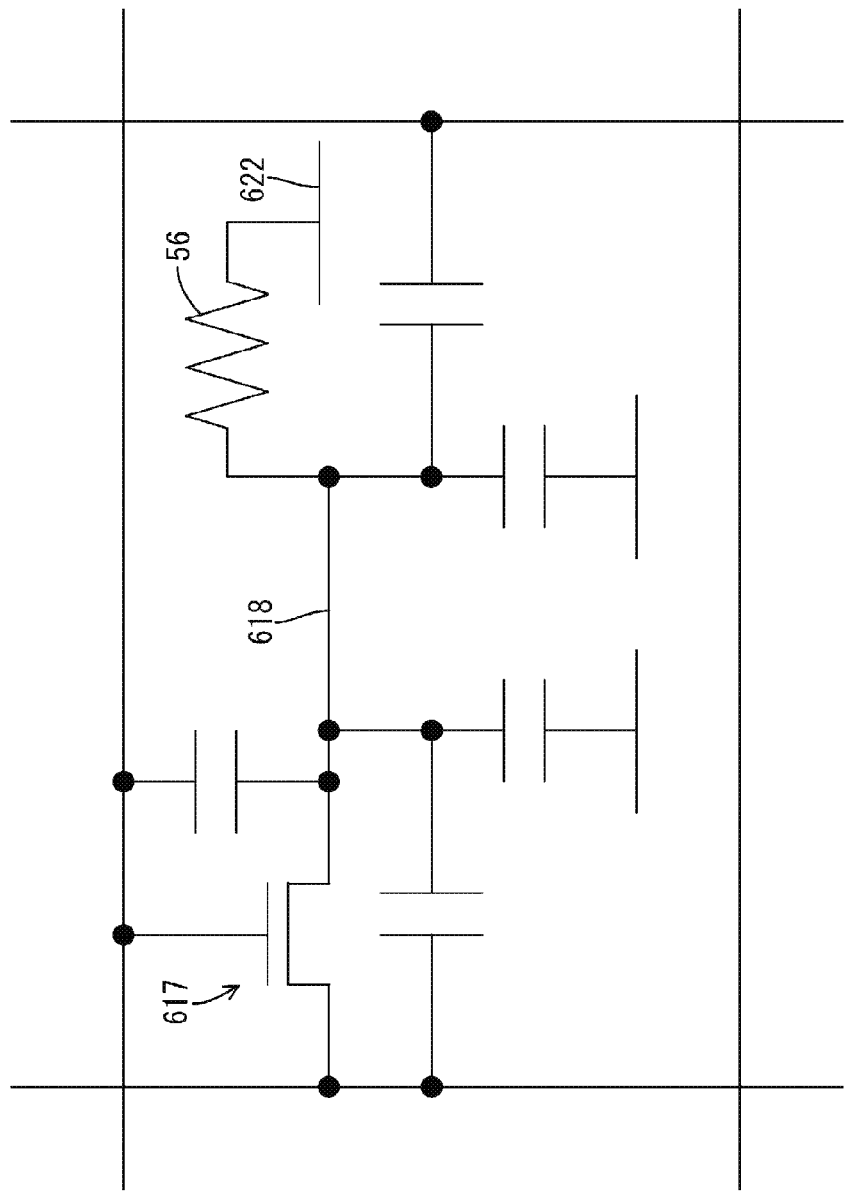
FIG. 23 is a circuit diagram showing a circuit configuration of a pixel in a display area of an array substrate according to Embodiment 7 of the present invention.
Figure 24:
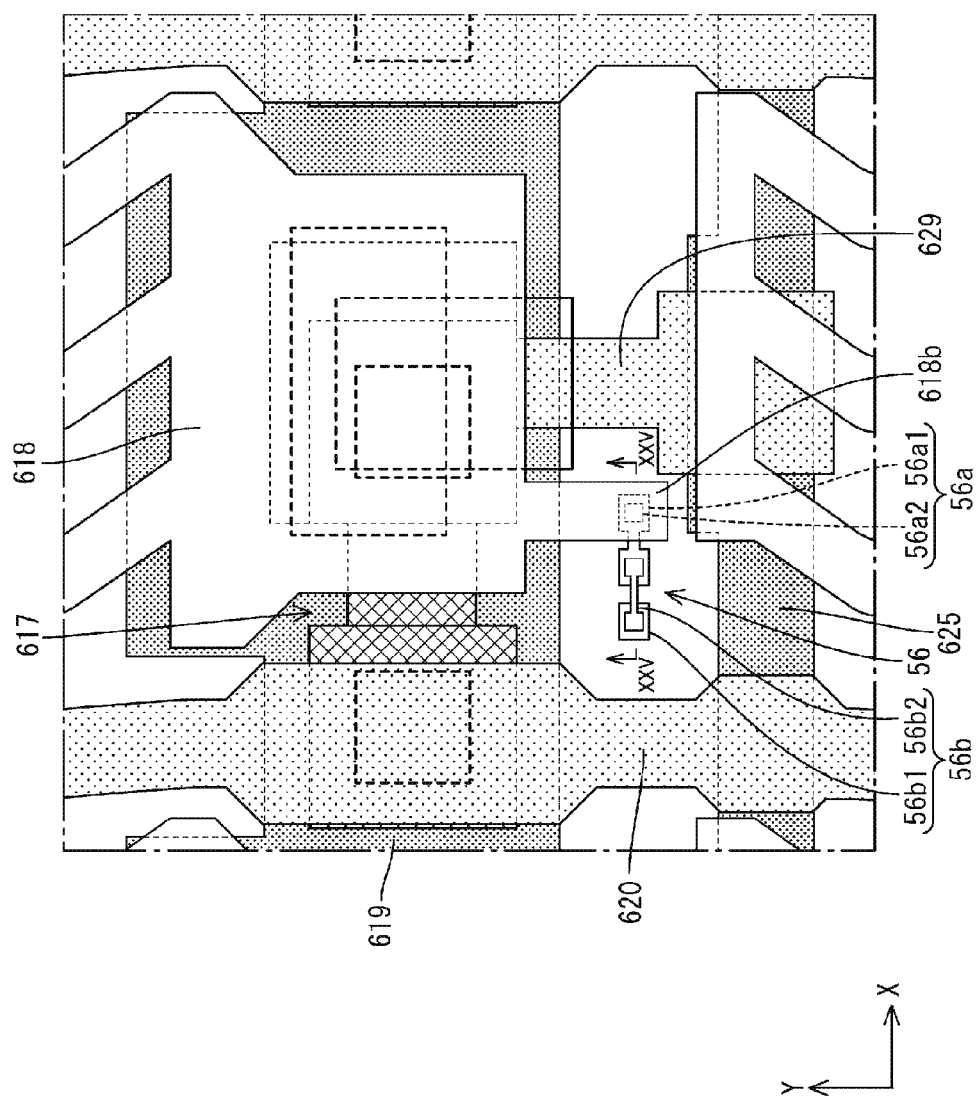
FIG. 24 is an expanded plan view of the area of a pixel TFT and resistive wiring line in the display area of the array substrate.

As shown in FIG. 23, the resistor of the present embodiment is a resistive wiring line 56 (wiring line) drawn between the pixel electrode 618 and the common electrode 622 and connected to both. Specifically, as shown in FIG. 24, the resistive wiring line 56 has a first wiring line section 56*a* connected to the pixel electrode 618 and a second wiring line section 56*b* connected to the common electrode 622, and the ends of the first wiring line section 56*a* and the second wiring line section 56*b* are connected to each other. The resistive wiring line 56 is disposed adjacent to the pixel TFT 617 in a plan view, and more specifically, is disposed in a region surrounded by the gate wiring lines 619 connected to the pixel TFTs 617, the source wiring lines 620 connected to the pixel TFTs 617, the auxiliary capacitance wiring line 625 disposed on the side of the pixel TFT 617 opposite to where the pixel TFT 617 is connected to the pixel electrode 618, and the drain wiring line 629 connected to the pixel TFT 617. The pixel electrode 618 has a pixel extension section 618*b* that overlaps in a plan view a portion of the resistive wiring line 56, and more specifically, an end of the first wiring line section 56*a*.

Figure 25:
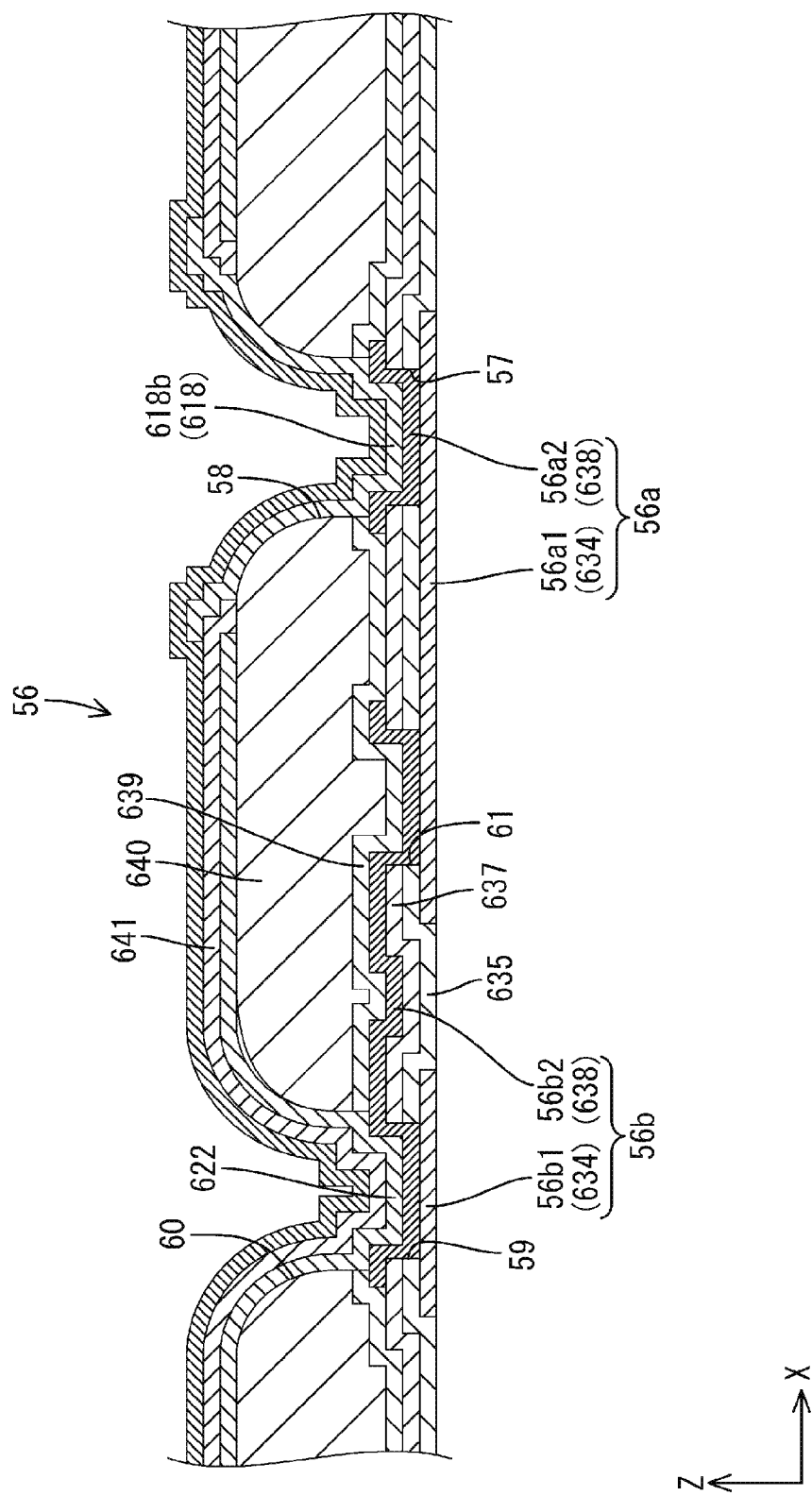
FIG. 25 is a cross-sectional view of FIG. 24 along the line xxv-xxv.

As shown in FIGS. 24 and 25, the first wiring line section 56*a* is constituted by a first lower layer wiring line section 56*a*1 made of a first metal film 634 and a first upper layer wiring line section 56*a*2 made of a second metal film 638. Of these, the first lower layer wiring line section 56*a*1 extends linearly in the X axis direction, and the first upper layer wiring line section 56*a*2 having an island shape is layered onto the first lower layer wiring line section 56*a*1 so as to overlap in a plan view one end of the first lower layer wiring line section 56*a*1 (end on the side opposite to the second wiring line section 56*b*). A gate insulation film 635 and a protective film 637 disposed over the first lower layer wiring line section 56*a*1 have a first lower layer contact hole 57 formed vertically therein to connect the first lower layer wiring line section 56*a*1 to the first upper layer wiring line section 56*a*2. Also, a first gate insulation film 639 and a protective film 640 disposed over the first lower layer wiring line section 56*a*2 have a first upper layer contact hole 58 formed vertically therein to connect the common electrode 622 to the first upper layer wiring line section 56*a*2. In contrast, the second wiring line section 56*b* is constituted by a second lower layer wiring line section 56*b*1 made of the first metal film 634 and a second upper layer wiring line section 56*b*2 made of the second metal film 638. Of these, the second upper layer wiring line section 56*b*2 extends linearly in the X axis direction, and the second lower layer wiring line section 56*b*1 having an island shape is layered below the second upper layer wiring line section 56*b*2 so as to overlap in a plan view one end of the second upper layer wiring line section 56*b*2 (end on the side opposite to the first wiring line section 56*a*). The gate insulation film 635 and the protective film 637 disposed over the second lower layer wiring line section 56*b*1 have a second lower layer contact hole 59 formed vertically therein to connect the second lower layer wiring line section 56*b*1 to the second upper layer wiring line section 56*b*2. Also, a first interlayer insulating film 639, an organic insulating film 640, and a second interlayer insulating film 641 disposed over the second upper layer wiring line section 56*b*2 have a second upper layer contact hole 60 formed vertically therein to connect the pixel extension section 618*b* of the pixel electrode 618 to the second upper layer wiring line section 56*b*2. Additionally, the other end of the first lower layer wiring line section 56*a*1 of the first wiring line section 56*a* (towards the second wiring line section 56*b*) and the other end of the second upper layer wiring line section 56*b*2 of the second wiring line section 56*b* (towards the first wiring line section 56*a*) are arranged so as to overlap in a plan view, and the portion of the gate insulating film 635 and the protective film 637 formed in this overlapping area has formed vertically therein a wiring line connecting contact hole 61 for connecting the first lower layer wiring line section 56*a*1 and the second upper layer wiring line section 56*b*2.

By the configuration above, the pixel electrode 618 and the common electrode 622 are electrically connected to each other through the resistive wiring line 56. Thus, if the pixel electrode 618 is charged by the pixel TFT 617, for example, then as shown in FIG. 23, an electric charge moves between the pixel electrode 618 and the common electrode 622 through the resistive wiring line 56. The resistive wiring line 56 through which electric charge flows has the first wiring line section 56*a* and the second wiring line section 56*b*, which both extend in the X axis direction, and the first wiring line section 56*a* and the second wiring line section 56*b* are connected to each other through the wiring line connecting contact hole 61. Thus, the resistive wiring line 56 provides a resistance component against the electric charge moving between the pixel electrode 618 and the common electrode 622. In this manner, the amount of electric charge moving per unit time between the pixel electrode 618 and the common electrode 622 becomes small, and thus, it is possible to suitably avoid a situation in which the potential of the pixel electrode 618 instantaneously reaches the reference potential of the common electrode 622. As a result, during normal operation, this configuration is suitable for displaying images in the liquid crystal panel due to the potential of the pixel electrode 618 charged by the pixel TFT 617 being maintained over a certain period of time (one frame display period, for example), and as a result, a situation in which display quality for displayed images is reduced is avoided. The specific resistance of the resistive wiring line 56 can be set within a range of a few dozen SΩ to a few hundred TΩ, and is set to approximately 1 TΩ in the present embodiment, for example.

Figure 26:
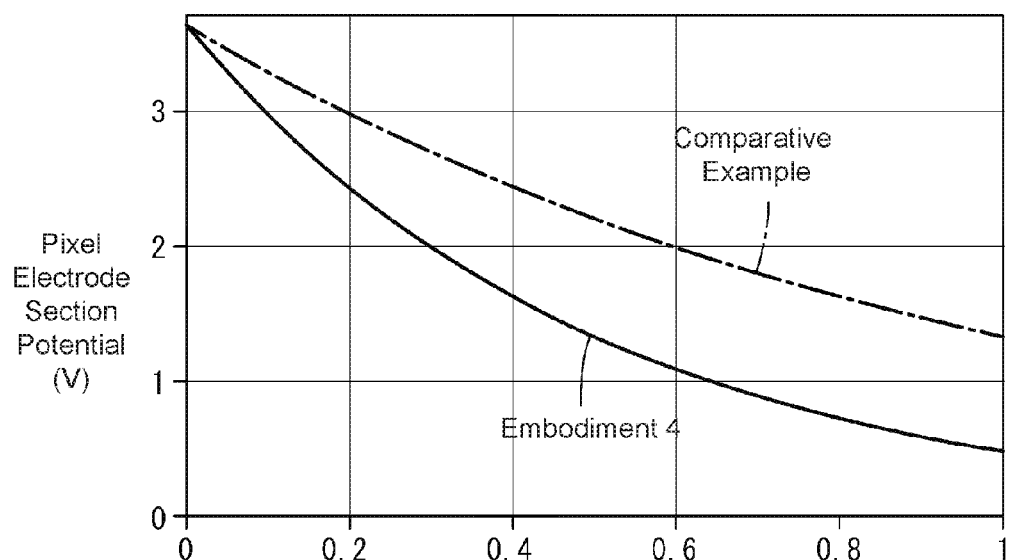
FIG. 26 is a graph showing the change over time of a voltage of a pixel electrode charged by a pixel TFT.

The following Comparison Experiment 4 was performed in order to attain knowledge of the effects attained by interposing the resistive wiring line 56 between the pixel electrode 618 and the common electrode 622 as described above. In Comparison Experiment 4, a configuration in which the pixel electrode and the common electrode are not connected to each other (no resistor is present) is a comparison example, and a configuration as in the present embodiment in which the resistive wiring line 56 is interposed between the pixel electrode 618 and the common electrode 622 (see FIG. 23) is Working Example 4. In the comparison example and Working Example 4, the change over time of the potential in the pixel electrode was measured, the results of which are shown in FIG. 26. In FIG. 26, the vertical axis is the potential of the pixel electrode (with a unit of "V"), the horizontal axis is the time (with a unit of "sec") elapsed from when the pixel electrode was charged to a prescribed potential, and the solid line shown in the drawing indicates the results of the experiment of Working Example 4 with the one-dot-chain line indicating the results of the experiment of the comparison example. In Comparison Experiment 4, the potential of the pixel electrode is measured in the comparison example and Working Example 4 from when the pixel electrode is charged to approximately 3.6V to when approximately 1 sec has elapsed, for example.

The results of Comparison Experiment 4 will be described below. As shown in the graph of FIG. 26, when comparing the potentials of the pixel electrodes when the same amount of time has elapsed since the pixel electrodes were charged between the comparison example and Working Example 4, the potential in Working Example 4 is less than in the comparison example. When comparing the amount of time elapsed for the potential of the pixel electrode to become the same as common potential between the comparison example and Working Example 4, the amount of time is shorter for Working Example 4 than for the comparison example. In other words, it can be seen that the rate of decrease of potential in the pixel electrode is greater in Working Example 4 than in the comparison example. This is thought to be because, if a configuration is adopted in which the resistive wiring line 56 is interposed between the pixel electrode 618 and the common electrode 622 as in Working Example 4, then compared to the configuration of the comparison example in which the pixel electrode and the common electrode are not connected to each other, the potential of the pixel electrode 618 can approach the reference potential of the common electrode 622 in a shorter period of time because the electric charge moves directly between the pixel electrode 618 and the common electrode 622.

According to the present embodiment described above, the resistor includes the resistive wiring line 56 (wiring line) extending between the pixel electrode 618 and the common electrode 622. In this manner, the resistive wiring line 56 extending between the pixel electrode 618 and the common electrode 622 is included in the resistor, and as a result, the time it takes for the potential charged to the pixel electrode 618 by the pixel TFT 617 to reach reference potential due to the wiring line is the same whether the potential of the pixel electrode 618 is higher or lower than the reference potential. In this manner, the time over which the potential is retained in the pixel electrode 618 can be kept constant.

Embodiment 8

Embodiment 8 of the present invention will be described with reference to FIGS. 27 to 29. In Embodiment 8, a configuration is described in which a resistive TFT 732 similar to what was disclosed in Embodiment 1 above is interposed between a pixel electrode 718 and an auxiliary capacitance wiring line 725. Descriptions of structures, operations, and effects similar to those of Embodiment 1 will be omitted.

Figure 27:
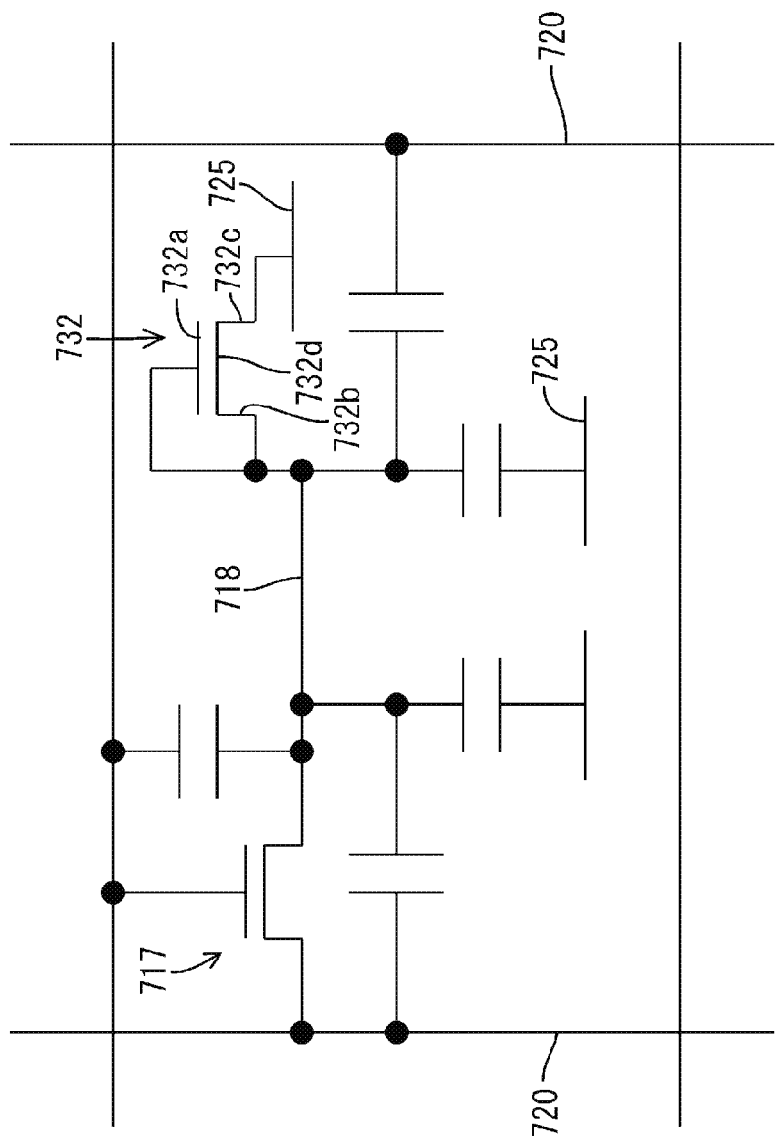
FIG. 27 is a circuit diagram showing a circuit configuration of a pixel in a display area of an array substrate according to Embodiment 8 of the present invention.

As shown in FIG. 27, the resistive TFT 732 of the present embodiment is connected between a pixel electrode 718 and an auxiliary capacitance wiring line 725. The resistive TFT 732 at least has a gate electrode 732a, a source electrode 732b, a drain electrode 732c, and a channel section 732d that connects the source electrode 732b and the drain electrode 732c, of which the gate electrode 732a and the source electrode 732b are connected to the pixel electrode 718, and the drain electrode 732c is connected to the auxiliary capacitance wiring line 725.

Figure 28:
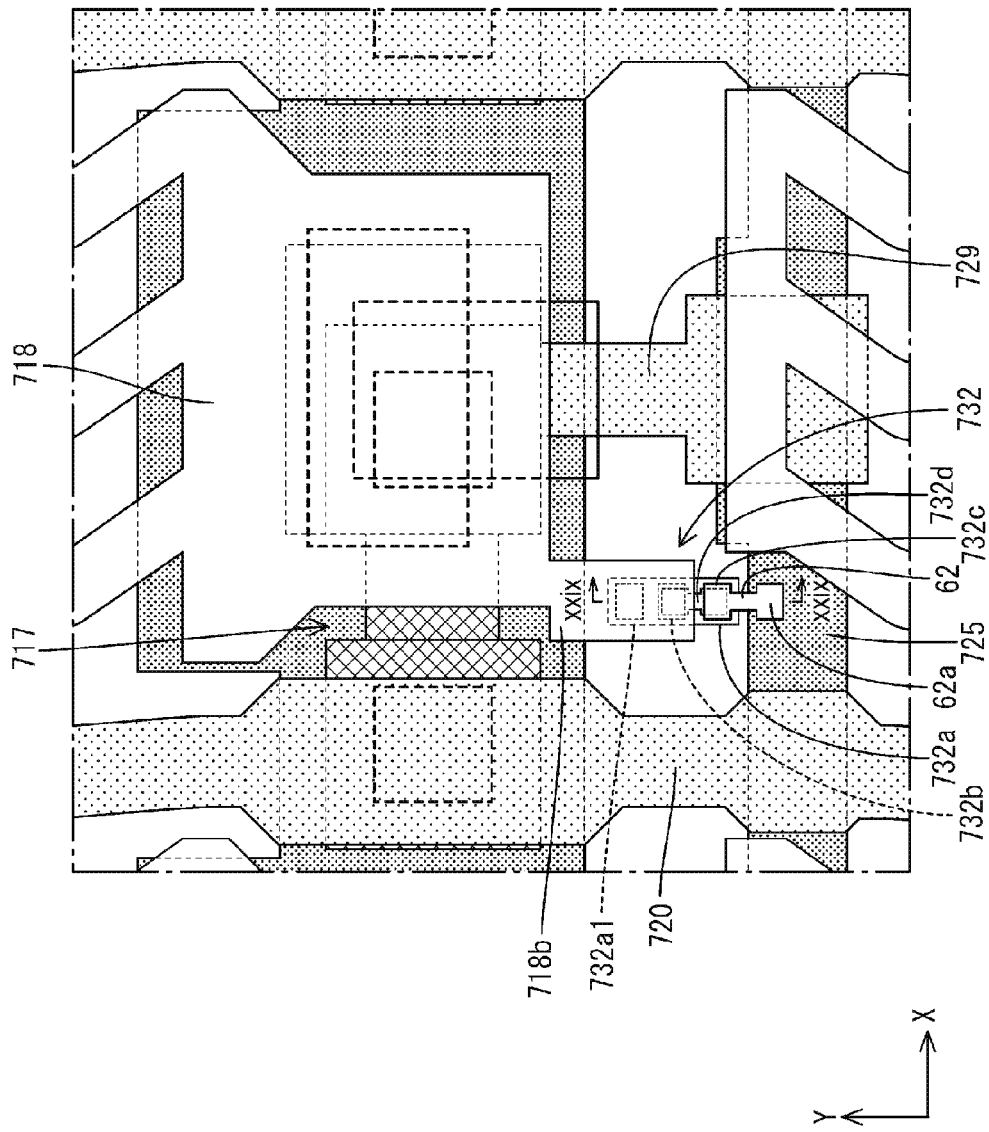
FIG. 28 is an expanded plan view of the area of a pixel TFT and a resistive TFT in the display area of the array substrate.
Figure 29:
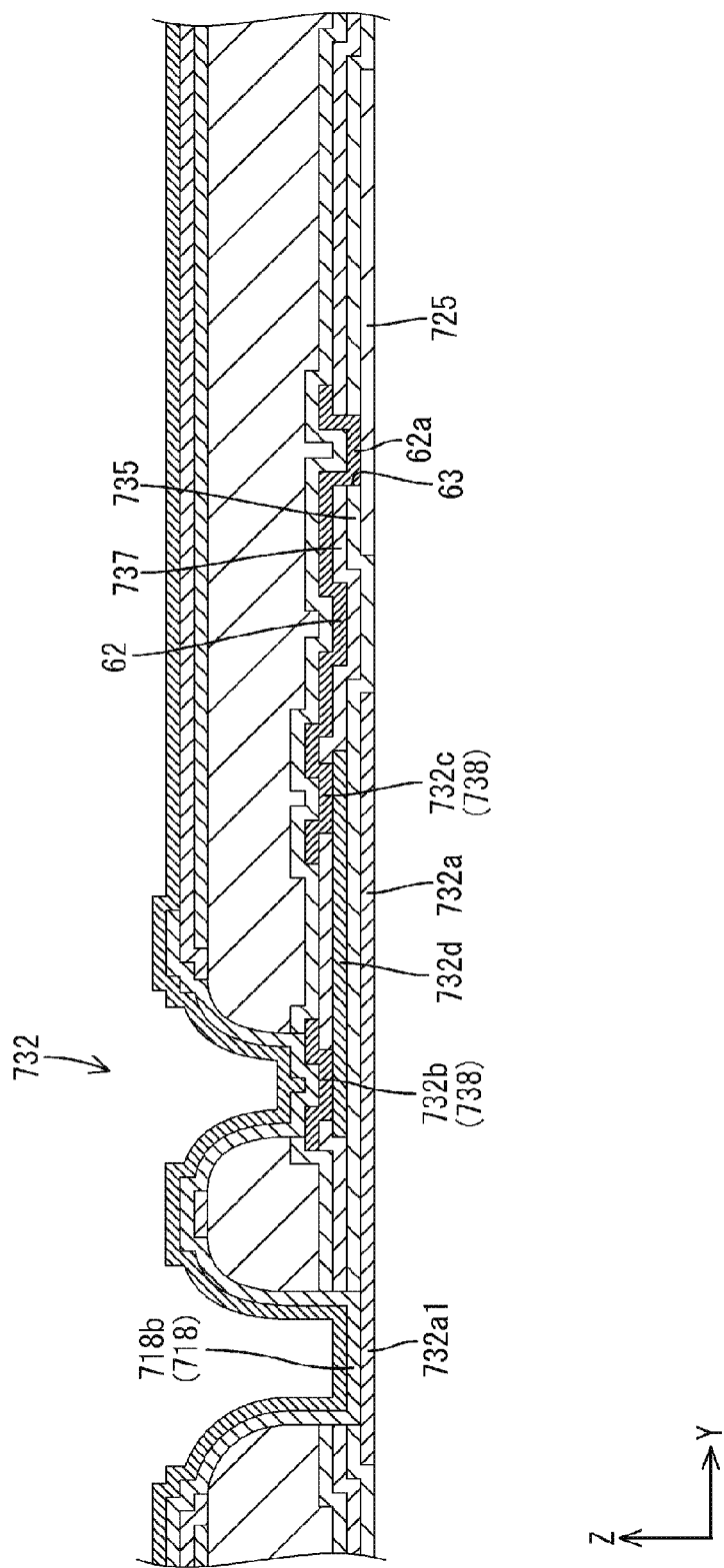
FIG. 29 is a cross-sectional view of FIG. 28 along the line xxix-xxix.

As shown in FIGS. 28 and 29, the resistive TFT 732 is disposed between the pixel TFT 717 and the auxiliary capacitance wiring line 725, which are aligned in the Y axis direction in a plan view, and a portion of the resistive TFT 732 is disposed so as to overlap the auxiliary capacitance wiring line 725 disposed on the side of the pixel TFT 717 opposite the pixel electrode 718 connected to the pixel TFT 717. Also, the resistive TFT 732 is disposed between the source wiring line 720 connected to the pixel TFT 717 and the drain wiring line 729 connected to the pixel TFT 717 so as to be arranged in the X axis direction in a plan view. In the resistive TFT 732, the gate electrode 32a extends in the Y axis direction and completely overlaps the source electrode 732b, the drain electrode 732c, and the channel section 732d in a plan view, and the resistive TFT 732 is formed so as to have a gate extension section 732a1 that extends to the side of the source electrode 732b opposite to the drain electrode 732c. The pixel electrode 718 has a pixel extension section 718b that overlaps in a plan view a portion of the resistive TFT 732, and more specifically, the drain electrode 732c and the gate extension section 732a1 of the gate electrode 732a. The channel section 732d extends in the Y axis direction and serves as a bridge between the source electrode 732b and the drain electrode 732c to allow electrons to move therebetween. The source electrode 732b is disposed in substantially the center of the gate electrode 732a and formed in an island shape, whereas the drain electrode 732c is disposed on the side of the gate electrode 732a opposite to the gate extension section 732a1. Other than what was described above, the detailed configuration of the resistive TFT 732 (the connective structure of the channel section 732d, the source electrode 732b, and the drain electrode 732c; the connective structure of the gate extension section 732a1 and the pixel extension section 718b; the connective structure of the source electrode 732b and the pixel extension section 718b; etc.) is similar to the resistive TFT 32 disclosed in Embodiment 1 above.

An auxiliary capacitance connecting wiring line 62 made of the same second metal film 738 as the drain electrode 732c is connected to the drain electrode 732c. The auxiliary capacitance connecting wiring line 62 extends in the Y axis direction, and one end thereof is connected to the drain electrode 732c and the other end overlaps the auxiliary capacitance wiring line 725 adjacent to the resistive TFT 732 in a plan view, and this other end is an auxiliary capacitance connecting section 62a, which is connected to the auxiliary capacitance wiring line 725. A gate insulation film 735 and a protective film 737, which are interposed between the overlapping auxiliary capacitance connecting section 62a and the auxiliary capacitance wiring line 725, have formed vertically therein an auxiliary capacitance wiring line connecting contact hole 63 for connecting the auxiliary capacitance connecting section 62a and the auxiliary capacitance wiring line 725. In this manner, the drain electrode 732c is at the same potential as the reference potential of the auxiliary capacitance wiring line 725.

According to the configuration above, if the pixel electrode 718 is charged by the pixel TFT 717, for example, then as shown in FIG. 27, a difference in potential occurs between the gate electrode 732a and source electrode 732b of the resistive TFT 732, which are set to the same potential as the pixel electrode 718, and the drain electrode 732*c* set at the same potential as the auxiliary capacitance wiring line 725. Thus, the resistive TFT 732 in effect functions as a diode, and is configured such that current flows (electric charge moves) between the source electrode 732*b* and the drain electrode 732*c* through the channel section 732*d*. Thus, electric charge moves between the pixel electrode 718 and the auxiliary capacitance wiring line 725, resulting in the pixel electrode 718 and the auxiliary capacitance wiring line 725 eventually being at the same potential. As a result, burn-in, flickering, or the like is mitigated in the display screen without performing a special control process. Detailed methods of driving the pixel TFT 717 and resulting operations and effects are similar to those of Embodiment 1, and redundant explanations thereof will be omitted.

As described above, in the present embodiment, the auxiliary capacitance wiring line 725, which forms capacitance with the pixel electrode 718, is included, and the reference potential unit is constituted by the auxiliary capacitance wiring line 725. In this manner, the reference potential unit is the auxiliary capacitance wiring line 725 forming capacitance with the pixel electrode 718, and electric charge moves between the pixel electrode 718 and the reference potential unit as a result of the resistive TFT 732, which is a resistor, and thus, as a result of the movement of electric charge through the resistive TFT 732, which is a resistor, the difference in potential between the pixel electrode 718 and the auxiliary capacitance wiring line 725 can be set to close to 0. Thus, it is possible to further reduce the risk of burn-in or flickering in the display screen.

Embodiment 9

Embodiment 9 of the present invention will be described with reference to FIGS. 30 to 32. In Embodiment 9, a configuration is described in which a resistive TFT 833 similar to what was disclosed in Embodiment 3 above is interposed between a pixel electrode 818 and an auxiliary capacitance wiring line 825. Descriptions of structures, operations, and effects similar to those of Embodiments 3 and 8 will be omitted.

Figure 30:
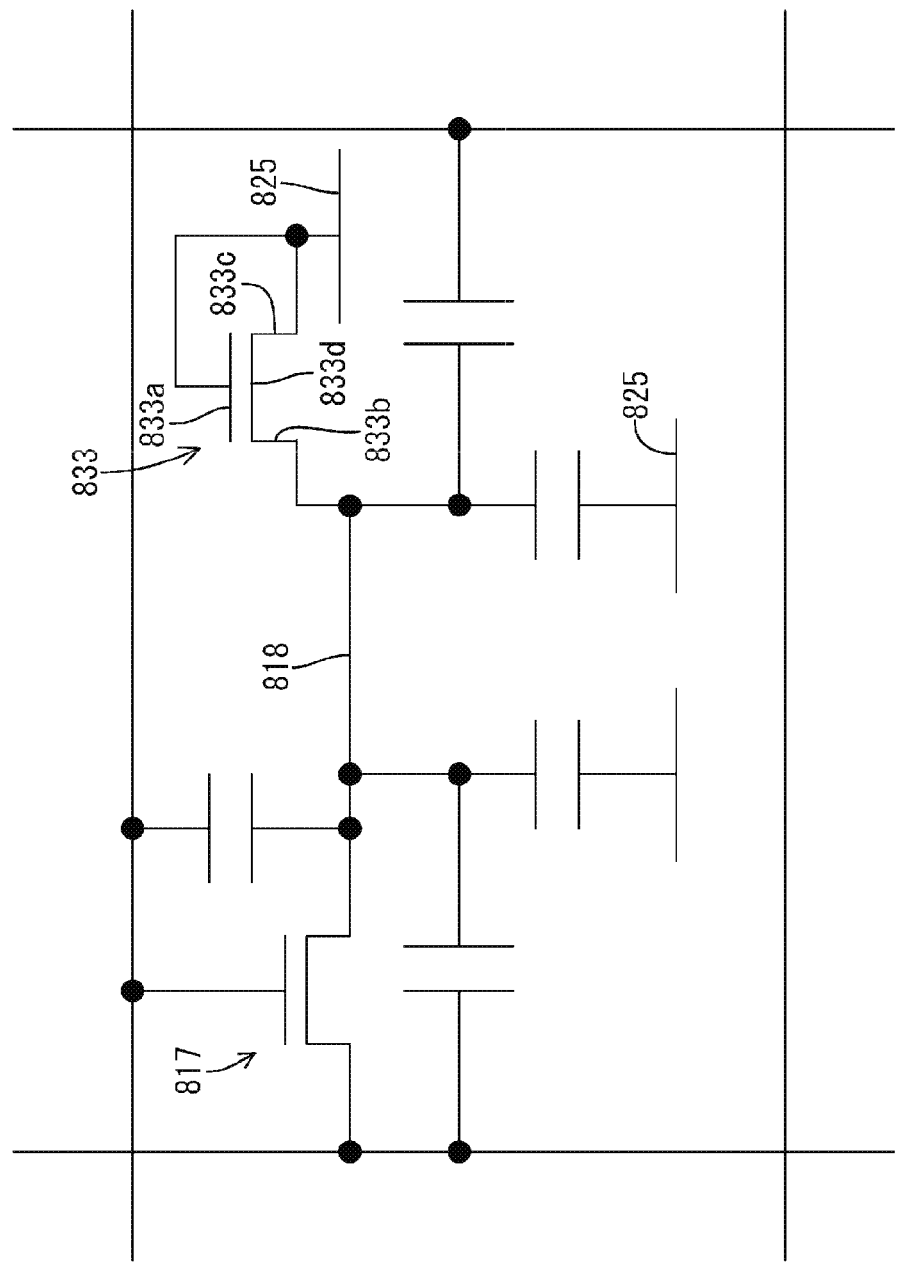
FIG. 30 is a circuit diagram showing a circuit configuration of a pixel in a display area of an array substrate according to Embodiment 9 of the present invention.

As shown in FIG. 30, the resistive TFT 833 of the present embodiment is connected between a pixel electrode 718 and an auxiliary capacitance wiring line 825. The resistive TFT 833 at least has a gate electrode 833*a*, a source electrode 833*b*, a drain electrode 833*c*, and a channel section 833*d* that connects the source electrode 833*b* and the drain electrode 833*c*, of which the source electrode 833*b* is connected to the pixel electrode 818, and the gate electrode 833*a* and the drain electrode 833*c* are connected to the auxiliary capacitance wiring line 825.

Figure 31:
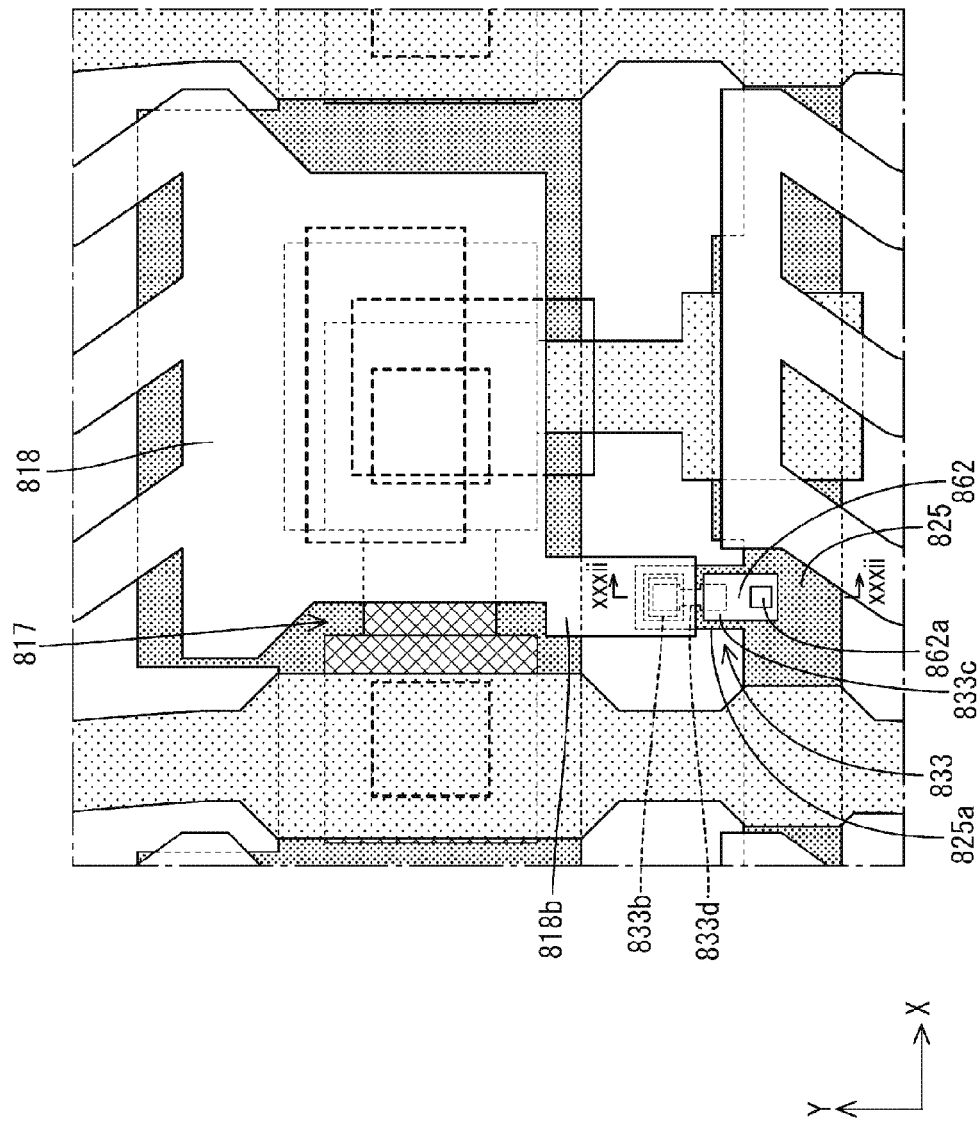
FIG. 31 is an expanded plan view of the area of a pixel TFT and a resistive TFT in the display area of the array substrate.
Figure 32:
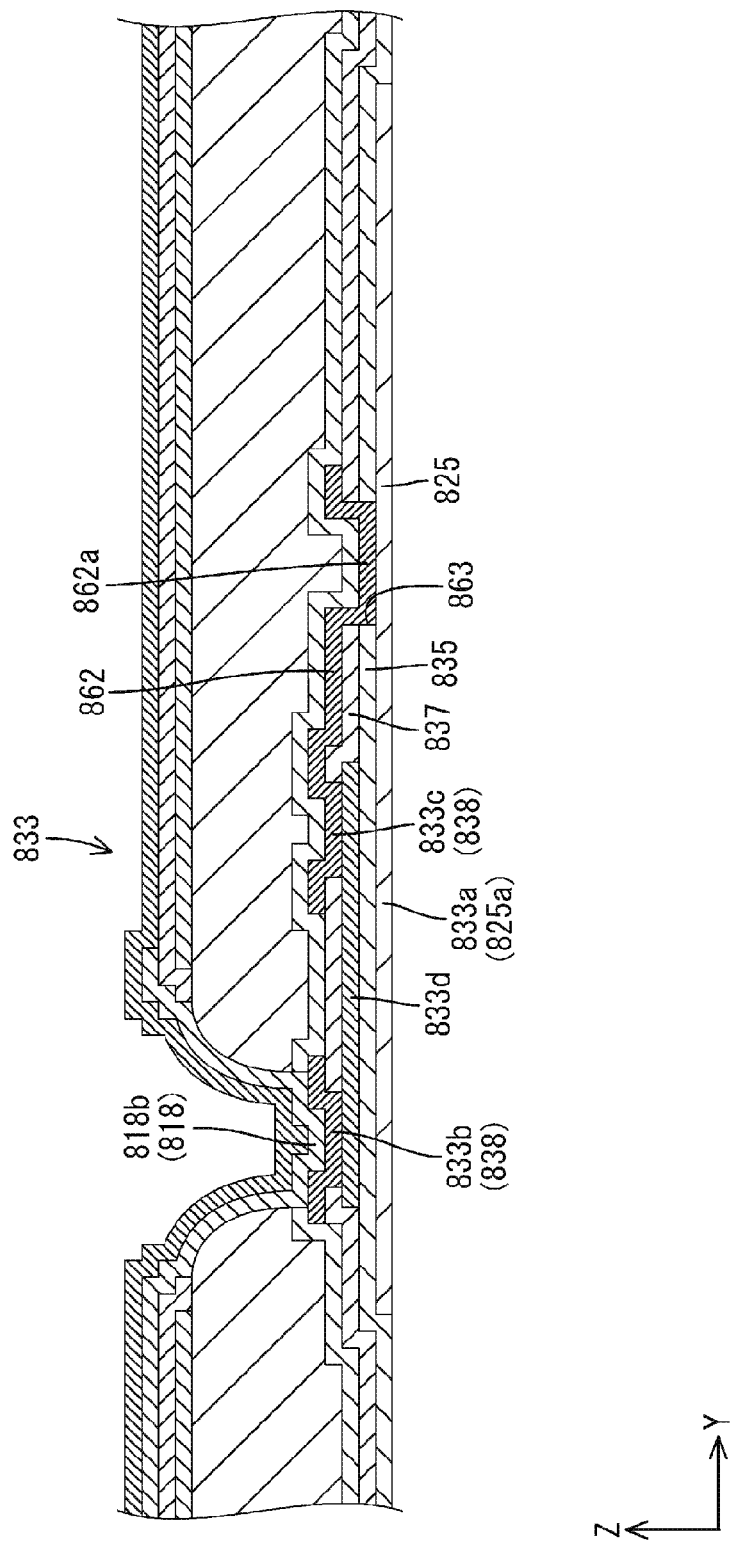
FIG. 32 is a cross-sectional view of FIG. 31 along the line xxxii-xxxii.

As shown in FIGS. 31 and 32, the auxiliary capacitance wiring line 825 is formed such that an auxiliary capacitance extension section 825*a* branches therefrom, the auxiliary capacitance extension section 825*a* extending towards the adjacent pixel TFT 817 in the Y axis direction. The resistive TFT 833 is formed so as to overlap the auxiliary capacitance extension section 825*a* in a plan view. The gate electrode 833*a* of the resistive TFT 833 is constituted by the auxiliary capacitance extension section 825*a*. The pixel electrode 818 has a pixel extension section 818*b* that overlaps in a plan view a portion of the resistive TFT 833, and more specifically, the source electrode 833*b*. The channel section 833*d* extends in the Y axis direction and serves as a bridge between the source electrode 833*b* and the drain electrode 833*c* to allow electrons to move therebetween. The source electrode 833*b* is disposed on the side of the gate electrode 833*a* opposite to the auxiliary capacitance wiring line 825 and is formed in an island shape, whereas the drain electrode 833*c* is disposed on the side of the gate electrode 833*a* towards the auxiliary capacitance wiring line 825. Other than what was described above, the detailed configuration of the resistive TFT 833 (the connective structure of the channel section 833*d*, the source electrode 833*b*, and the drain electrode 833*c*; the connective structure of the source electrode 833*b* and the pixel extension section 818*b*; etc.) is similar to the resistive TFT 33 disclosed in Embodiment 3 above.

An auxiliary capacitance connecting wiring line 862 made of the same second metal film 838 as the drain electrode 833*c* is connected to the drain electrode 833*c*. The auxiliary capacitance connecting wiring line 862 extends in the Y axis direction and the entirety thereof overlaps in a plan view the auxiliary capacitance extension section 825*a* and the auxiliary capacitance wiring line 825. One end of the auxiliary capacitance connecting wiring line 862 is connected to the drain electrode 833*c* and the other end thereof is connected to the auxiliary capacitance wiring line 825, and this other end is an auxiliary capacitance connecting section 862*a*, which connects to the auxiliary capacitance wiring line 825. A gate insulation film 835 and a protective film 837, which are interposed between the overlapping auxiliary capacitance connecting section 862*a* and the auxiliary capacitance wiring line 825, have formed vertically therein an auxiliary capacitance wiring line connecting contact hole 863 for connecting the auxiliary capacitance connecting section 862*a* and the auxiliary capacitance wiring line 825. In this manner, the drain electrode 833*c* is at the same potential as the reference potential of the auxiliary capacitance wiring line 825.

According to the configuration above, if the pixel electrode 818 is charged by the pixel TFT 817, for example, then as shown in FIG. 30, a difference in potential occurs between the source electrode 833*b* of the resistive TFT 833 set to the same potential as the pixel electrode 818, and the gate electrode 833*a* and drain electrode 833*c*, which are set at the same potential as the auxiliary capacitance wiring line 825. Thus, the resistive TFT 833 in effect functions as a diode, and is configured such that current flows (electric charge moves) from the source electrode 833*b* and the drain electrode 833*c* through the channel section 833*d*. Thus, electric charge moves between the pixel electrode 818 and the auxiliary capacitance wiring line 825, resulting in the pixel electrode 818 and the auxiliary capacitance wiring line 825 eventually being at the same potential. As a result, burn-in, flickering, or the like is mitigated in the display screen without performing a special control process. Detailed methods of driving the pixel TFT 817 and resulting operations and effects are similar to those of Embodiment 3, and redundant explanations thereof will be omitted.

Embodiment 10

Embodiment 10 of the present invention will be described with reference to FIG. 33. In Embodiment 10, the arrangement of a resistive wiring line 956 is modified from that of Embodiment 7. Descriptions of structures, operations, and effects similar to those of Embodiment 7 will be omitted.

Figure 33:
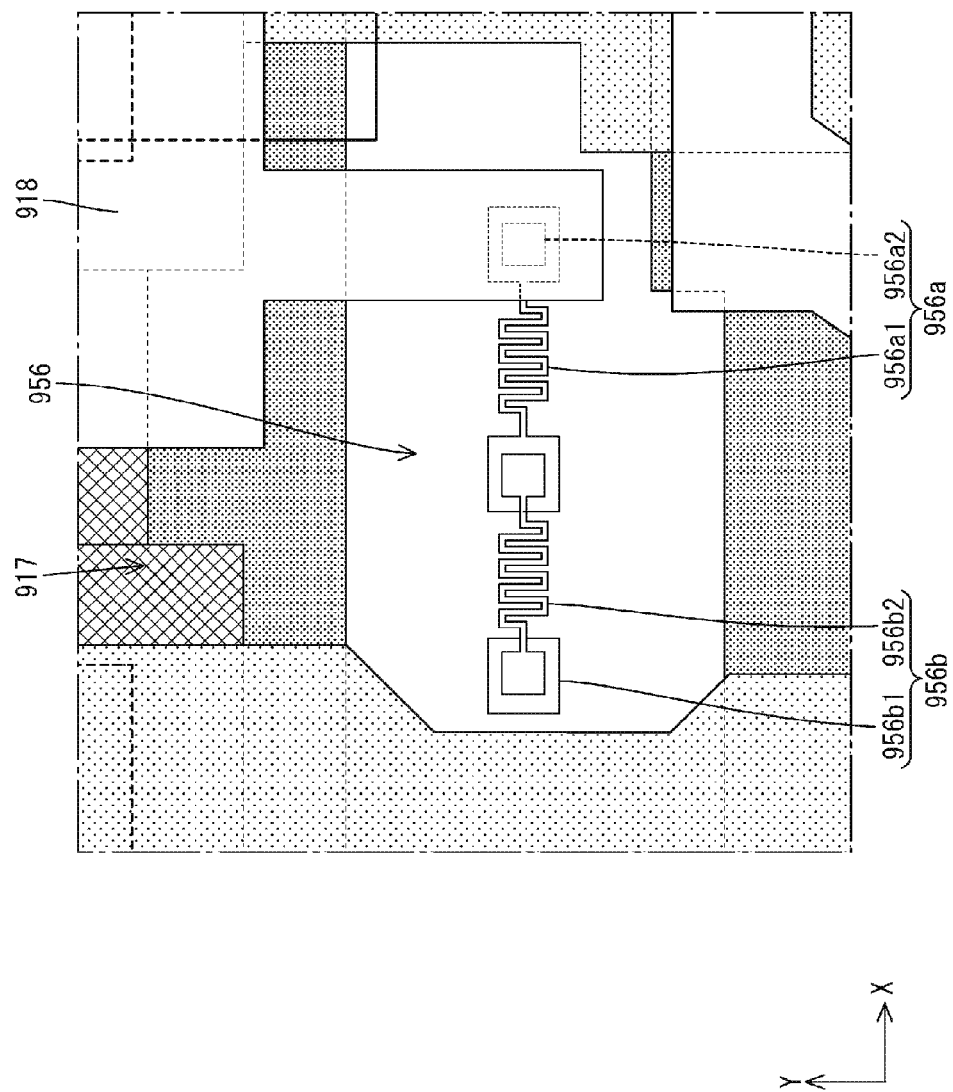
FIG. 33 is an expanded plan view of the area of a pixel TFT and resistive wiring line in a display area of an array substrate according to Embodiment 10 of the present invention.

As shown in FIG. 33, in the resistive wiring line 956 of the present embodiment, a first wiring line section 956*a* and a second wiring line section 956*b* both have a meandering configuration in a plan view. Specifically, a portion of the first lower layer wiring line section 956*a*1 of the first wiring line section 956*a* between the connection point with a first upper layer wiring line section 956a2 and the connection point with the second wiring line section 956b has a meandering shape in a plan view, and as a result, the creepage distance and the wiring resistance thereof are both greater than in the first wiring line section 56a of Embodiment 7 described above. A portion of the second upper layer wiring line section 956b2 of the second wiring line section 956b between the connection point with a second lower layer wiring line section 956b1 and the connection point with the first wiring line section 956a has a meandering shape in a plan view, and as a result, the creepage distance and the wiring resistance thereof are both greater than in the second wiring line section 56b of Embodiment 7 described above. Thus, the wiring resistance of the resistive wiring line 956 is greater than the wiring resistance of the resistive wiring line 56 of Embodiment 7 described above, and as a result, during normal operation, the potential of the pixel electrode 918 charged by the pixel TFT 917 when displaying images in the liquid crystal panel is maintained for a certain period of time (one frame period, for example), thereby providing a suitable configuration and mitigating a loss in display quality for displayed images.

Embodiment 11

Embodiment 11 of the present invention will be described with reference to FIG. 34. In Embodiment 11, a configuration is described in which a resistive TFT 1032 similar to what was disclosed in Embodiment 1 above is connected in series to a resistive wiring line 1056 similar to that of Embodiment 7. Descriptions of structures, operations, and effects similar to those of Embodiments 1 and 7 will be omitted.

Figure 34:
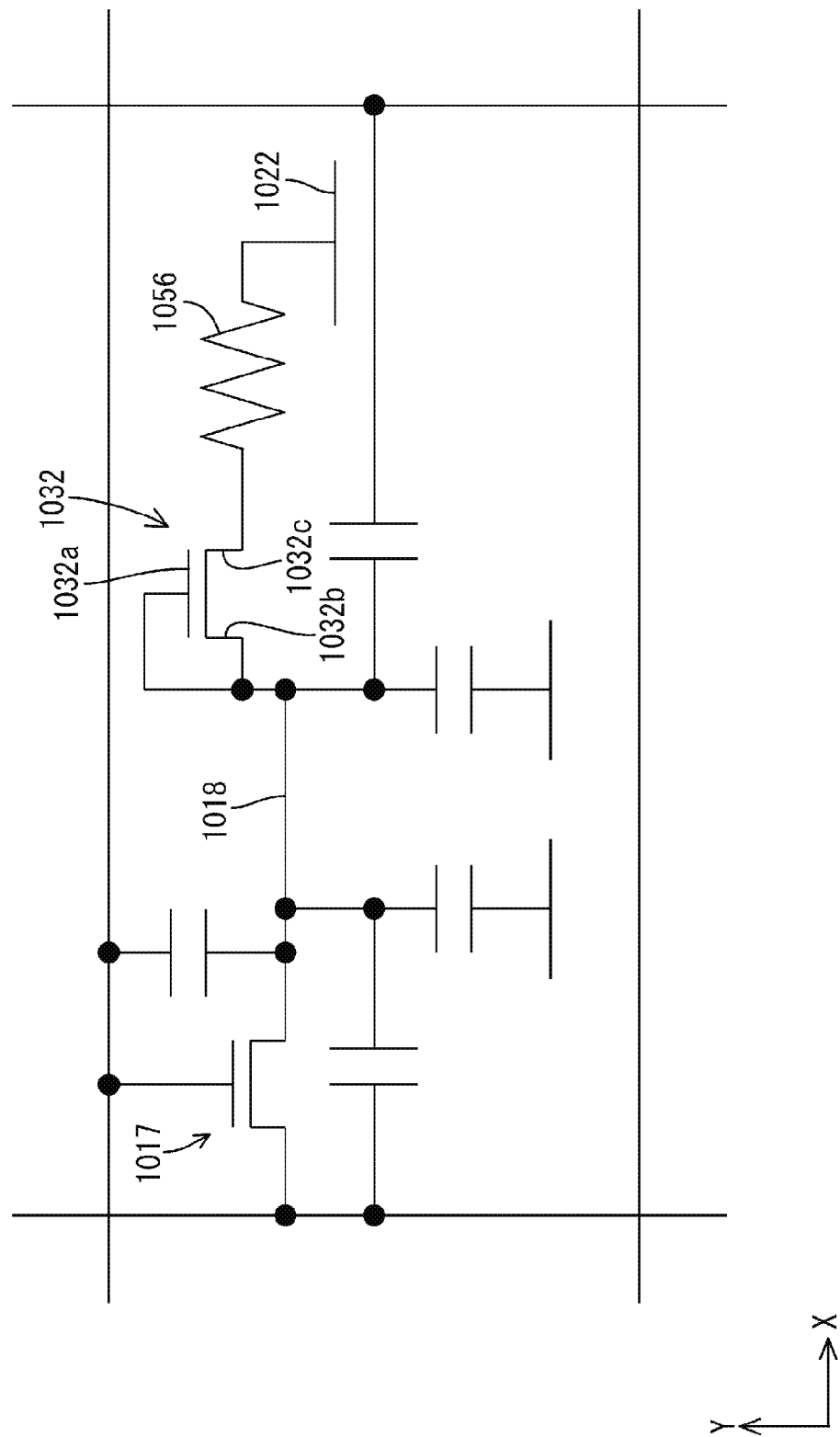
FIG. 34 is a circuit diagram showing a circuit configuration of a pixel in a display area of an array substrate according to Embodiment 11 of the present invention.

As shown in FIG. 34, in the present embodiment, the resistor arranged between the pixel electrode 1018 and the common electrode 1022 is constituted by the resistive TFT 1032 and the resistive wiring line 1056, which are connected to each other in series. A gate electrode 1032a and a source electrode 1032b of the resistive TFT 1032 are connected to the pixel electrode 1018, while a drain electrode 1032c is connected to one end of the resistive wiring line 1056. One end of the resistive wiring line 1056 is connected to the drain electrode 1032c while the other end is connected to the common electrode 1022. Even with such a configuration, if a difference in potential occurs between the pixel electrode 1018 and the common electrode 1022, the electric charge moves between the pixel electrode 1018 and the common electrode 1022 through the resistive TFT 1032 and the resistive wiring line 1056, and eventually, the potential of the pixel electrode 1018 becomes the same as that of the common electrode 1022, and as a result of the resistive TFT 1032 and the resistive wiring line 1056 constituting a resistance component against the electric charge, a situation is avoided in which the potential of the pixel electrode 1018 instantaneously reaches the same potential as the common electrode 1022. The resistance against the electric charge moving between the pixel electrode 1018 and the common electrode 1022 is greater than that of Embodiment 1 described above or that of Embodiment 7 described above, and as a result, during normal operation, the potential of the pixel electrode 1018 charged by the pixel TFT 1017 when displaying images in the liquid crystal panel is maintained for a certain period of time, thereby providing a suitable configuration and mitigating a loss in display quality for displayed images.

Embodiment 12

Embodiment 12 of the present invention will be described with reference to FIG. 35. In Embodiment 12, a configuration is described in which a resistive TFT 1133 similar to what was disclosed in Embodiment 3 above is connected in series to a resistive wiring line 1156 similar to that of Embodiment 7. Descriptions of structures, operations, and effects similar to those of Embodiments 3 and 7 will be omitted.

Figure 35:
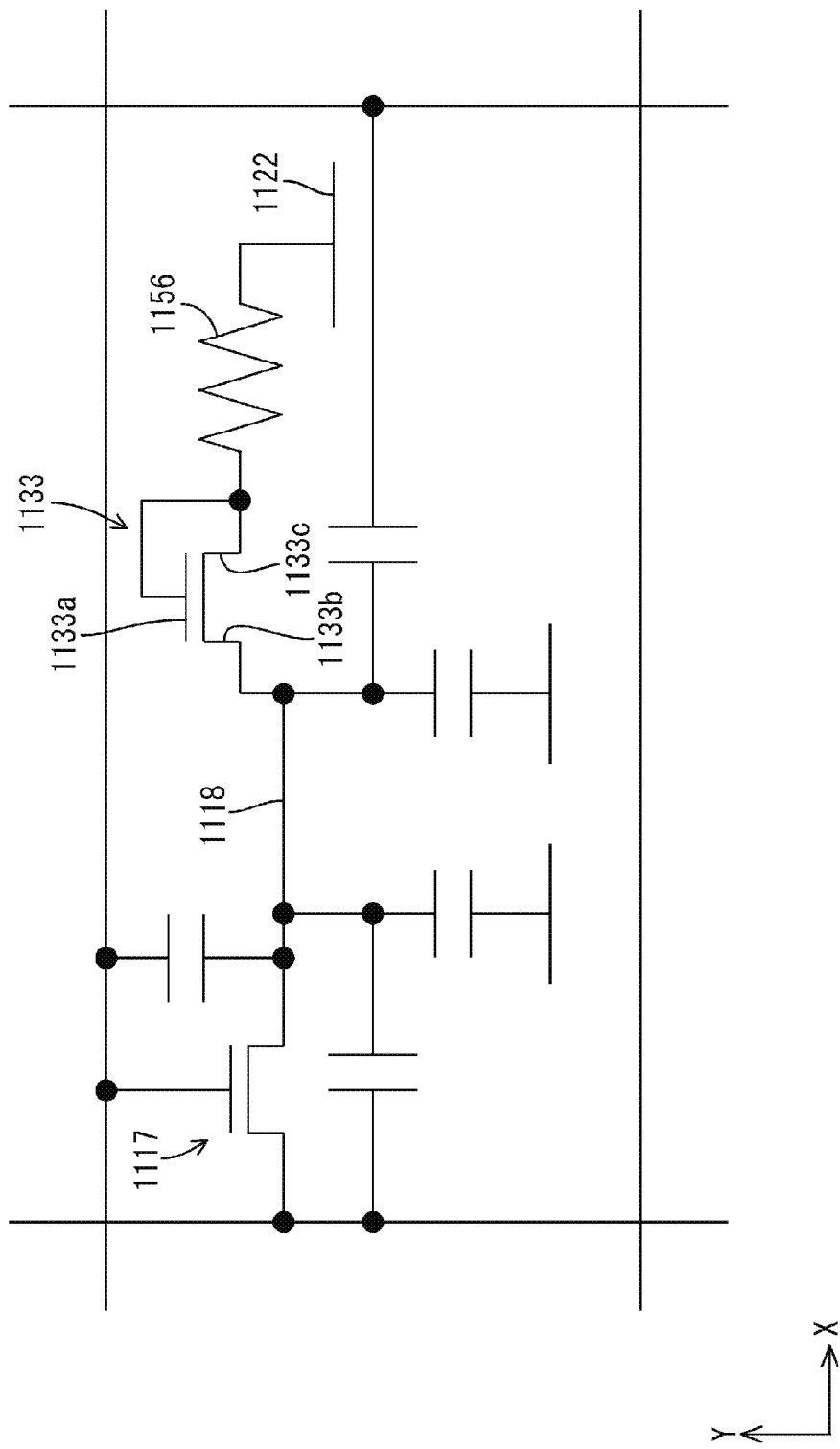
FIG. 35 is a circuit diagram showing a circuit configuration of a pixel in a display area of an array substrate according to Embodiment 12 of the present invention.

As shown in FIG. 35, in the present embodiment, the resistor arranged between the pixel electrode 1118 and the common electrode 1122 is constituted by the resistive TFT 1133 and the resistive wiring line 1156, which are connected to each other in series. A source electrode 1133b of the resistive TFT 1133 is connected to the pixel electrode 1118, while a gate electrode 1133a and a drain electrode 1133c are connected to one end of the resistive wiring line 1156. One end of the resistive wiring line 1156 is connected to the gate electrode 1133a and the drain electrode 1133c while the other end is connected to the common electrode 1122. Even with such a configuration, if a difference in potential occurs between the pixel electrode 1118 and the common electrode 1122, the electric charge moves between the pixel electrode 1118 and the common electrode 1122 through the resistive TFT 1133 and the resistive wiring line 1156, and eventually, the potential of the pixel electrode 1118 becomes the same as that of the common electrode 1122, and as a result of the resistive TFT 1133 and the resistive wiring line 1156 constituting a resistance component against the electric charge, a situation is avoided in which the potential of the pixel electrode 1118 instantaneously reaches the same potential as the common electrode 1122. The resistance against the electric charge moving between the pixel electrode 1118 and the common electrode 1122 is greater than that of Embodiment 3 described above or that of Embodiment 7 described above, and as a result, during normal operation, the potential of the pixel electrode 1118 charged by the pixel TFT 1117 when displaying images in the liquid crystal panel is maintained for a certain period of time, thereby providing a suitable configuration and mitigating a loss in display quality for displayed images.

Embodiment 13

Embodiment 13 of the present invention will be described with reference to FIG. 36. In Embodiment 13, a configuration is described in which a resistive TFT 1248 similar to what was disclosed in Embodiment 5 above is connected in series to a resistive wiring line 1256 similar to that of Embodiment 7. Descriptions of structures, operations, and effects similar to those of Embodiments 5 and 7 will be omitted.

Figure 36:
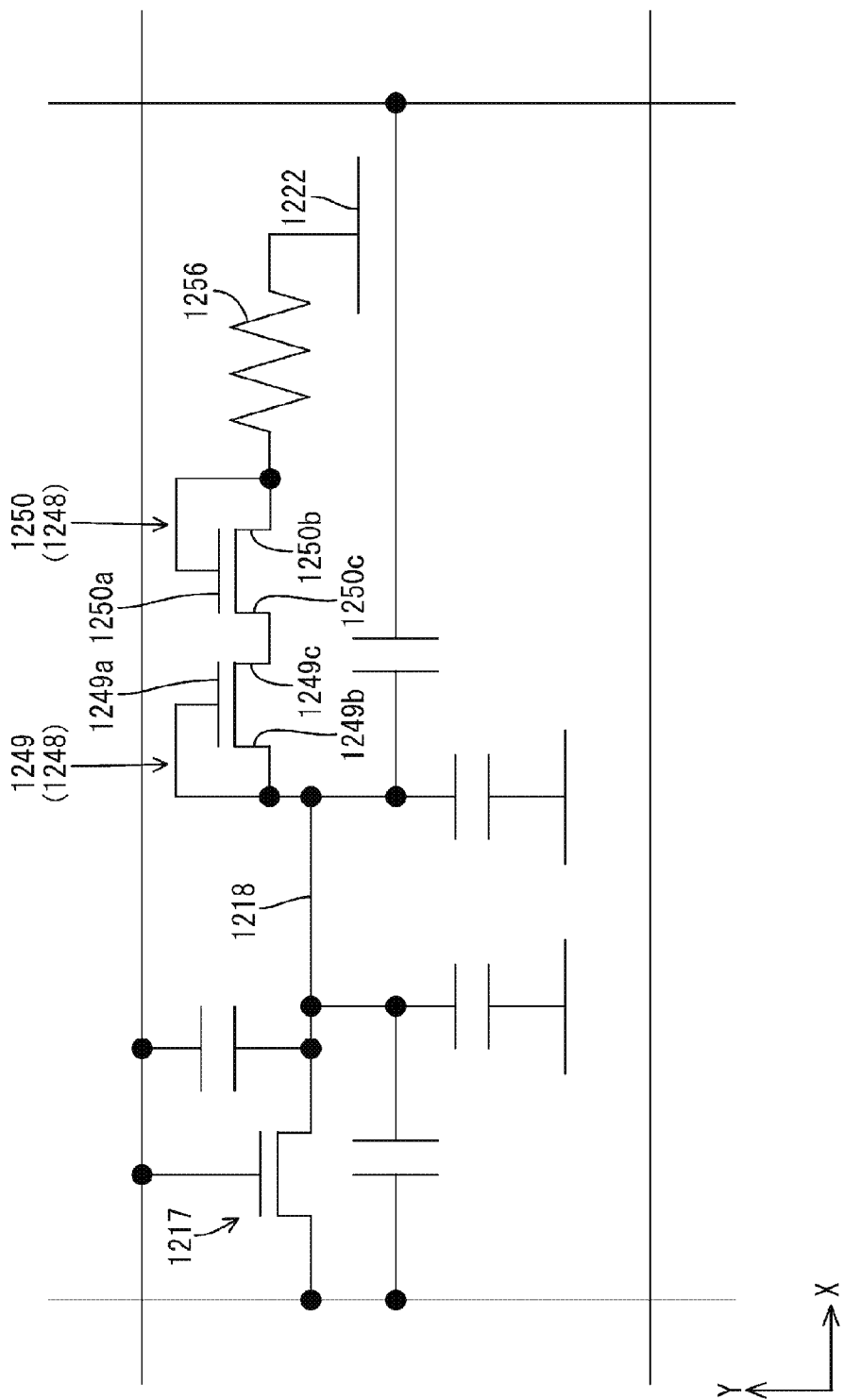
FIG. 36 is a circuit diagram showing a circuit configuration of a pixel in a display area of an array substrate according to Embodiment 13 of the present invention.

As shown in FIG. 36, in the present embodiment, the resistor arranged between the pixel electrode 1218 and the common electrode 1222 is constituted by the resistive TFT 1248 and the resistive wiring line 1256, which are connected to each other in series. The resistive TFT 1248 is constituted by a first resistive TFT 1249 in which a first gate electrode 1249a and a first source electrode 1249b are connected to the pixel electrode 1218, and a second resistive TFT 1250 in which a second drain electrode 1250c is connected to the first drain electrode 1249c of the first resistive TFT 1249 and in which a second gate electrode 1250a and a second source electrode 1250b are connected to one end of the resistive wiring line 1256. One end of the resistive wiring line 1256 is connected to the second gate electrode 1250a and the second source electrode 1250b of the second resistive TFT 1250 while the other end is connected to the common electrode 1222. Even with such a configuration, if a difference in potential occurs between the pixel electrode 1218 and the common electrode 1222, the electric charge moves between the pixel electrode 1218 and the common electrode 1222 through the first resistive TFT 1249 and the second resistive TFT 1250 constituting the resistive TFT 1248 and through the resistive wiring line 1256, and eventually, the potential of the pixel electrode 1218 becomes the same as that of the common electrode 1222, and as a result of the first resistive TFT 1249 and the second resistive TFT 1250 of the resistive TFT 1248 and the resistive wiring line 1256 constituting a resistance component against the electric charge, a situation is avoided in which the potential of the pixel electrode 1218 instantaneously reaches the same potential as the common electrode 1222. The resistance against the electric charge moving between the pixel electrode 1218 and the common electrode 1222 is greater than that of Embodiment 5 described above or that of Embodiment 7 described above, and as a result, during normal operation, the potential of the pixel electrode 1218 charged by the pixel TFT 1217 when displaying images in the liquid crystal panel is maintained for a certain period of time, thereby providing a suitable configuration and mitigating a loss in display quality for displayed images.

Other Embodiments

The present invention is not limited to the embodiments shown in the drawings and described above, and the following embodiments are also included in the technical scope of the present invention, for example.

(1) In addition to the embodiments above, the plan view arrangement of the resistors (resistive TFTs and resistive wiring lines) on the array substrate can be modified as appropriate. For example, the resistor can be disposed in a region surrounded by the pixel TFTs, the gate wiring lines connected to the pixel TFTs, the source wiring lines connected to the pixel TFTs and sandwiching the pixel TFTs, the auxiliary capacitance wiring line disposed on the side of the pixel TFT opposite to where the pixel TFT is connected to the pixel electrode, and the drain wiring lines connected to the pixel TFTs. Besides this, the resistor can also be arranged in a position surrounded in the X axis direction between the pixel electrode and the source wiring line.

(2) In the embodiments above (other than Embodiments 7 and 10), the channel length and channel width of the channel section of the resistive TFT are respectively less than the channel length and channel width of the pixel channel section of the pixel TFT, but it is also possible to adopt a configuration in which either or both of the channel length and channel width of the channel section of the resistive TFT are greater than either or both of the channel length and channel width of the pixel channel section of the pixel TFT. Besides this, either one of the channel length and channel width of the channel section of the resistive TFT can be made the same as either one of the channel length and channel width of the pixel channel section of the pixel TFT. Even in such a case, it is preferable that the ratio calculated by dividing the channel length of the channel section of the resistive TFT by the channel width thereof be greater than the ratio calculated by dividing the channel length of the pixel channel section of the pixel TFT by the channel width thereof.

(3) In the embodiments above (other than Embodiments 7 and 10), examples were described in which the channel section of the resistive TFT is made of the same material as the pixel channel section of the pixel TFT, but the material of the channel section of the resistive TFT can differ from that of the pixel channel section of the pixel TFT. In such a case, if a semiconductor material with a low electron mobility is used for the channel section of the resistive TFT, the ratio calculated by dividing the channel length of the channel section of the resistive TFT by the channel width thereof can be made less than or equal to the ratio calculated by dividing the channel length of the pixel channel section of the pixel TFT by the channel width thereof.

(4) In the embodiments above, examples were shown in which the reference potential in the common electrode or the auxiliary capacitance wiring line is kept constant, but the present invention can also be applied to a configuration in which the reference potential of the common electrode or the auxiliary capacitance wiring line is modulated.

(5) In Embodiments 2, 4, and 6, examples were shown in which five resistive TFTs are connected in series, but the number of resistive TFTs connected in series can be modified as appropriate, and a configuration can be adopted in which two to four resistive TFTs or six or more resistive TFTs are provided.

(6) In Embodiments 7 and 10, examples were shown in which the resistive wiring line is constituted by two wiring line sections: the first wiring line section and the second wiring line section. However, the number of wiring sections of the resistive wiring line can be three or more. Also, the specific wiring path and the like of the resistive wiring line can be modified as appropriate.

(7) As a modification example of Embodiments 11 and 12, a plurality of resistive TFTs can be connected in series. In such a case, resistive wiring lines can be interposed between the plurality of resistive TFTs.

(8) As a modification example of Embodiments 11 and 12, the resistive wiring line can be disposed between the pixel electrode and the resistive TFT.

(9) As a modification example of Embodiment 13, the resistive wiring line can be disposed between the pixel electrode and the first resistive TFT.

(10) As a modification example of Embodiment 13, the resistive wiring line can be disposed between the first drain electrode of the first resistive TFT and the second source electrode of the second resistive TFT.

(11) As a modification example of Embodiment 13, more than one of either or both of the first resistive TFT and the second resistive TFT can be formed.

(12) In the respective embodiments above, resistive TFTs and resistive wiring lines were used as the resistors, but other types of elements may also be used. For example, a configuration can be adopted in which two electrodes are provided and a semiconductor film is interposed between the two electrodes so as to form a resistive diode that serves as a resistor. Even in such a case, it is preferable that the semiconductor film of the resistive diode be formed of the same material as the pixel channel section of the pixel TFT.

(13) In the respective embodiments above, cases were described in which the reference potential applied to the common electrode is the same as the reference potential applied to the auxiliary capacitance wiring line, but the present invention can also be applied to a configuration in which the reference potential applied to the common electrode differs from the reference potential applied to the auxiliary capacitance wiring line.

(14) The frame rate used when driving the liquid crystal panel can be appropriately modified from that of the embodiments above, and can be 120 fps or 240 fps, for example.

(15) In the respective embodiments above, an FFS-type liquid crystal panel was described as an example, but the present invention is also applicable to an IPS-type liquid crystal panel, for example. Furthermore, the present invention is also applicable to a VA-type liquid crystal panel or an MVA-type liquid crystal panel in which the common electrode is formed on the CF substrate.

(16) In the respective embodiments above, the oxide semiconductor used for the pixel channel section of the pixel TFT and the channel section of the resistive TFT is an In—Ga—Zn—O semiconductor, but another oxide semiconductor can be used. For example, the oxide semiconductor layer may include a Zn—O type semiconductor (ZnO), an In—Zn—O type semiconductor (IZO (registered trademark)), a Zn—Ti—O type semiconductor (ZTO), a Cd—Ge—O type semiconductor, a Cd—Pb—O type semiconductor, CdO (cadmium oxide), an Mg—Zn—O type semiconductor, an In—Sn—Zn—O type semiconductor (such as $In_2O_3$—$SnO_2$—ZnO), an In—Ga—Sn—O type semiconductor, or the like.

(17) In the respective embodiments above, the pixel channel section of the pixel TFT and the channel section of the resistive TFT are made of an oxide semiconductor, but besides this, amorphous silicon or polycrystalline silicon may be used. For polycrystalline silicon, it is preferable that CG silicon (continuous grain silicon) be used.

(18) In the respective embodiments above, cases were described in which the first metal film and the second metal film are made of a multilayer film of titanium (Ti) and copper (Cu), but molybdenum (Mo), molybdenum nitride (MoN), titanium nitride (TiN), tungsten (W), niobium (Nb), a molybdenum-titanium alloy (MoTi), a molybdenum-tungsten alloy (MoW), or the like can be substituted in for titanium, for example. Besides this, a single layer metal film of titanium, copper, or aluminum can be used.

(19) In the respective embodiments above, TFTs (pixel TFTs) were used as the switching elements of the liquid crystal display device, but the present invention can also be applied to a liquid crystal display device that uses switching elements other than the TFTs (such as thin film diodes (TFD)), and in addition to a color liquid crystal display device, the present invention can be applied to a liquid crystal display device that displays black and white images.

(20) In the respective embodiments above, an example was shown in which a column control circuit and a row control circuit are provided in the non-display area of the array substrate, but it is possible to omit either or both of the column control circuit and row control circuit and transfer the functions thereof to a driver. If the row control circuit is omitted, then the non-display area contact holes would be omitted.

(21) In the respective embodiments above, the driver is mounted by COG directly on the array substrate, but the present invention also includes a configuration in which the driver is mounted on a flexible substrate connected to the array substrate through an ACF.

(22) In the respective embodiments above, a liquid crystal panel having a vertically long rectangular shape was described, but the present invention can also be applied to a liquid crystal panel having a horizontally long rectangular shape or a square liquid crystal panel.

(23) A configuration in which a functional panel such as a touch panel or a parallax barrier panel (switching liquid crystal panel) has been stacked on the liquid crystal panel in the respective embodiments above is also included in the present invention. Also, the present invention includes a configuration in which a touch panel pattern is directly formed on the liquid crystal panel.

(24) In the respective embodiments above, a case was described in which an edge-lit backlight device is used in the liquid crystal display device, but a configuration having a direct-lit backlight device is also included in the present invention.

(25) In the respective embodiments above, an example was described of a transmissive liquid crystal display device having a backlight device, which is an external light source, but the present invention can also be applied to a reflective liquid crystal display device performing display using external light, and in such a case, no backlight device is needed.

(26) In the respective embodiments above, TFTs were used as the switching elements of the liquid crystal display device, but the present invention can also be applied to a liquid crystal display device that uses switching elements other than the TFTs (such as thin film diodes (TFD)), and in addition to a color liquid crystal display device, the present invention can be applied to a liquid crystal display device that displays black and white images.

(27) In the respective embodiments above, examples were described of a liquid crystal panel in which a liquid crystal layer is sandwiched between a pair of substrates, but the present invention can also be applied to a display panel in which functional organic molecules other than a liquid crystal material are sandwiched between the pair of substrates.

(28) In the respective embodiments above, a liquid crystal panel was described as an example of a display panel, but besides this, the present invention can be applied to a display panel such as a plasma display panel (PDP) or an organic EL panel.

(29) In the respective embodiments above, a liquid crystal panel categorized as small- to mid-sized and used in various electronic devices such as mobile information terminals, mobile phones (including smartphones), laptop computers (including tablet PCs), digital photo frames, mobile gaming devices, and electronic paper was described as an example, but the present invention can also be applied to liquid crystal panels having a display size of 20 to 90 inches and categorized as mid- to large-(ultra large-) sized liquid crystal panels. In such a case, the liquid crystal panel can be used in electronic devices such as television receivers, digital signage, and electronic blackboards.

DESCRIPTION OF REFERENCE CHARACTERS 11 liquid crystal panel (display device)
11a array substrate
11b CF substrate
11c liquid crystal layer
11h color filter
17, 117, 217, 317, 417, 517, 617, 817, 917, 1017, 1117, 1217 pixel TFT (switching element, pixel transistor)
17a, 217a, 417a pixel gate electrode
17b, 217b, 417b pixel source electrode
17c, 217c, 417c pixel drain electrode
17d, 217d, 417d pixel channel section
18, 118, 218, 318, 418, 518, 618, 718, 818, 918, 1018, 1118, 1218 pixel electrode (pixel unit)
22, 122, 222, 322, 422, 522, 622, 1022, 1122, 1222 common electrode (reference potential unit)
32, 132, 732, 1032 resistive TFT (resistor, transistor)
32a, 132a, 732a, 1032a gate electrode
32b, 132b, 732b, 1032b source electrode
32c, 132c, 732c, 1032c drain electrode
32d, 732d channel section
33, 333, 833, 1133 resistive TFT (resistor, transistor)
33a, 333a, 833a, 1133a gate electrode
33b, 333b, 833b, 1133b source electrode 33c, 333c, 833c, 1133c drain electrode
33d, 833d channel section
48, 548, 1248 resistive TFT (resistor, transistor)
49, 549, 1249 first resistive TFT (first transistor)
49a, 1249a first gate electrode
49b, 1249b first source electrode
49c, 549c, 1249c first drain electrode
49d first channel section
50, 550, 1250 second resistive TFT (second transistor)
50a, 1250a second gate electrode
50b, 1250b second source electrode
50c, 550c, 1250c second drain electrode
50d second channel section
56, 956, 1056, 1156, 1256 resistive wiring line (wiring line)
725, 825 auxiliary capacitance wiring line (reference potential unit)

What is claimed is:

1. A display device, comprising:
a pixel electrode;
a switching element that is connected to the pixel electrode and charges the pixel electrode;
a reference potential terminal set at a reference potential; and
a resistive element that is connected to the pixel electrode and the reference potential terminal so as to be interposed therebetween, the resistive element forming a resistance component against electric charges moving between the pixel electrode and the reference potential terminal,
wherein the resistive element includes a transistor that has at least a gate electrode, a source electrode, a drain electrode, and a channel section that connects the source electrode to the drain electrode, the gate electrode and the source electrode of the transistor both being directly connected to the pixel electrode, the drain electrode of the transistor being connected to the reference potential terminal.

2. The display device according to claim 1,
wherein the switching element includes a pixel transistor that has at least a pixel gate electrode, a pixel source electrode, a pixel drain electrode connected to the pixel electrode, and a pixel channel section that connects the pixel source electrode to the pixel drain electrode, and
wherein the channel section of the transistor of the resistive element is made of a same material as the pixel channel section of the pixel transistor of the switching element.

3. The display device according to claim 2, wherein the transistor of the resistive element is formed such that a ratio calculated by dividing a length dimension of the channel section that is a distance between the source electrode and the drain electrode by a width dimension of the channel section is greater than a ratio calculated by dividing a length dimension of the pixel channel section of the pixel transistor of the switching element by a width dimension of the pixel channel section, the length dimension being a distance between the pixel source electrode and the pixel drain electrode.

4. The display device according to claim 1,
wherein the resistive element further includes:
another transistor having at least a second gate electrode, a second source electrode, a second drain electrode, and a second channel section that connects the second source electrode to the second drain electrode, the second gate electrode and the second source electrode being respectively connected to the reference potential terminal, the second drain electrode being connected to the drain electrode of the transistor.

5. The display device according to claim 1, wherein the resistive element is a plurality of transistors connected to each other in series between the pixel electrode and the reference terminal.

6. The display device according to claim 1, further comprising:
a common electrode forming capacitance with the pixel electrode together with a liquid crystal layer in between,
wherein at least a portion of the common electrode serves as the reference potential terminal.

7. The display device according to claim 1,
wherein the switching element includes a pixel transistor that has a pixel gate electrode, a pixel source electrode, a pixel drain electrode connected to the pixel electrode, and a pixel channel section that connects the pixel source electrode to the pixel drain electrode, and
wherein the pixel channel section is made of an oxide semiconductor.

8. The display device according to claim 7, wherein the oxide semiconductor contains indium (In), gallium (Ga), zinc (Zn), and oxygen (O).

9. The display device according to claim 8, wherein the oxide semiconductor is crystalline.

10. The display device according to claim 1, further comprising:
an array substrate on which said pixel electrode, said switching element, said reference potential terminal, and said resistive element are disposed in a plurality;
a color filter substrate facing the array substrate, said color filter substrate having colored portions; and
a liquid crystal layer sandwiched between the array substrate and the color filter substrate.

* * * * *